United States Patent
Yamanaka et al.

(10) Patent No.: US 6,504,215 B1
(45) Date of Patent: Jan. 7, 2003

(54) ELECTRO-OPTICAL APPARATUS HAVING A DISPLAY SECTION AND A PERIPHERAL DRIVING CIRCUIT SECTION

(75) Inventors: Hideo Yamanaka, Kanagawa (JP); Hisayoshi Yamoto, Kanagawa (JP); Yuichi Satou, Kanagawa (JP); Hajime Yagi, Tokyo (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 09/406,138

(22) Filed: Sep. 27, 1999

(30) Foreign Application Priority Data

Oct. 1, 1998 (JP) ............................................. 10-279821

(51) Int. Cl.[7] ........................ H01L 27/01; H01L 27/12; H01L 31/0392; H01L 29/04; H01L 31/20
(52) U.S. Cl. ........................... 257/350; 257/59; 257/72; 257/366
(58) Field of Search ........................... 257/59, 72, 350, 257/365, 366

(56) References Cited

U.S. PATENT DOCUMENTS

| | | | | |
|---|---|---|---|---|
| 5,017,983 A | * | 5/1991 | Wu | |
| 5,132,821 A | * | 7/1992 | Nicholas | |
| 5,140,391 A | * | 8/1992 | Hayashi et al. | |
| 5,323,042 A | * | 6/1994 | Matsumoto | 257/350 |
| 5,644,146 A | * | 7/1997 | Arai et al. | 257/66 |
| 5,835,172 A | * | 11/1998 | Yeo et al. | 349/46 |
| 5,917,221 A | * | 6/1999 | Takemura | 257/365 |
| 5,929,463 A | * | 7/1999 | Stupp et al. | 257/59 |
| 5,998,841 A | * | 12/1999 | Suzawa | 257/350 |

* cited by examiner

Primary Examiner—Ngân V. Ngô
(74) Attorney, Agent, or Firm—Rader, Fishman & Grauer PLLC; Ronald P. Kananen

(57) ABSTRACT

A single crystal silicon is graphoepitaxially grown using a step formed on a substrate as a seed by a catalyst process, and the obtained single crystal silicon layer is used for a dual gate type MOSTFT in an electro-optical apparatus such as a display section of a peripheral driving circuit integration type LCD. A single crystal silicon thin film having high electron/hole mobility is formed into a uniform film at a relatively low temperature, which enables the manufacturing of an active matrix substrate incorporated with a high-performance driver which can be used in a TFT display.

66 Claims, 51 Drawing Sheets

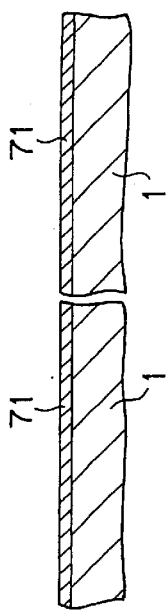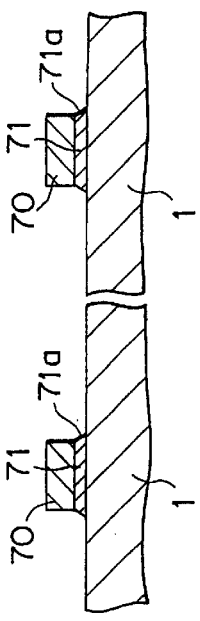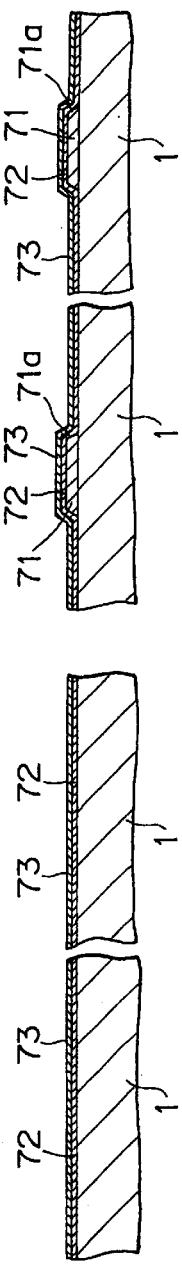

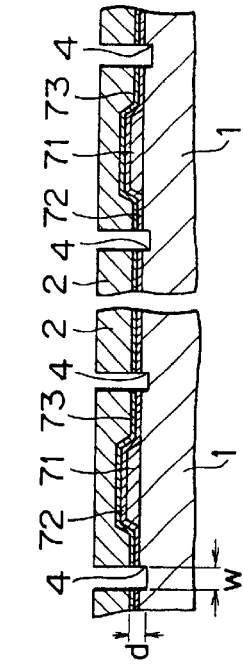
FIG. 2(4) STEP FORMED ON SUBSTRATE
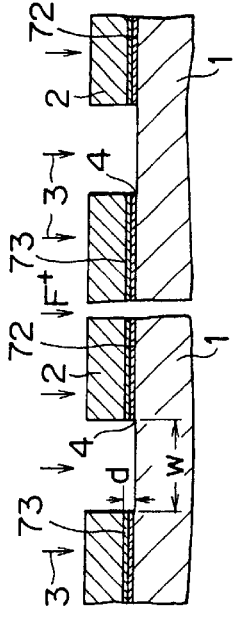
FIG. 2(5) GRAPHOEPITAXIAL GROWING OF SINGLE CRYSTAL SILICA BY CATALYST CVD PROCESS
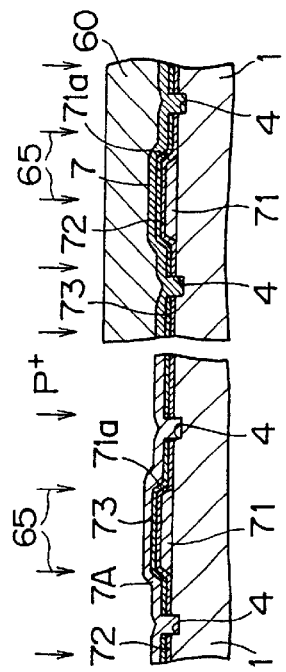
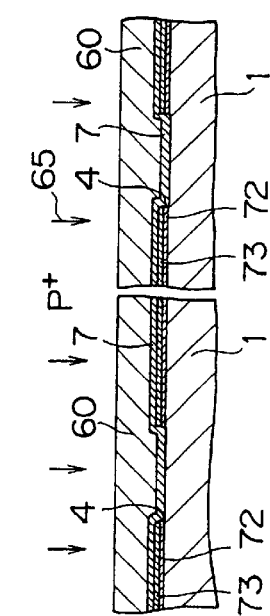
FIG. 2(6) SPECIFIC RESISTIVITY CONTROLLED PHOTORESIST AND N-WELL FORMED

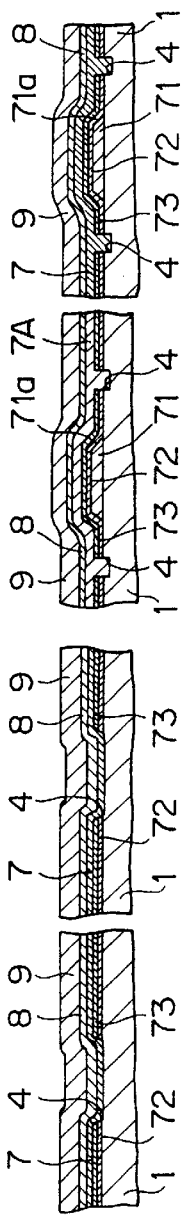
FIG. 3(7) TOP GATE INSULATION FILM (SiN/SiO2 FILM) FORMED, TOP GATE ELECTRODE MATERIAL FILM (MOLYBDENUM-TANTALUM ALLOY FILM) FORMED
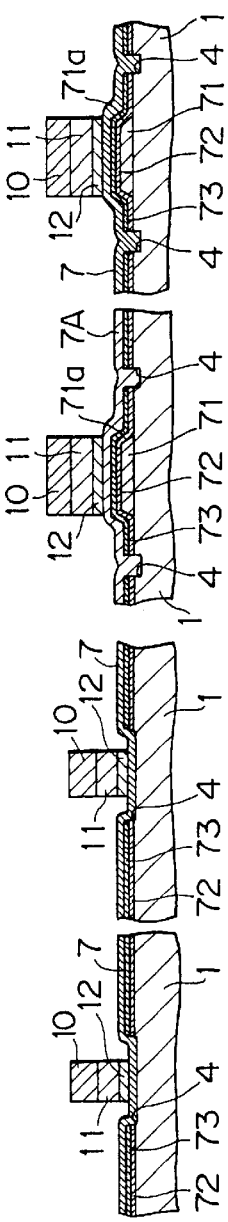
FIG. 3(8) TOP GATE INSULATION FILM (NITRIDE FILM/OXIDE FILM) AND TOP ELECTRODE (Mo/Ta) FORMED
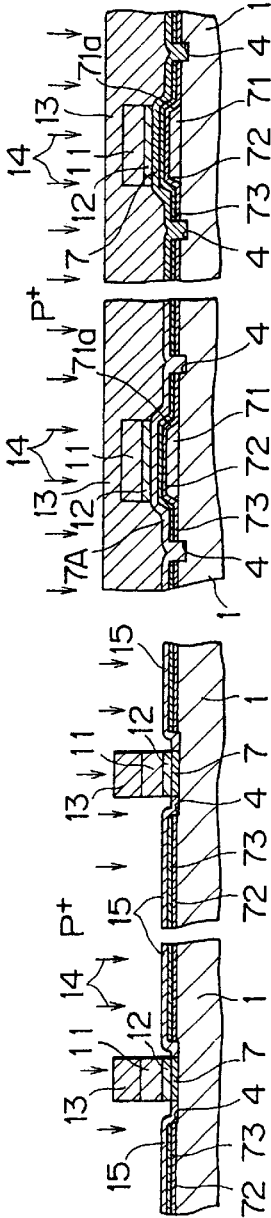
FIG. 3(9) PHOTORESIST FORMED LDD OF nMOSFET IN DISPLAY SECTION FORMED

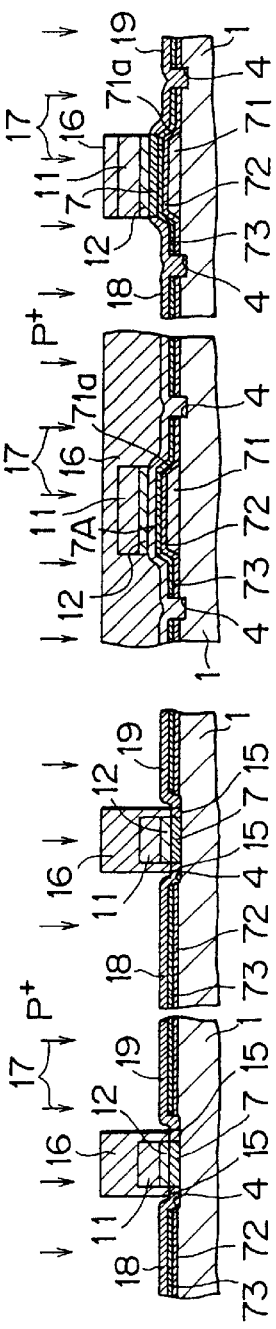
F I G. 4(10)
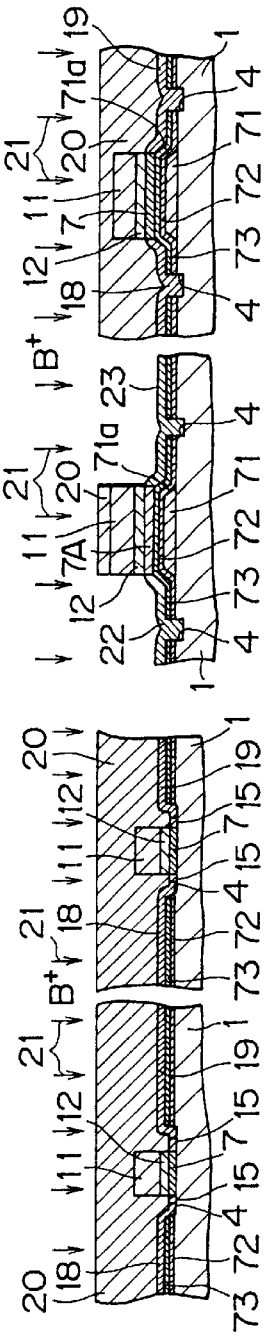
F I G. 4(11)
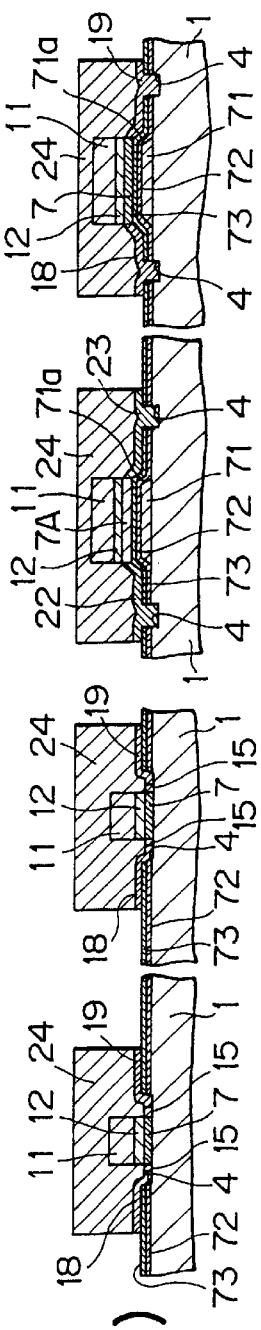
F I G. 4(12)

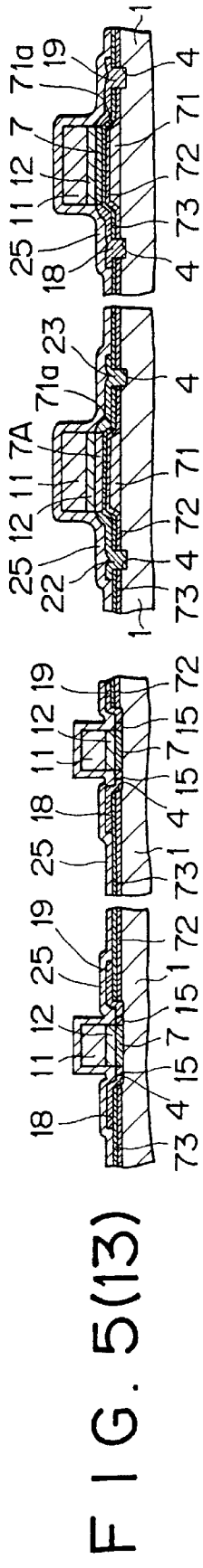
F I G. 5(13) PROTECTION FILM (PSG/SiO2) FORMED AND ACTIVATED
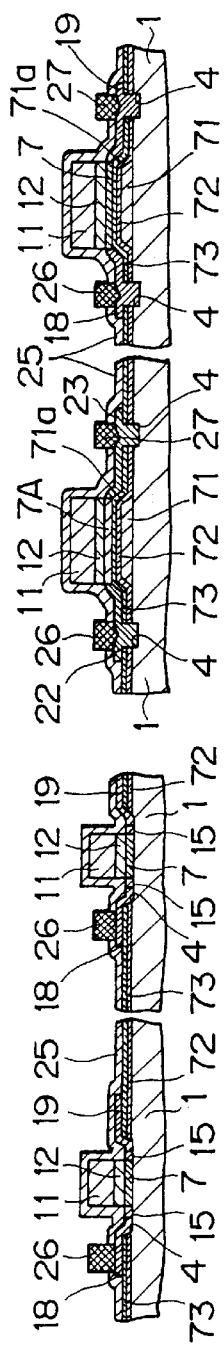
F I G. 5(14) CONTACT HOLE OPENED FOR SOURCE SECTION AND SOURCE/DRAIN PORTION OF PERIPHERAL DRIVING CIRCUIT SECTION, SOURCE ELECTRODE OF DISPLAL SECTION, SOURCE/DRAIN ELECTRODE OF PERIPHERAL DRIVING CIRCUIT SECTION FORMED
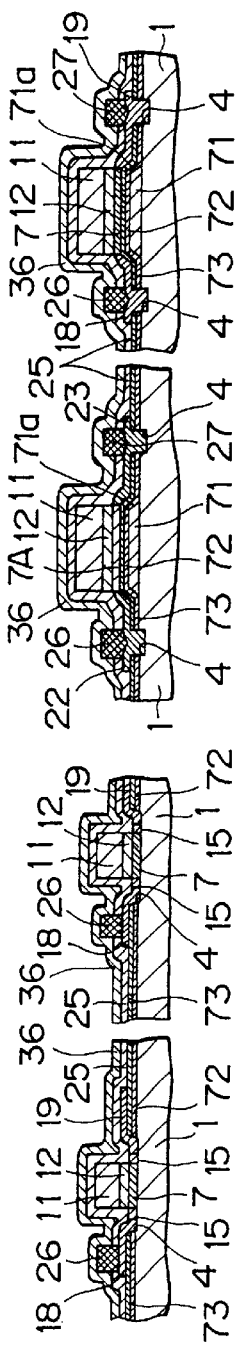
F I G. 5(15) SiN/PSG FILM FORMED

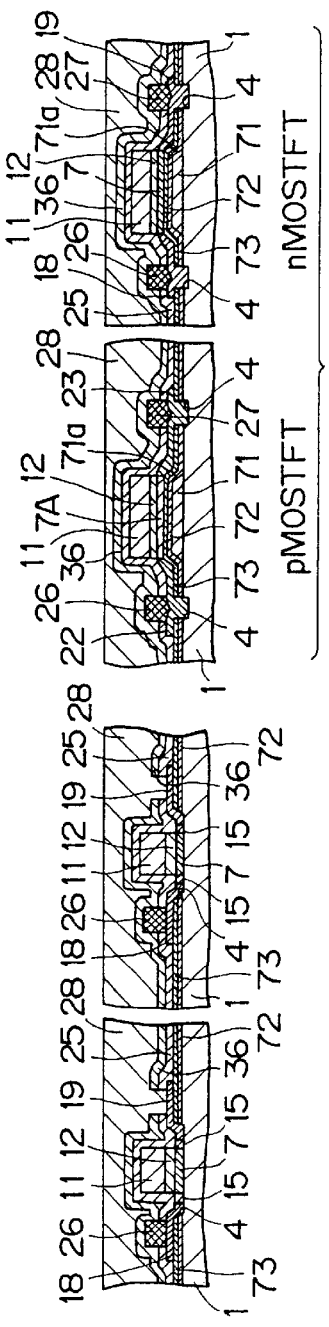
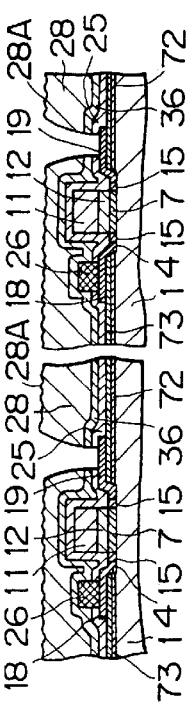
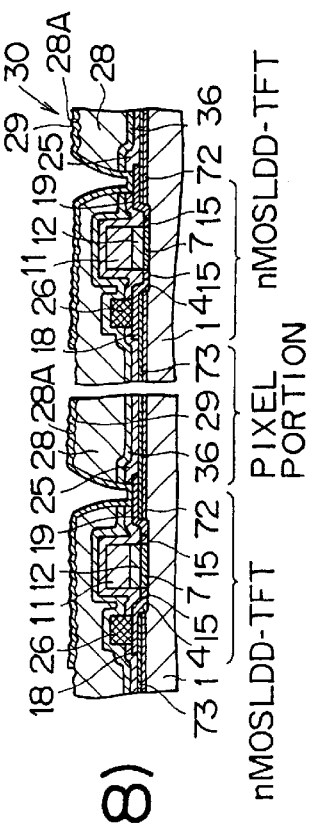
FIG. 6(16) CONTACT HOLE OPENED FOR DRAIN PORTION OF DISPLAY SECTION OPENED, LIGHT SENSITIVE RESIN FILM FORMED
FIG. 6(17) CONTACT HOLE FORMED FOR LIGHT SENSITIVE RESIN FILM ROUGHENED, CONTACT HOLE OPENED FOR DRAIN PORTION OF DISPLAY SECTION
FIG. 6(18) REFLECTION FILM (FOR EXAMPLE, ALUMINUM FOIL) FORMED

FIG. 13

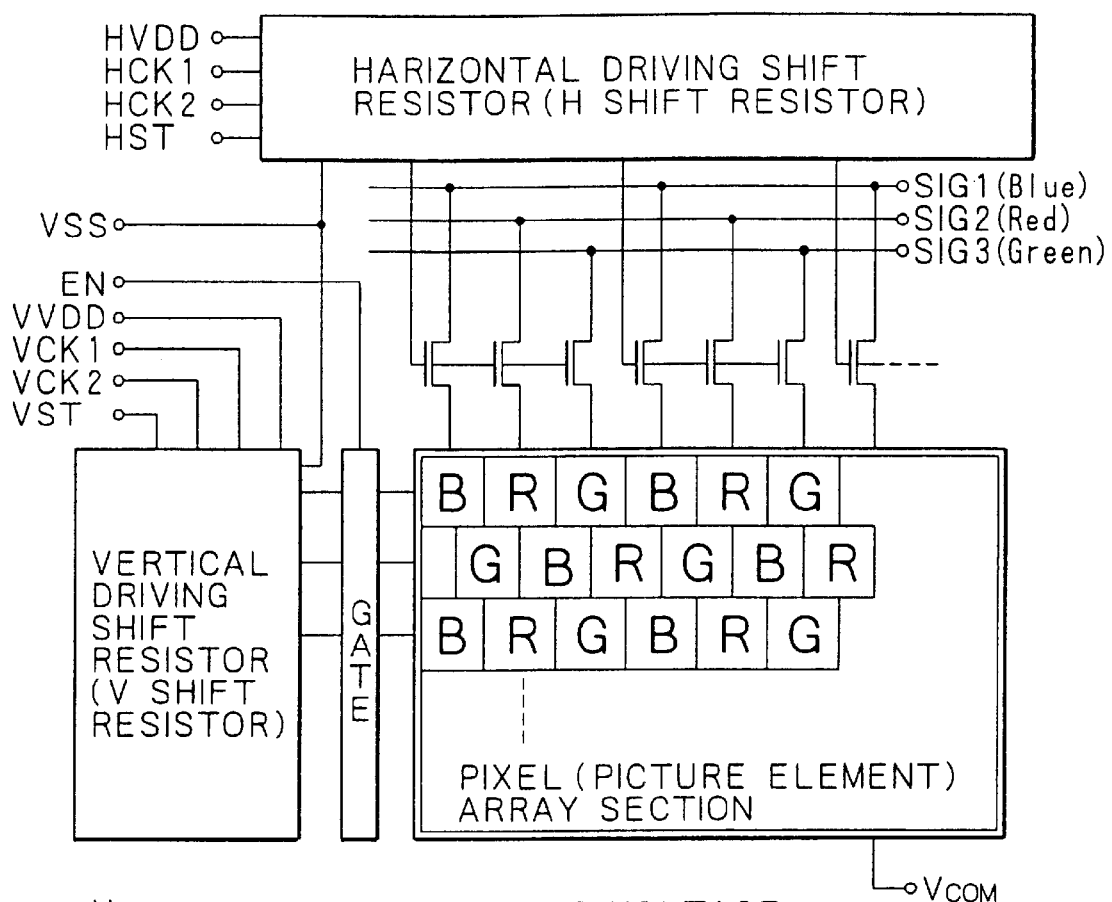

Vcom : COMMON ELECTRODE VOLTAGE
HVDD : H DRIVER POWER SOURCE INPUT TERMINAL
VVDD : V DRIVER POWER SOURCE INPUT TERMINAL
HTCK1 : CLOCK INPUT TERMINAL FOR H SHIFT
    RESISTOR DRIVING
HTCK2 : CLOCK INPUT TERMINAL FOR H SHIFT
    RESISTOR DRIVING
VCK1 : CLOCK INPUT TERMINAL FOR H SHIFT
    RESISTOR DRIVING
VCK2 : CLOCK INPUT TERMINAL FOR H SHIFT
    RESISTOR DRIVING
HST : START PULSE INPUT TERMINAL FOR H
    SHIFT RESISTOR DRIVING
VST : STRAT PULSE INPUT TERMINAL FOR V
    SHIFT RESISTOR DRIVING
VSS : GND TERMINAL FOR H, V DRIVER
SIG1 : VIDEO SIGNAL INPUT TERMINAL VOLTAGE (BLUE)
SIG2 : VIDEO SIGNAL INPUT TERMINAL VOLTAGE (RED)
SIG3 : VIDEO SIGNAL INPUT TERMINAL VOLTAGE (GREEN)

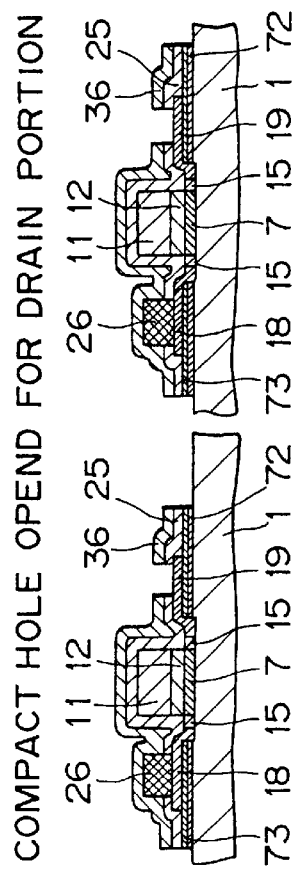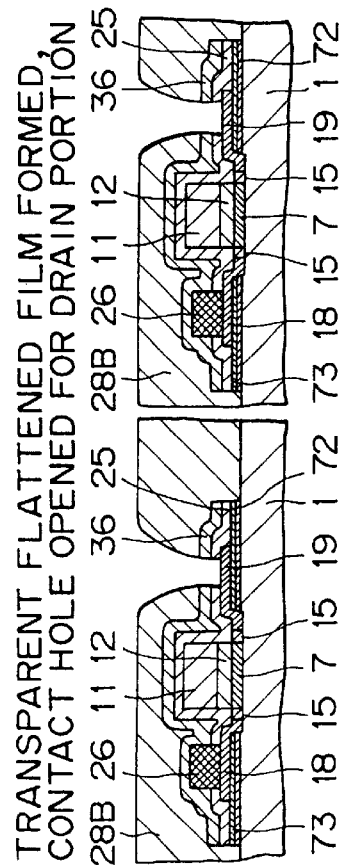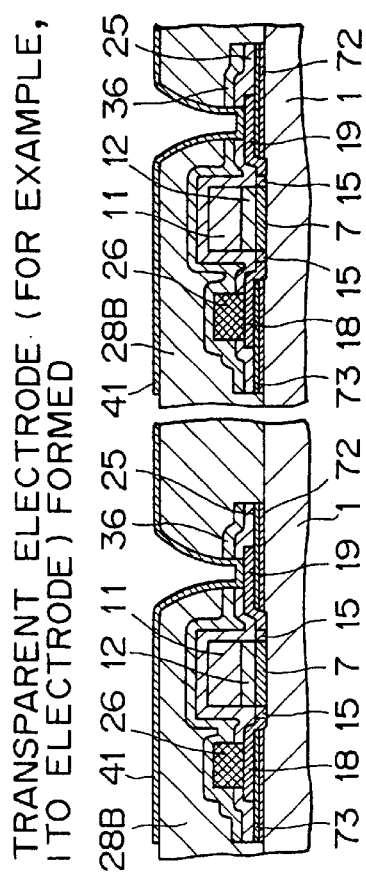
F I G. 14(16) F I G. 14(17) F I G. 14(18)

CONTACT HOLE OPENED FOR SOURCE/
DRAIN PORTION, ELECTRODE FORMED,
Sin/PSG FILM FORMED
F I G. 16(15)
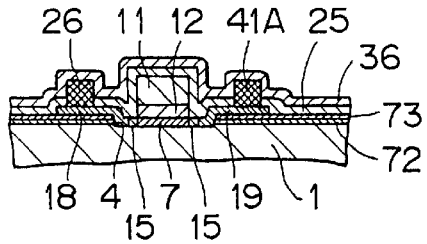
COLOR FILTER LAYER FORMED
F I G. 16(16)
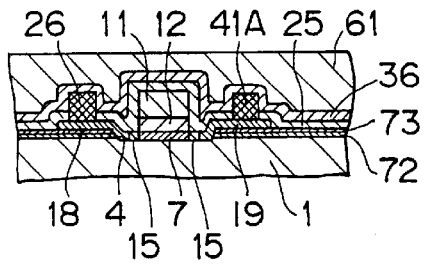
CONTACT HOLE OPENED FOR DRAIN,
BLACK MASK LAYER FORMED
F I G. 16(17)
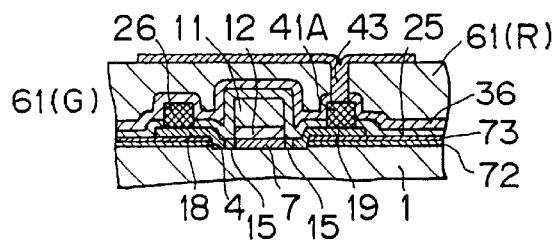
FLATTENED FILM FORMED,
PIXEL ELECTRODE FORMED
F I G. 16(18)
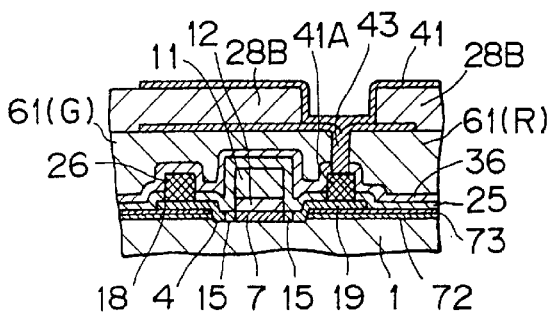

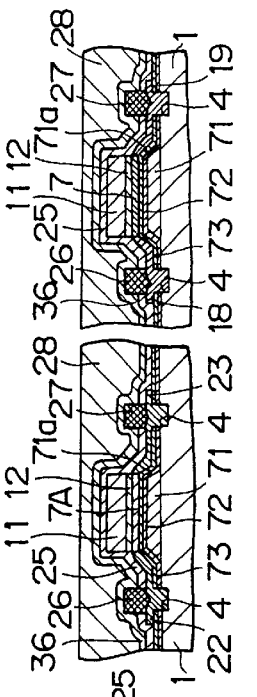
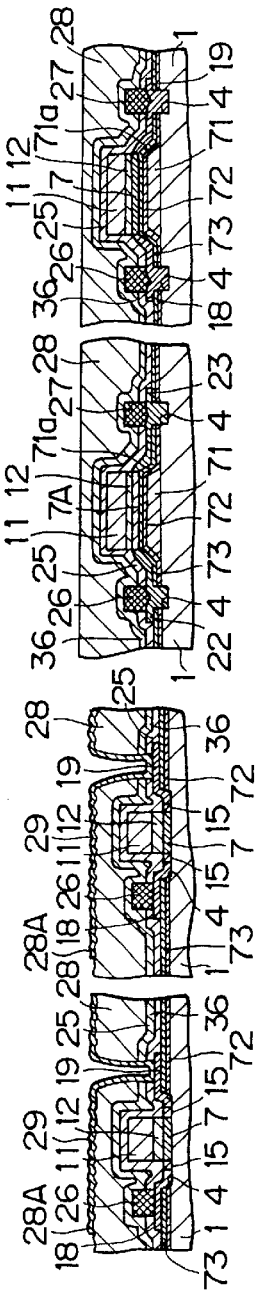
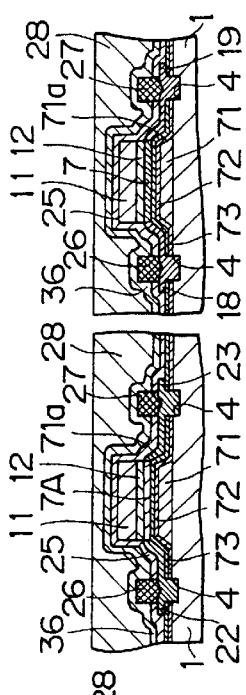
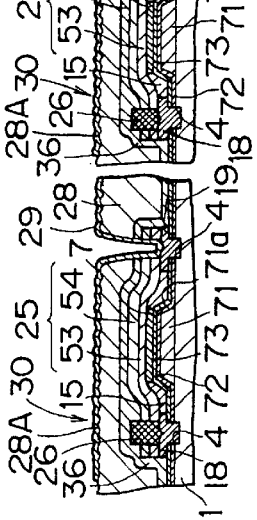
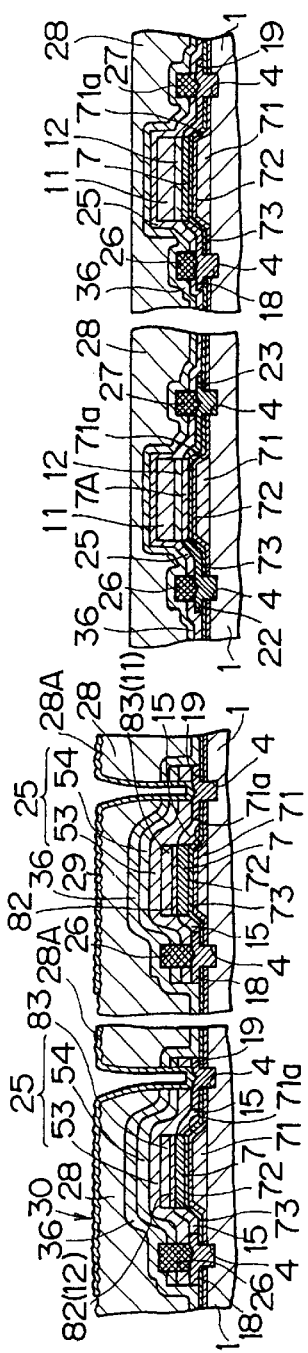
F I G. 17A
F I G. 17B
F I G. 17C

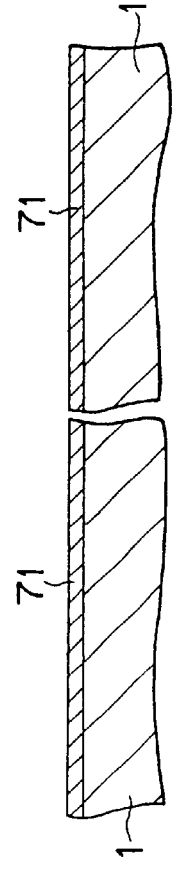
F I G. 18(1)
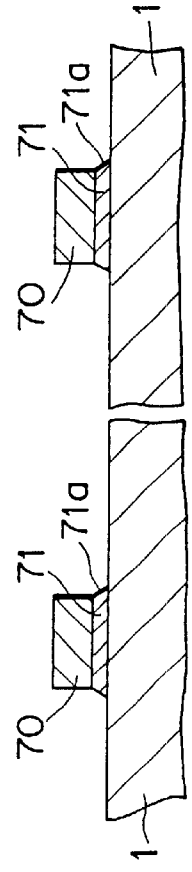
F I G. 18(2)
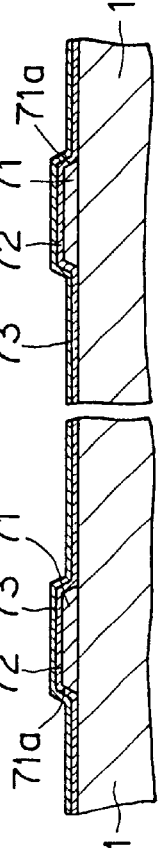
F I G. 18(3)

STPE FORMED ON SUBSTRATE
F I G. 19(4)
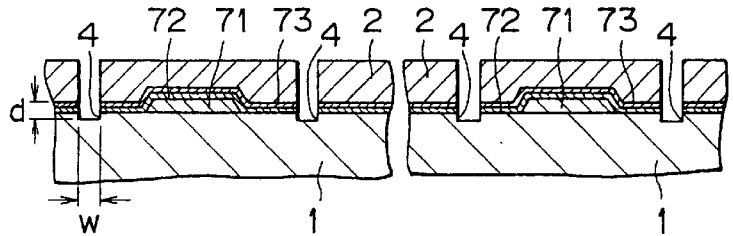
SINGLE CRYSTAL SILICON GRAPHOEP-
ITAXIALLY GROWN BY CATALST
CVD PROCESS
F I G. 19(5)
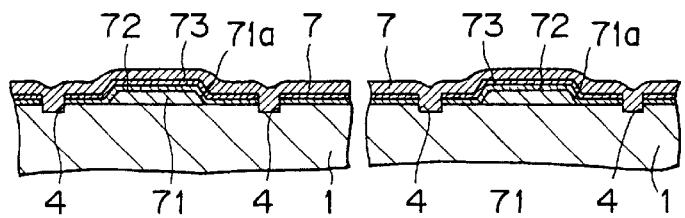
LDD LAYER FORMED FOR DISPLAY
nMOSFET
F I G. 19(6)
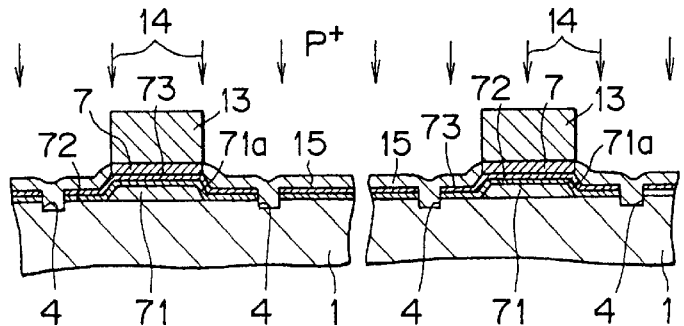

SOURCE/DRAIN PORTION OF nMOSFET FORMED

RESIST FORMED

ACTIVE DEVICE PORTION AND PATH DEVICE PORTION FORMED AS ISLAND

PROTECTION FILM (PSG/SiN2) FORMED AND ACTIVATED

CONTACT HOLE OPENED FOR SOURCE
PORTION, SOURCE ELECTRODE FORMED
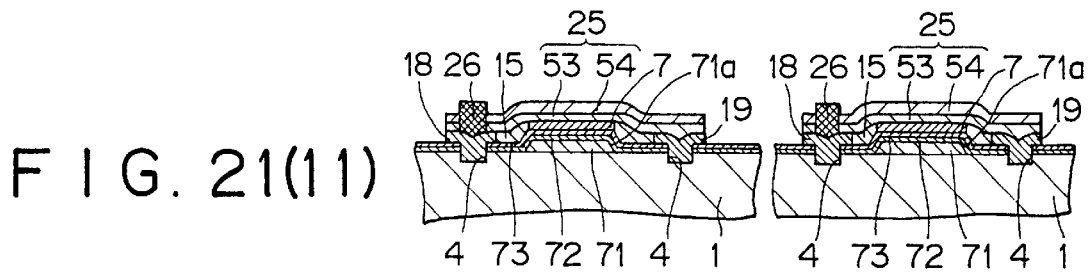
F I G. 21(11)
PROTECTION FILM (SiN/PSG) FORMED, HOLE
OPENED FOR DRAIN SECTION
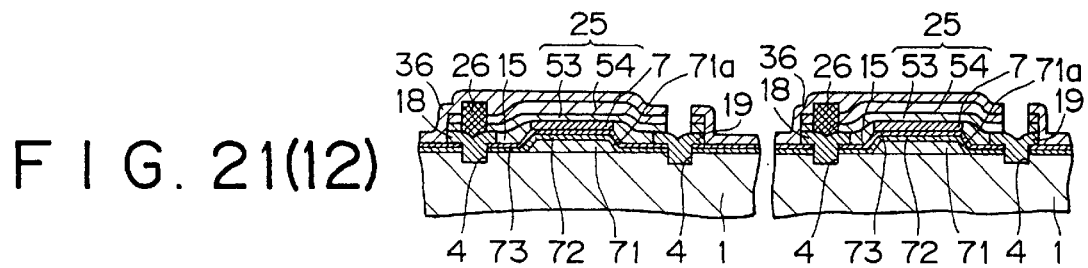
F I G. 21(12)
LIGHT SENSITIVE RESIST FILM FORMED
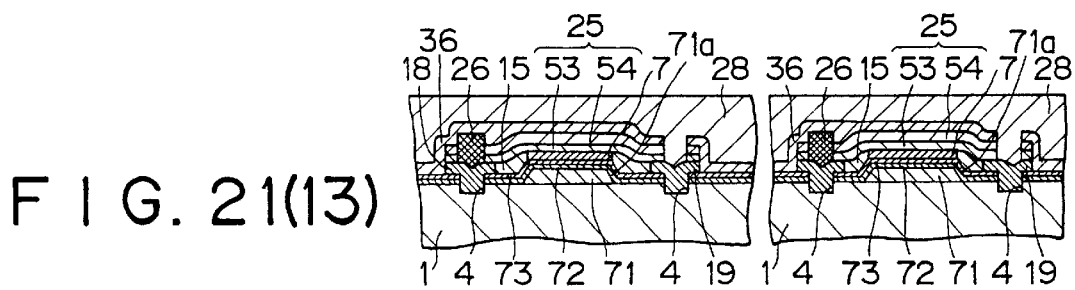
F I G. 21(13)
LIGHT SENSITIVE RESIN FILM ROUGHENED,
HOLE OPENED FOR DRAIN PORTION AND
REFLECTION FILM (FOR EXAMPLE,
ALUMINUM FILM) FORMED
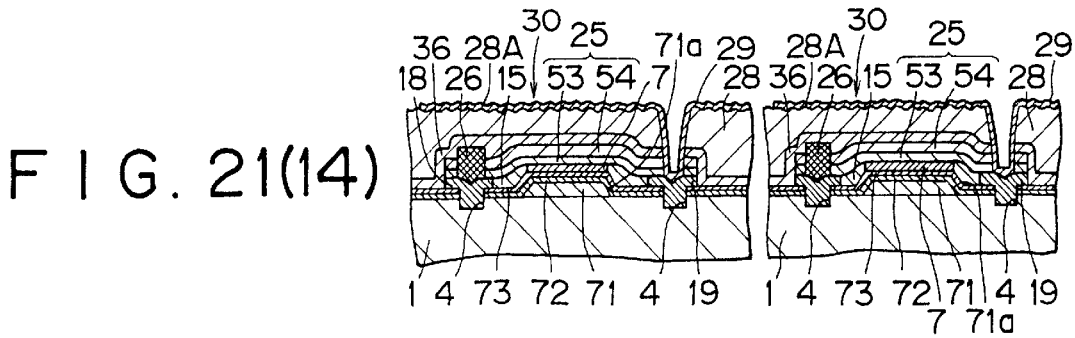
F I G. 21(14)

\<DISPLAY SECTION\>
GATE INSULATION FILM FORMED BY ANODIZATION
F I G. 22(3)
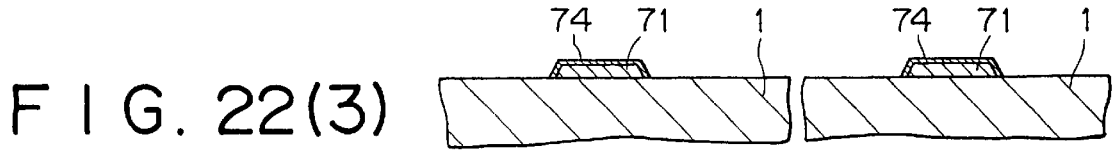
SINGLE CRYSTAL SILICON GRAPHOEPI-TAXIALLY GROWN BY CATALYST CVD PROCESS
F I G. 22(4)
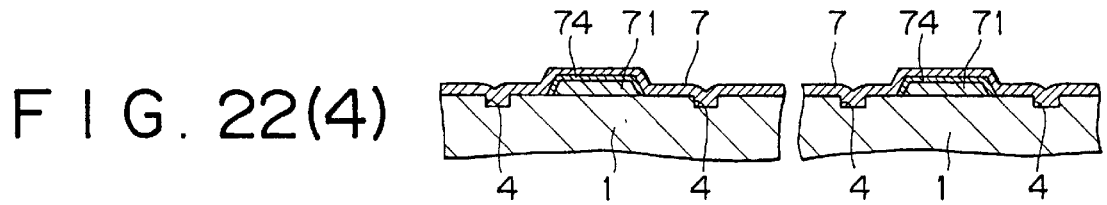
LIGHT SENSITIVE RESIN FILM ROUGHENED, HOLE IS OPENED FOR DRAIN PORTION, REFLECTION FILM (FOR EXAMPLE, ALUMINUM FILM) FORMED
F I G. 22(5)
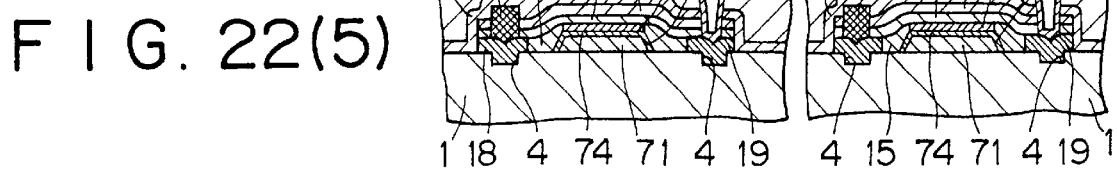

<DISPLAY SECTION>

TOP GATE INSULATION FILM, TOP GATE ELECTRODE MATERIAL FILM FORMED

TOP GATE INSULATION FILM, TOP GATE ELECTRODE PATTERNED

LDD LAYER FOR DISPLAY nMOSTFT FORMED

SOURCE/DRAIN PORTION OF nMOSFET FORMED

RESIST FORMED
F I G. 24(10)
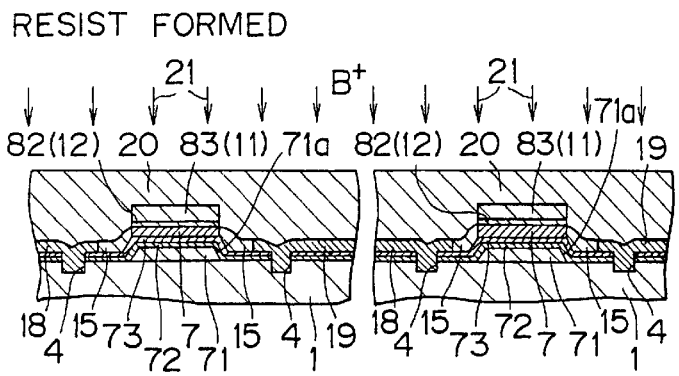
ACTIVE DEVICE PORTION AND PASSIVE DEVICE PORTION FORMED AS ISLAND
F I G. 24(11)
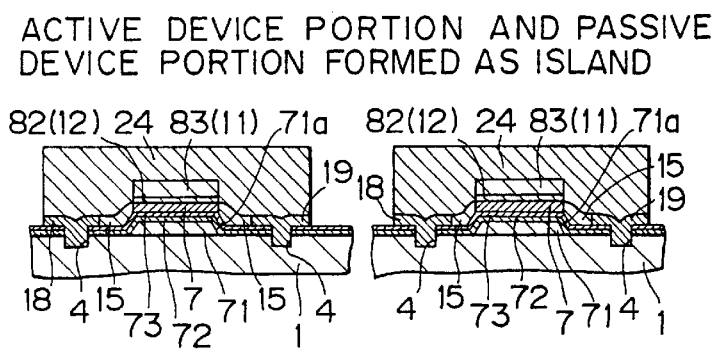
PROTECTION FILM (PSG/SiO$_2$) FORMED AND ACTIVATED
F I G. 24(12)
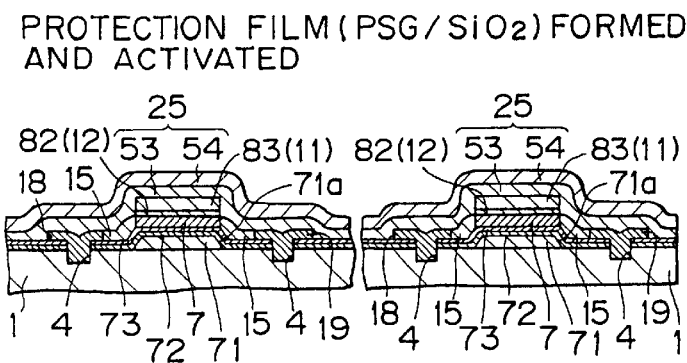
CONTACT HOLE OPENED FOR THE SOURCE PORTION, SOURCE ELECTRODE FORMED
F I G. 24(13)
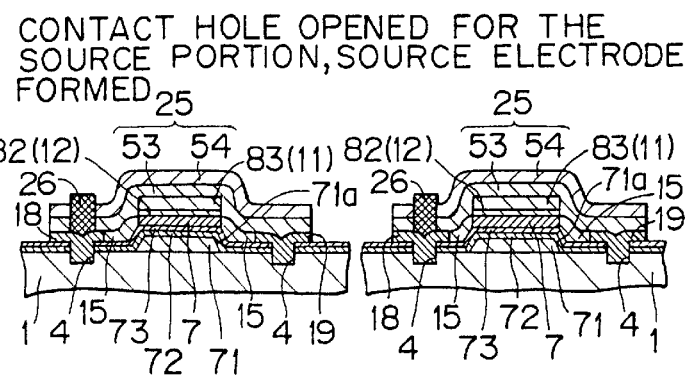

INSULATION FILM (SiN/PSG) FORMED
AND HOLE OPENED FOR DRAIN PORTION

LIGHT SENSITIVE RESIN FILM FORMED

LIGHT SENSITIVE RESIN FILM ROUGHENED, HOLE OPENED FOR DRAIN POTION, REFLCTION FILM (FOR EXAMPLE, ALMINUM FILM) FORMED

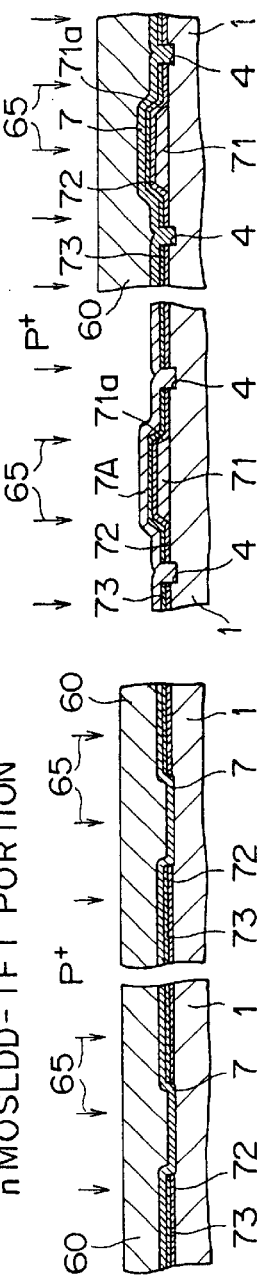
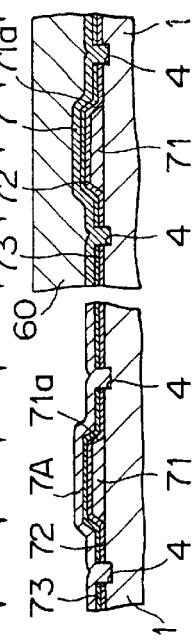
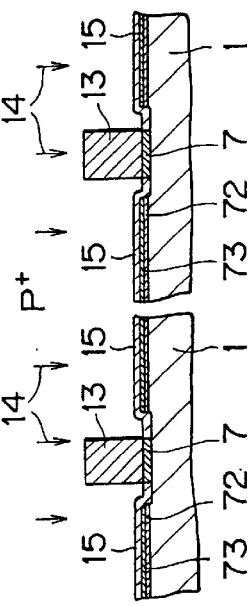
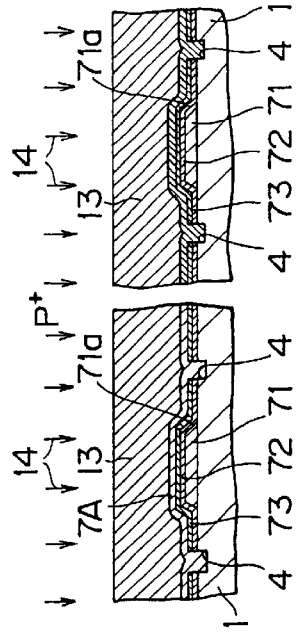
F I G. 26(6)
F I G. 26(7)

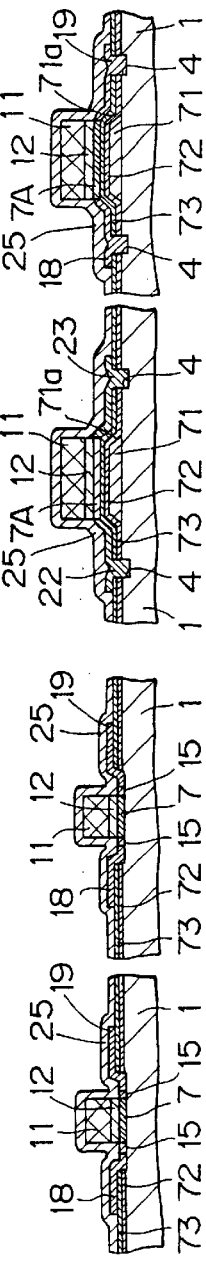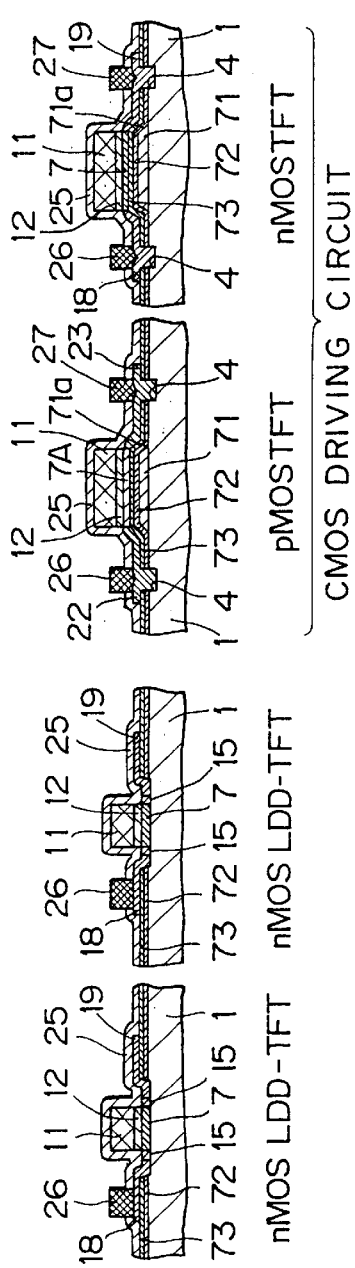
FIG. 28(11)
FIG. 28(12)

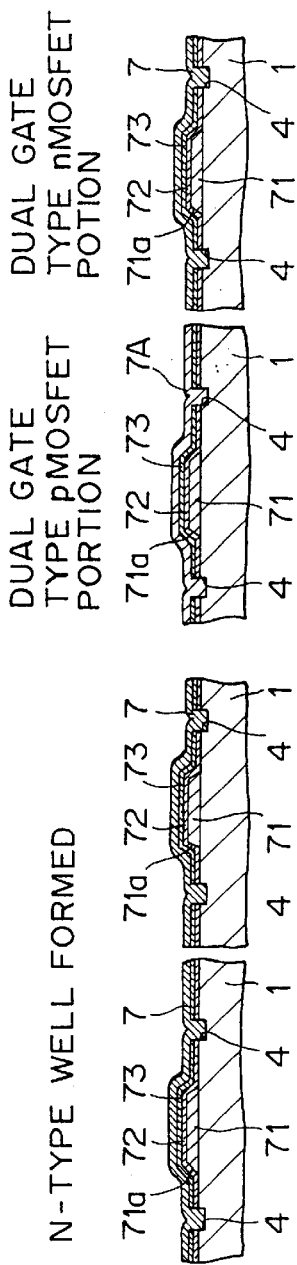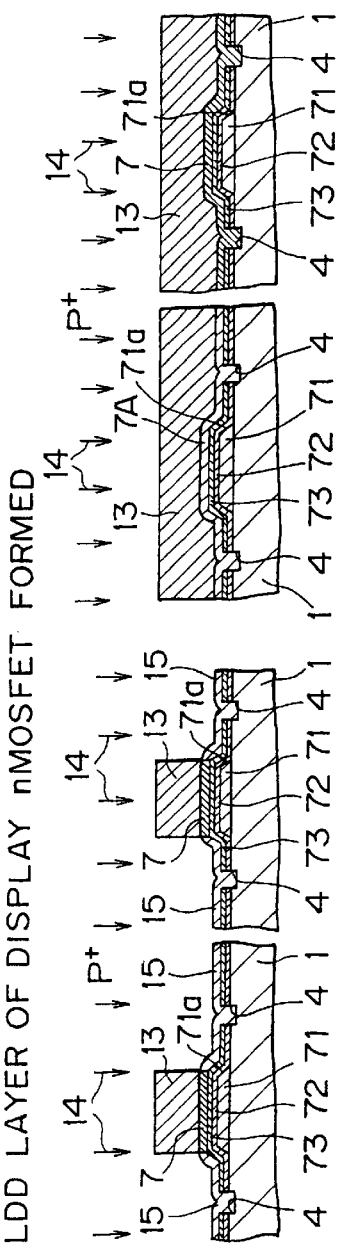
F I G. 29(5)
F I G. 29(6)

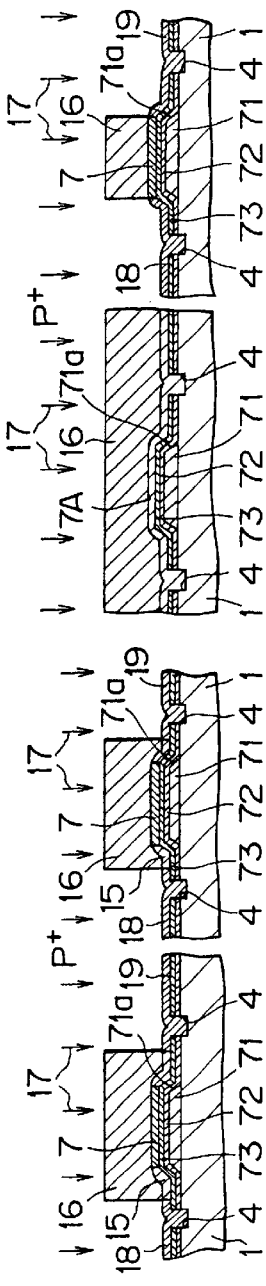
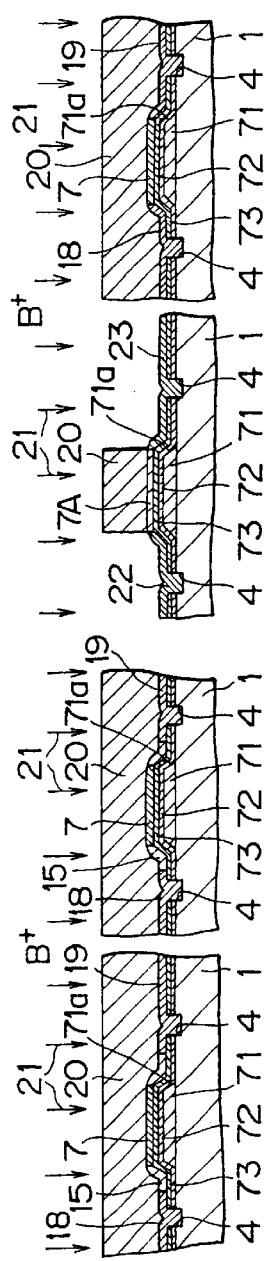
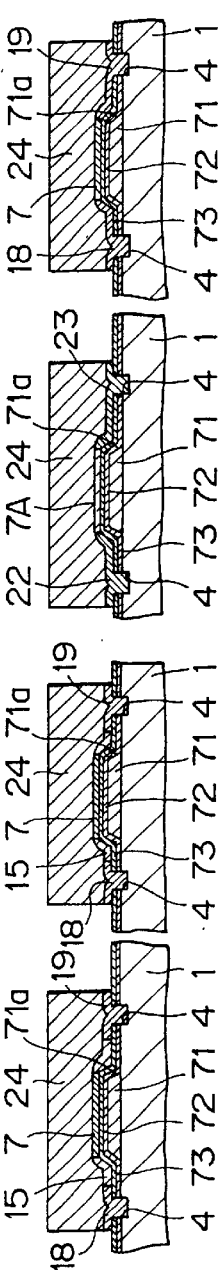
FIG. 30(7)  FIG. 30(8)  FIG. 30(9)

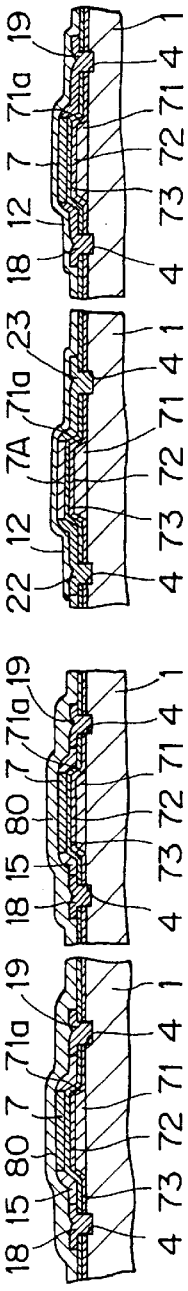
F I G. 31(10)
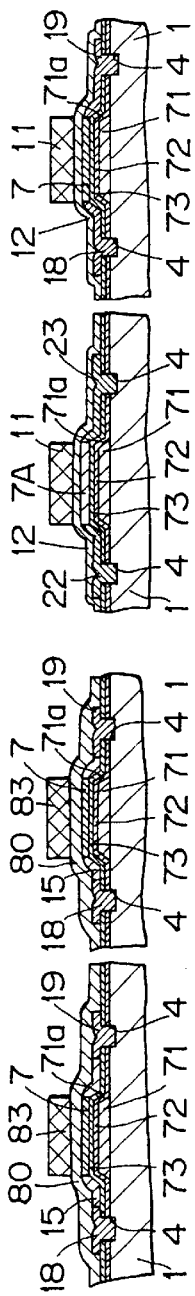
F I G. 31(11)
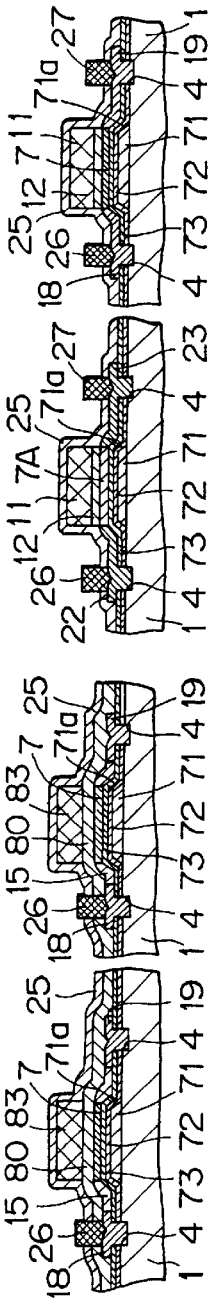
F I G. 31(12)

STEP FORMED IN GLASS SUBSTRATE

STEP FORMED IN SiN FILM

FIG. 39
TOP GATE TYPE OR BOTTOM GATE TYPE
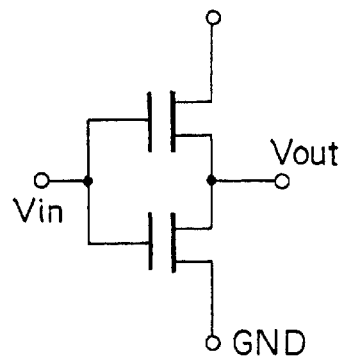
DUAL GATE TYPE
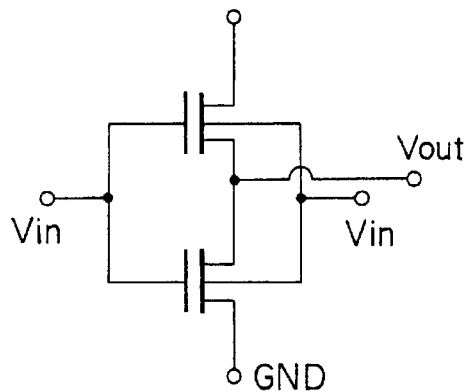
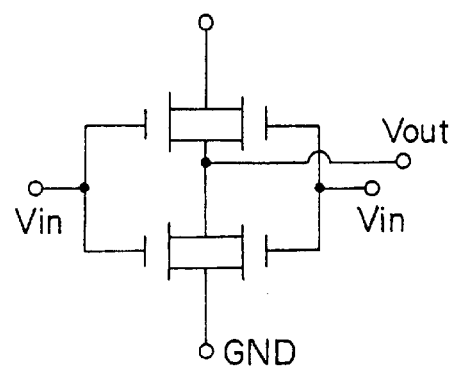

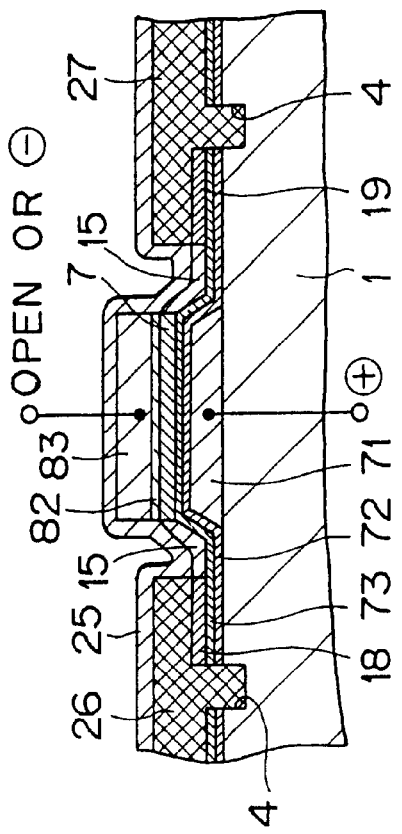
F I G. 40A
USED AS BOTTOM GATE TYPE nMOSFET
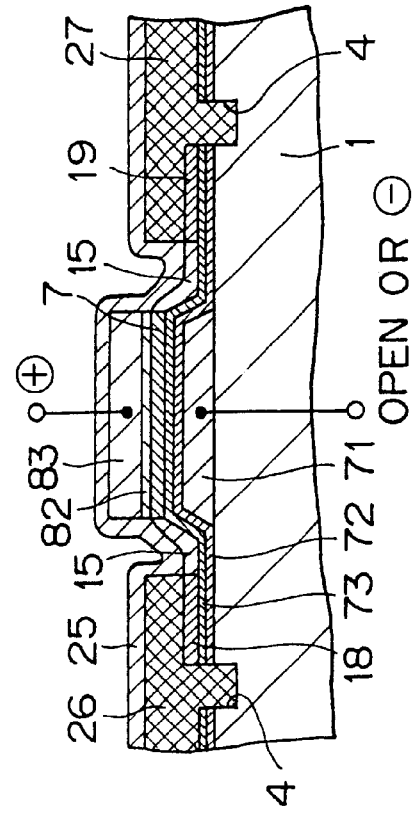
F I G. 40B
USED AS TOP GATE TYPE nMOSFET

F I G. 41

| NO. | PERIPHERAL DRIVING CIRCUIT SECTION | DISPLAY SECTION |
|---|---|---|
| 1 | DUAL GATE TYPE | TOP GATE TYPE |
| 2 | DUAL GATE TYPE | BOTTOM GATE TYPE |
| 3 | DUAL GATE TYPE | DUAL GATE TYPE |
| 4 | TOP GATE TYPE + DUAL GATE TYPE | TOP GATE TYPE |
| 5 | TOP GATE TYPE + DUAL GATE TYPE | BOTTOM GATE TYPE |
| 6 | TOP GATE TYPE + DUAL GATE TYPE | DUAL GATE TYPE |
| 7 | BOTTOM GATE TYPE + DUAL GATE TYPE | TOP GATE TYPE |
| 8 | BOTTOM GATE TYPE + DUAL GATE TYPE | BOTTOM GATE TYPE |
| 9 | BOTTOM GATE TYPE + DUAL GATE TYPE | DUAL GATE TYPE |
| 10 | TOP GATE TYPE + BOTTOM GATE TYPE + DUAL GATE TYPE | TOP GATE TYPE |
| 11 | TOP GATE TYPE + BOTTOM GATE TYPE + DUAL GATE TYPE | BOTTOM GATE TYPE |
| 12 | TOP GATE TYPE + BOTTOM GATE TYPE + DUAL GATE TYPE | DUAL GATE TYPE |

FIG. 42

(NO LDD STRUCTURE IN DISPLAY SECTION MOSTFT)

| NO. | TFT'S IN PERIPHERAL DRIVING CIRCUIT SECTION | | TFT IN DISPLAY SECTION | |
|---|---|---|---|---|
| | GATE STRUCTURE | CHANNEL CONDUCTION TYPE | GATE STRUCTURE | CHANNEL CONDUCTION TYPE |
| 1 | DUAL GATE | p | TOP GATE | p |
| 2 | DUAL GATE | p | TOP GATE | n |
| 3 | DUAL GATE | n | TOP GATE | n |
| 4 | DUAL GATE | n | TOP GATE | p |
| 5 | DUAL GATE | c | TOP GATE | p |
| 6 | DUAL GATE | c | TOP GATE | n |
| 7 | DUAL GATE | c | TOP GATE | c |
| 8 | DUAL GATE | p | TOP GATE | c |
| 9 | DUAL GATE | n | TOP GATE | c |
| 10 | DUAL GATE | p | BOTTOM GATE | p |
| 11 | DUAL GATE | p | BOTTOM GATE | n |
| 12 | DUAL GATE | n | BOTTOM GATE | n |
| 13 | DUAL GATE | n | BOTTOM GATE | p |
| 14 | DUAL GATE | c | BOTTOM GATE | p |
| 15 | DUAL GATE | c | BOTTOM GATE | n |
| 16 | DUAL GATE | c | BOTTOM GATE | c |
| 17 | DUAL GATE | p | BOTTOM GATE | c |
| 18 | DUAL GATE | n | BOTTOM GATE | c |
| 19 | DUAL GATE | p | DUAL GATE | p |
| 20 | DUAL GATE | p | DUAL GATE | n |
| 21 | DUAL GATE | n | DUAL GATE | n |
| 22 | DUAL GATE | n | DUAL GATE | p |
| 23 | DUAL GATE | c | DUAL GATE | p |
| 24 | DUAL GATE | c | DUAL GATE | n |
| 25 | DUAL GATE | c | DUAL GATE | c |
| 26 | DUAL GATE | p | DUAL GATE | c |
| 27 | DUAL GATE | n | DUAL GATE | c | p : p-CHANNEL TYPE
n : n-CHANNEL TYPE
c : COMPLEMENTARY TYPE IN COMBINATION OF p-CHANNEL TYPE AND n-CHANNEL TYPE (IN COMMON WITH FIG.42 TO FIG.49)

FIG. 43

⟨NO LDD STRUCTURE IN DISPLAY SECTION MOSTFT⟩

| NO. | TFT'S IN PERIPHERAL DRIVING CIRCUIT SECTION | | TFT IN DISPLAY SECTION | |
|---|---|---|---|---|
| | GATE STRUCTURE | CHANNEL CONDUCTION TYPE | GATE STRUCTURE | CHANNEL CONDUCTION TYPE |
| 28 | DUAL GATE | c+n | TOP GATE | p |
| 29 | DUAL GATE | c+n | TOP GATE | n |
| 30 | DUAL GATE | c+n | TOP GATE | c |
| 31 | DUAL GATE | c+p | TOP GATE | p |
| 32 | DUAL GATE | c+p | TOP GATE | n |
| 33 | DUAL GATE | c+p | TOP GATE | c |
| 34 | DUAL GATE | c+n+p | TOP GATE | p |
| 35 | DUAL GATE | c+n+p | TOP GATE | n |
| 36 | DUAL GATE | c+n+p | TOP GATE | c |
| 37 | DUAL GATE | c+n | BOTTOM GATE | p |
| 38 | DUAL GATE | c+n | BOTTOM GATE | n |
| 39 | DUAL GATE | c+n | BOTTOM GATE | c |
| 40 | DUAL GATE | c+p | BOTTOM GATE | p |
| 41 | DUAL GATE | c+p | BOTTOM GATE | n |
| 42 | DUAL GATE | c+p | BOTTOM GATE | c |
| 43 | DUAL GATE | c+n+p | BOTTOM GATE | p |
| 44 | DUAL GATE | c+n+p | BOTTOM GATE | n |
| 45 | DUAL GATE | c+n+p | BOTTOM GATE | c |
| 46 | DUAL GATE | c+n | DUAL GATE | p |
| 47 | DUAL GATE | c+n | DUAL GATE | n |
| 48 | DUAL GATE | c+n | DUAL GATE | c |
| 49 | DUAL GATE | c+p | DUAL GATE | p |
| 50 | DUAL GATE | c+p | DUAL GATE | n |
| 51 | DUAL GATE | c+p | DUAL GATE | c |
| 52 | DUAL GATE | c+n+p | DUAL GATE | p |
| 53 | DUAL GATE | c+n+p | DUAL GATE | n |
| 54 | DUAL GATE | c+n+p | DUAL GATE | c |

FIG. 44

(LDD STRUCTURE IN DISPLAY SECTION MOSTFT)

| NO. | TFT'S IN PERIPHERAL DRIVING CIRCUIT SECTION | | TFT IN DISPLAY SECTION | |
|---|---|---|---|---|
| | GATE STRUCTURE | CHANNEL CONDUCTION TYPE | GATE STRUCTURE | CHANNEL CONDUCTION TYPE |
| 55 | DUAL GATE | p | TOP GATE | p |
| 56 | DUAL GATE | p | TOP GATE | n |
| 57 | DUAL GATE | n | TOP GATE | n |
| 58 | DUAL GATE | n | TOP GATE | p |
| 59 | DUAL GATE | c | TOP GATE | p |
| 60 | DUAL GATE | c | TOP GATE | n |
| 61 | DUAL GATE | c | TOP GATE | c |
| 62 | DUAL GATE | p | TOP GATE | c |
| 63 | DUAL GATE | n | TOP GATE | c |
| 64 | DUAL GATE | p | BOTTOM GATE | p |
| 65 | DUAL GATE | p | BOTTOM GATE | n |
| 66 | DUAL GATE | n | BOTTOM GATE | n |
| 67 | DUAL GATE | n | BOTTOM GATE | p |
| 68 | DUAL GATE | c | BOTTOM GATE | p |
| 69 | DUAL GATE | c | BOTTOM GATE | n |
| 70 | DUAL GATE | c | BOTTOM GATE | c |
| 71 | DUAL GATE | p | BOTTOM GATE | c |
| 72 | DUAL GATE | n | BOTTOM GATE | c |
| 73 | DUAL GATE | p | DUAL GATE | p |
| 74 | DUAL GATE | p | DUAL GATE | n |
| 75 | DUAL GATE | n | DUAL GATE | n |
| 76 | DUAL GATE | n | DUAL GATE | p |
| 77 | DUAL GATE | c | DUAL GATE | p |
| 78 | DUAL GATE | c | DUAL GATE | n |
| 79 | DUAL GATE | c | DUAL GATE | c |
| 80 | DUAL GATE | p | DUAL GATE | c |
| 81 | DUAL GATE | n | DUAL GATE | c |

FIG. 45

⟨LDD STRUCTURE IN DISPLAY SECTION MOSTFT⟩

| NO. | TFT'S IN PERIPHERAL DRIVING CIRCUIT SECTION | | TFT IN DISPLAY SECTION | |
|---|---|---|---|---|
| | GATE STRUCTURE | CHANNEL CONDUCTION TYPE | GATE STRUCTURE | CHANNEL CONDUCTION TYPE |
| 82 | DUAL GATE | c+n | TOP GATE | p |
| 83 | DUAL GATE | c+n | TOP GATE | n |
| 84 | DUAL GATE | c+n | TOP GATE | c |
| 85 | DUAL GATE | c+p | TOP GATE | p |
| 86 | DUAL GATE | c+p | TOP GATE | n |
| 87 | DUAL GATE | c+p | TOP GATE | c |
| 88 | DUAL GATE | c+n+p | TOP GATE | p |
| 89 | DUAL GATE | c+n+p | TOP GATE | n |
| 90 | DUAL GATE | c+n+p | TOP GATE | c |
| 91 | DUAL GATE | c+n | BOTTOM GATE | p |
| 92 | DUAL GATE | c+n | BOTTOM GATE | n |
| 93 | DUAL GATE | c+n | BOTTOM GATE | c |
| 94 | DUAL GATE | c+p | BOTTOM GATE | p |
| 95 | DUAL GATE | c+p | BOTTOM GATE | n |
| 96 | DUAL GATE | c+p | BOTTOM GATE | c |
| 97 | DUAL GATE | c+n+p | BOTTOM GATE | p |
| 98 | DUAL GATE | c+n+p | BOTTOM GATE | n |
| 99 | DUAL GATE | c+n+p | BOTTOM GATE | c |
| 100 | DUAL GATE | c+n | DUAL GATE | p |
| 101 | DUAL GATE | c+n | DUAL GATE | n |
| 102 | DUAL GATE | c+n | DUAL GATE | c |
| 103 | DUAL GATE | c+p | DUAL GATE | p |
| 104 | DUAL GATE | c+p | DUAL GATE | n |
| 105 | DUAL GATE | c+p | DUAL GATE | c |
| 106 | DUAL GATE | c+n+p | DUAL GATE | p |
| 107 | DUAL GATE | c+n+p | DUAL GATE | n |
| 108 | DUAL GATE | c+n+p | DUAL GATE | c |

FIG.46

⟨LDD STRUCTURE IN A PORTION OF PERIPHERAL DRIVING CIRCUIT SECTION MOSTFT⟩

| NO. | TFT'S IN PERIPHERAL DRIVING CIRCUIT SECTION | | TFT IN DISPLAY SECTION | |
|---|---|---|---|---|
| | GATE STRUCTURE | CHANNEL CONDUCTION TYPE | GATE STRUCTURE | CHANNEL CONDUCTION TYPE |
| 109 | DUAL GATE | p | TOP GATE | p |
| 110 | DUAL GATE | p | TOP GATE | n |
| 111 | DUAL GATE | n | TOP GATE | n |
| 112 | DUAL GATE | n | TOP GATE | p |
| 113 | DUAL GATE | c | TOP GATE | p |
| 114 | DUAL GATE | c | TOP GATE | n |
| 115 | DUAL GATE | c | TOP GATE | c |
| 116 | DUAL GATE | p | TOP GATE | c |
| 117 | DUAL GATE | n | TOP GATE | c |
| 118 | DUAL GATE | p | BOTTOM GATE | p |
| 119 | DUAL GATE | p | BOTTOM GATE | n |
| 120 | DUAL GATE | n | BOTTOM GATE | n |
| 121 | DUAL GATE | n | BOTTOM GATE | p |
| 122 | DUAL GATE | c | BOTTOM GATE | p |
| 123 | DUAL GATE | c | BOTTOM GATE | n |
| 124 | DUAL GATE | c | BOTTOM GATE | c |
| 125 | DUAL GATE | p | BOTTOM GATE | c |
| 126 | DUAL GATE | n | BOTTOM GATE | c |
| 127 | DUAL GATE | p | DUAL GATE | p |
| 128 | DUAL GATE | p | DUAL GATE | n |
| 129 | DUAL GATE | n | DUAL GATE | n |
| 130 | DUAL GATE | n | DUAL GATE | p |
| 131 | DUAL GATE | c | DUAL GATE | p |
| 132 | DUAL GATE | c | DUAL GATE | n |
| 133 | DUAL GATE | c | DUAL GATE | c |
| 134 | DUAL GATE | p | DUAL GATE | c |
| 135 | DUAL GATE | n | DUAL GATE | c |

FIG. 47

⟨LDD STRUCTURE IN A PORTION OF PERIPHERAL DRIVING CIRCUIT SECTION MOSTFT⟩

| NO. | TFT'S IN PERIPHERAL DRIVING CIRCUIT SECTION | | TFT IN DISPLAY SECTION | |
|---|---|---|---|---|
| | GATE STRUCTURE | CHANNEL CONDUCTION TYPE | GATE STRUCTURE | CHANNEL CONDUCTION TYPE |
| 136 | DUAL GATE | c+n | TOP GATE | p |
| 137 | DUAL GATE | c+n | TOP GATE | n |
| 138 | DUAL GATE | c+n | TOP GATE | c |
| 139 | DUAL GATE | c+p | TOP GATE | p |
| 140 | DUAL GATE | c+p | TOP GATE | n |
| 141 | DUAL GATE | c+p | TOP GATE | c |
| 142 | DUAL GATE | c+n+p | TOP GATE | p |
| 143 | DUAL GATE | c+n+p | TOP GATE | n |
| 144 | DUAL GATE | c+n+p | TOP GATE | c |
| 145 | DUAL GATE | c+n | BOTTOM GATE | p |
| 146 | DUAL GATE | c+n | BOTTOM GATE | n |
| 147 | DUAL GATE | c+n | BOTTOM GATE | c |
| 148 | DUAL GATE | c+p | BOTTOM GATE | p |
| 149 | DUAL GATE | c+p | BOTTOM GATE | n |
| 150 | DUAL GATE | c+p | BOTTOM GATE | c |
| 151 | DUAL GATE | c+n+p | BOTTOM GATE | p |
| 152 | DUAL GATE | c+n+p | BOTTOM GATE | n |
| 153 | DUAL GATE | c+n+p | BOTTOM GATE | c |
| 154 | DUAL GATE | c+n | DUAL GATE | p |
| 155 | DUAL GATE | c+n | DUAL GATE | n |
| 156 | DUAL GATE | c+n | DUAL GATE | c |
| 157 | DUAL GATE | c+p | DUAL GATE | p |
| 158 | DUAL GATE | c+p | DUAL GATE | n |
| 159 | DUAL GATE | c+p | DUAL GATE | c |
| 160 | DUAL GATE | c+n+p | DUAL GATE | p |
| 161 | DUAL GATE | c+n+p | DUAL GATE | n |
| 162 | DUAL GATE | c+n+p | DUAL GATE | c |

FIG. 48

⟨LDD STRUCTURE IN BOTH OF PERIPHERAL DRIVING CIRCUIT SECTION MOSTFT AND DISPLAY SECTION MOSFET⟩

| NO. | TFT'S IN PERIPHERAL DRIVING CIRCUIT SECTION | | TFT IN DISPLAY SECTION | |
|---|---|---|---|---|
| | GATE STRUCTURE | CHANNEL CONDUCTION TYPE | GATE STRUCTURE | CHANNEL CONDUCTION TYPE |
| 163 | DUAL GATE | p | TOP GATE | p |
| 164 | DUAL GATE | p | TOP GATE | n |
| 165 | DUAL GATE | n | TOP GATE | n |
| 166 | DUAL GATE | n | TOP GATE | p |
| 167 | DUAL GATE | c | TOP GATE | p |
| 168 | DUAL GATE | c | TOP GATE | n |
| 169 | DUAL GATE | c | TOP GATE | c |
| 170 | DUAL GATE | p | TOP GATE | c |
| 171 | DUAL GATE | n | TOP GATE | c |
| 172 | DUAL GATE | p | BOTTOM GATE | p |
| 173 | DUAL GATE | p | BOTTOM GATE | n |
| 174 | DUAL GATE | n | BOTTOM GATE | n |
| 175 | DUAL GATE | n | BOTTOM GATE | p |
| 176 | DUAL GATE | c | BOTTOM GATE | p |
| 177 | DUAL GATE | c | BOTTOM GATE | n |
| 178 | DUAL GATE | c | BOTTOM GATE | c |
| 179 | DUAL GATE | p | BOTTOM GATE | c |
| 180 | DUAL GATE | n | BOTTOM GATE | c |
| 181 | DUAL GATE | p | DUAL GATE | p |
| 182 | DUAL GATE | p | DUAL GATE | n |
| 183 | DUAL GATE | n | DUAL GATE | n |
| 184 | DUAL GATE | n | DUAL GATE | p |
| 185 | DUAL GATE | c | DUAL GATE | p |
| 186 | DUAL GATE | c | DUAL GATE | n |
| 187 | DUAL GATE | c | DUAL GATE | c |
| 188 | DUAL GATE | p | DUAL GATE | c |
| 189 | DUAL GATE | n | DUAL GATE | c |

FIG. 49

⟨LDD STRUCTURE OF PERIPHERAL DRIVING CIRCUIT SECTION MOSTEF AND DISPLAY SECTION MOSFET⟩

| NO. | TFT'S IN PERIPHERAL DRIVING CIRCUIT SECTION | | TFT IN DISPLAY SECTION | |
|---|---|---|---|---|
| | GATE STRUCTURE | CHANNEL CONDUCTION TYPE | GATE STRUCTURE | CHANNEL CONDUCTION TYPE |
| 190 | DUAL GATE | c+n | TOP GATE | p |
| 191 | DUAL GATE | c+n | TOP GATE | n |
| 192 | DUAL GATE | c+n | TOP GATE | c |
| 193 | DUAL GATE | c+p | TOP GATE | p |
| 194 | DUAL GATE | c+p | TOP GATE | n |
| 195 | DUAL GATE | c+p | TOP GATE | c |
| 196 | DUAL GATE | c+n+p | TOP GATE | p |
| 197 | DUAL GATE | c+n+p | TOP GATE | n |
| 198 | DUAL GATE | c+n+p | TOP GATE | c |
| 199 | DUAL GATE | c+n | BOTTOM GATE | p |
| 200 | DUAL GATE | c+n | BOTTOM GATE | n |
| 201 | DUAL GATE | c+n | BOTTOM GATE | c |
| 202 | DUAL GATE | c+p | BOTTOM GATE | p |
| 203 | DUAL GATE | c+p | BOTTOM GATE | n |
| 204 | DUAL GATE | c+p | BOTTOM GATE | c |
| 205 | DUAL GATE | c+n+p | BOTTOM GATE | p |
| 206 | DUAL GATE | c+n+p | BOTTOM GATE | n |
| 207 | DUAL GATE | c+n+p | BOTTOM GATE | c |
| 208 | DUAL GATE | c+n | DUAL GATE | p |
| 209 | DUAL GATE | c+n | DUAL GATE | n |
| 210 | DUAL GATE | c+n | DUAL GATE | c |
| 211 | DUAL GATE | c+p | DUAL GATE | p |
| 212 | DUAL GATE | c+p | DUAL GATE | n |
| 213 | DUAL GATE | c+p | DUAL GATE | c |
| 214 | DUAL GATE | c+n+p | DUAL GATE | p |
| 215 | DUAL GATE | c+n+p | DUAL GATE | n |
| 216 | DUAL GATE | c+n+p | DUAL GATE | c |

FIG. 51

ACTIVE MATRIX DRIVING SYSTEM

| MOS TFT CRYSTALLINITY | MOS TFT TYPE | |
|---|---|---|
| | PERIPHERAL DRIVING CIRCUIT SECTION | DISPLAY SECTION |
| SINGLE CRYSTAL SILICON | cMOS OR n OR pMOS OR cMOS + pMOS + nMOS | n OR pMOS OR cMOS |
| POLYCRYSTAL SILICON | cMOS OR n OR pMOS OR cMOS + pMOS + nMOS | n OR pMOS OR cMOS |
| AMORPHOUS SILICON | | n OR pMOS OR cMOS |

EL (EXAMPLE OF ACTIVE MATRIX DRIVING)

SINGLE CRYSTAL SILICON MOSTFT

FED (EXAMPLE OF PASSIVE MATRIX DRIVING)

ELECTRO-OPTICAL APPARATUS HAVING A DISPLAY SECTION AND A PERIPHERAL DRIVING CIRCUIT SECTION

BACKGROUND OF THE INVENTION

1. Field of the Invention

The present invention relates to an electro-optical apparatus, a driving substrate for use in an electro-optical apparatus and a method of manufacturing them. Particularly, it relates to a structure and a method suitable, for example, to a liquid crystal display device comprising a dual gate type film insulated gate field effect transistor (hereinafter referred to as dual gate MOSTFT) using a single crystal silicon layer graphoepitaxially grown on an insulation substrate as an active region and a passive region.

2. Description of Related Art

Known active matrix type liquid crystal display devices include those having a display section using amorphous silicon for a TFT and an external driving circuit IC, or integration types comprising a display section and a driving circuit using polycrystal silicon formed by a solid phase growing method for a TFT (Japanese Published Unexamined Patent Application No. Hei 6-242433), and integration types comprising a display section and a driving circuit using polycrystal silicon subjected to excimer laser annealing for TFT (Japanese Published Unexamined Patent Application No. Hei 7-131030).

However, since the existent amorphous silicon TFT, although having good productivity, has electron mobility as low as about 0.5 to 1.0 $cm^2$/v.sec, p-channel MOSTFT (hereinafter referred to as pMOSTFT) can not be prepared. Accordingly, since the peripheral driving section using pMOSTFT can not be formed on an identical glass substrate with that for the display section, a driver IC is attached externally and mounted by a TAB system, for example, so that it is difficult to reduce the cost. In addition, this leads to a limit for high fineness. Further, since the electron mobility is as low as about 0.5–1.0 $cm^2$/v.sec, no sufficient ON current is available, and the size of the transistor is inevitably enlarged when it is used in the display section, which is disadvantageous for attaining a large aperture ratio of pixels.

Further, since the electron mobility of the existent polycrystal silicon TFT is 70 to 100 $cm^2$/v.sec and can cope with high fineness, an LCD (Liquid Crystal Display Device) using a driving circuit integrated type polycrystal silicon TFT has been noted in recent years. However, in a case of a large LCD of 15 inches or more, since the electron mobility of polycrystal silicon is from 70 to 100 $cm^2$/v.sec, the driving performance is insufficient and, after all, external driving circuit IC is necessary.

Further, since a TFT using a polycrystal silicon film formed by a solid phase growing method requires annealing at 600° C. or higher for several hours and formation of gate $SiO_2$ by thermal oxidation at about 1000° C., semiconductor production equipment has to be adopted. Therefore, the size of wafers is limited to 8–12 inchϕ and use of highly heat resistant and expensive quartz glass is inevitable making it difficult for the reduction of cost. Accordingly, application use is limited to EVF or data/AV projector.

Furthermore, the polycrystal silicon TFT obtained by the existent excimer laser annealing described above involves many problems in view of the power stability of the excimer laser, such as productivity, increase in the cost of the facility due to increased scale and lowering of yield/quality.

Particularly, in a large sized glass substrate, for example, of 1 $m^2$, the problems become more significant to result in further difficulty for the improvement of the performance/quality and reduction of the cost.

SUMMARY OF THE INVENTION

It is, accordingly, an object of the present invention to manufacture an active matrix substrate incorporated with a high performance driver and an electro-optical apparatus such as a thin film semiconductor device for display use using the substrate by forming a film of a single crystal silicon layer of high electron/hole mobility at a relatively low temperature and uniformly, thereby enabling to obtain an integrated structure of a display section comprising n-channel MOSTFT (hereinafter referred to as nMOSTFT) of an LDD (Lightly Doped Drain) structure having high switching characteristics and low leak current or pMOSTFT or a complementary film insulated gate field effect transistor (hereinafter referred to as cMOSTFT) of high driving performance, and a peripheral driving circuit comprising cMOSTFT, nMOSTFT or pMOSTFT, or the combination thereof, attain a display panel of high quality, high fineness, narrow frame edge, high efficiency and large screen area, use even a large sized glass substrate with relatively low distortion point, provide high productivity, save the use of expensive production facility making it possible for cost reduction and, further, easy control for a threshold value and making it possible for high speed operation by the lowering of resistance and for large scaled screen.

The present invention provides an electro-optical apparatus having, on a first substrate (driving substrate here and hereinafter), a display section in which pixel electrodes (for example, a plurality of pixel electrodes disposed in a matrix) are arranged, and a peripheral driving circuit section disposed to the periphery of the display section and in which a predetermined optical material such as liquid crystal is interposed between the first substrate and a second substrate (opposing substrate here and hereinafter), and a driving substrate for use in the electro-optical apparatus, wherein a gate portion comprising a gate electrode and a gate insulation film is formed on one surface of the first substrate, a step is formed on one surface of the first substrate, a single crystal silicon layer is formed on the first substrate including the step and the gate portion, and a dual gate type first thin film transistor having the single crystal silicon layer as a channel region, a source region and a drain region, and having the gate portion above and below the channel region respectively constitutes at least a portion of the peripheral driving circuit section, In the present invention, the thin film transistor includes a field effect transistor (FET) (including a MOS type and a junction type, both of which can be used) and a bipolar transistor, and the invention is applicable to any of the transistors.

The present invention also provides a method of effectively manufacturing an electro-optical apparatus having, on a first substrate, a display section in which pixel electrodes are arranged, and a peripheral driving circuit section disposed to the periphery of the display section and in which a predetermined optical material such as liquid crystal is interposed between the first substrate and a second substrate, and a driving substrate for use in the electro-optical apparatus, wherein the method comprises a step of forming a gate portion comprising a gate electrode and a gate insulation film on one surface of the first substrate, a step of forming a step on one surface of the first substrate, a step of graphoepitaxially growing a single crystal silicon layer on the first substrate including the step and the gate portion using the step as a seed, for example, by a catalyst CVD process or a high density plasma CVD process, a step of applying a predetermined treatment to the single crystal silicon layer to form a channel region, a source region and a drain region and a step of forming a dual gate type first thin film transistor having the gate portions above and below the channel region respectively and constituting at least a portion of the peripheral driving circuit section.

According to the present invention, since a single crystal silicon layer is graphoepitaxially grown using the step formed on the substrate as a seed, for example, by a catalyst CVD process and a high density plasma CVD process, which is used, for example, for a dual gate type MOSTFT in a peripheral driving circuit of a driving substrate such as an active matrix substrate, or a dual gate type MOSTFT in a peripheral driving circuit of an electro-optical apparatus such as a display section-peripheral driving circuit integration type LCD, the following remarkable functions and effects (A)–(G) can be obtained.

(A) Since a step of a predetermined shape/size is formed on a substrate and a single crystal silicon layer is graphoepitaxially grown using the angle at the bottom of the step (bottom angle) as a seed, to obtain the single crystal layer of an electro mobility higher than 540 cm/v.sec, an electro-optical apparatus such as a thin film semiconductor device for display use incorporated with a high performance driver can be manufactured. In this case, the step is preferably formed as a concave portion such that the lateral side in cross section is orthogonal to the bottom face, or inclined toward the lower end at a bottom angle preferably of 90° or less.

(B) Particularly, since the single crystal silicon layer shows high electron/hole mobility equal with that of a single crystal silicon substrate as compared with an existent amorphous silicon layer or polycrystal silicon layer, the single crystal silicon dual gate type MOSTFT obtained by the process can constitute an integrated structure having a display section comprising nMOS, pMOSTFT, or cMOSTFT having high switching characteristics (preferably with an LDD (Lightly Doped Drain) structure of moderating an electric field strength to lower the leak current) and a peripheral driving circuit section comprising cMOS, nMOS, pMOS TFT or a combination thereof of high driving performance, to provide a display panel of high image quality, high fineness, narrow frame edge, high efficiency and large screen. Particularly, it is difficult to form a pMOSTFT of high hole mobility for LCD TFT by using polycrystal silicon, but the single crystal silicon layer in the present invention shows a sufficiently high mobility also for positive holes, so that a peripheral driving circuit that drives electrons and holes either individually or in combination of them can be manufactured and can provide a panel integrating the same with TFT for display section of nMOS, pMOS or cMOS of LDD structure. Further, in a small-medium sized panel, it is possible to save one of a pair of peripheral vertical driving circuits.

(C) Particularly, since the dual gate type MOSTFT is used in the peripheral driving circuit, cMOS, nMOS or pMOS TFT having a driving performance 1.5 to 2 times as high as the single gate TFT can be constituted, to provide TFT of higher performance and larger driving performance, which is suitable particularly in a case of requiring a large driving performance TFT to a portion of the peripheral driving circuit. For example, it is considered that not only one of the pair of peripheral vertical driving circuits can be saved but also the present invention is advantageous when applied to organic EL or FET as the electro-optical apparatus other than LCD. Further, the dual gate structure is also advantageous in that it can be changed easily either to the top gate type or the bottom gate type by the selection of upper and lower gate portions and one of the upper and the lower gate portions can be used even when the other of them becomes not operable.

(D) Then, since the step is used as a seed for graphoepitaxial growing, and the single crystal silicon layer can be formed on the step by a cold film forming technique such as a catalyst CVD process (chemical vapor deposition using catalyst: at a substrate temperature of 200 to 800° C., particularly, 300 to 400° C.), a single crystal silicon layer can be formed uniformly at low temperature on the substrate. Accordingly, it is possible to use those substrates which are easily available at a reduced cost and having satisfactory physical properties such as glass substrates of relatively low distortion point or heat resistant organic substrates and, in addition, the size of the substrate can also be enlarged.

(E) Since annealing at a middle temperature for long time (about 600° C., for ten and several hours) as in the case of the solid phase growing and excimer laser annealing are no more required, the productivity is high and no expensive production facilities are required, making it possible to reduce the cost.

(F) In the graphoepitaxial growing, since a single crystal silicon layer having a wide range of P- or N-conduction type and high mobility can be obtained easily by controlling the gas compositional ratio, the heating temperature for the substrate and the cooling rate in the catalyst CVD or the like, $V_{th}$ (threshold value) can be controlled easily and high speed operation is possible by lowering the resistance.

(G) Further, when a group III or group V impurity element (for example, boron, phosphorus, antimony, arsenic, bismuth or aluminum) is doped in an appropriate amount separately from a doping gas upon forming the film of single crystal silicon by the catalyst CVD or the like, it is possible to optionally control the impurity species and/or concentration thereof, namely, the p-type/n-type conduction type and/or carrier concentration of the single crystal silicon layer.

BRIEF DESCRIPTION OF THE DRAWINGS

The drawings are numbered with a Figure number, followed by a parenthetical that refers to the method step shown by the figure. The parenthetical serves to eliminate unnecessary repetition. Different figures having identical parenthetical numbers represent separate embodiments of the invention.

FIGS. 1(1) to 1(3) are cross sectional views showing a manufacturing process of an LCD (Liquid Crystal Display Device) according to a first embodiment of the present invention in the order of steps;

FIGS. 2(4) to 2(6) are cross sectional views showing the manufacturing process of the LCD according to the first embodiment in the order of the steps;

FIGS. 3(7) to 3(9) are cross sectional views showing the manufacturing process of the LCD according to the first embodiment in the order of the steps;

FIGS. 4(10) to 4(12) are cross sectional views showing the manufacturing process of the LCD according to the first embodiment in the order of the steps;

FIGS. 5(13) to 5(15) are cross sectional views showing the manufacturing process of the LCD according to the first embodiment in the order of the steps;

FIGS. 6(16) to 6(18) are cross sectional views showing the manufacturing process of the LCD according to the first embodiment in the order of the steps;

FIG. 13 is a schematic constitutional view of the LCD in accordance with the first embodiment;

FIGS. 14(16) to 14(18) are cross sectional views showing a manufacturing process of an LCD according to a second embodiment of the present invention in the order of steps;

FIGS. 16(15) to 16(18) are cross sectional views showing the manufacturing process of the LCD according to the second embodiment in the order of the steps;

FIGS. 17A to 17C are cross sectional views for a main portion of an LCD in accordance with a third embodiment of the present invention;

FIGS. 18(1) to 18(3) are cross sectional views showing the manufacturing process of the LCD according to the third embodiment in the order of the steps;

FIGS. 19(4) to 19(6) are cross sectional views showing the manufacturing process of the LCD according to the third embodiment in the order of the steps;

FIGS. 21(11) to 21(14) are cross sectional views showing the manufacturing process of the LCD according to the third embodiment in the order of the steps;

FIGS. 22(3) to 22(5) are cross sectional views showing the manufacturing process of the LCD according to the third embodiment in the order of the steps;

FIGS. 24(10) to 24(13) are cross sectional views showing the manufacturing process of the LCD according to the third embodiment in the order of the steps;

FIGS. 26(6) to 26(7) are cross sectional views showing a manufacturing process of an LCD according to a fourth embodiment of the present invention in the order of steps;

FIGS. 28(11) and 28(12) are cross sectional views showing the manufacturing process of the LCD according to the fourth embodiment in the order of the steps;

FIGS. 29(5) and 29(6) are cross sectional views showing the manufacturing process of the LCD according to the fourth embodiment in the order of the steps;

FIGS. 30(7) to 30(9) are cross sectional views showing the manufacturing process of the LCD according to the fourth embodiment in the order of the steps;

FIGS. 31(10) to 31(12) are cross sectional views showing the manufacturing process of the LCD according to the fourth embodiment in the order of the steps;

FIG. 39 is an equivalent circuit diagram for TFT in the LCD in accordance with the sixth embodiment;

FIGS. 40A and 40B are cross sectional views for a main portion of TFT in an LCD in accordance with a seventh embodiment of the present invention;

FIG. 41 is a view showing combination of TFT in each of the sections in an LCD in accordance with an eighth embodiment of the present invention:

FIG. 42 is a view showing a combination of TFT in each of sections of the LCD in accordance with the eighth embodiment;

FIG. 43 is a view showing a combination of TFT in each of sections of the LCD in accordance with the eighth embodiment;

FIG. 44 is the view showing a combination of TFT in each of sections of an LCD in accordance with the eighth embodiment;

FIG. 45 is a view showing a combination of TFT in each of sections of the LCD in accordance with the eighth embodiment;

FIG. 46 is a view showing a combination of TFT in each of sections of the LCD in accordance with the eighth embodiment;

FIG. 47 is a view showing a combination of TFT in each of sections of the LCD in accordance with the eighth embodiment;

FIG. 48 is a view showing a combination of TFT in each of sections of the LCD in accordance with the eighth embodiment;

FIG. 49 is a view showing a combination of TFT in each of sections of the LCD in accordance with the eighth embodiment;

FIG. 51 is a view showing combination of TFT in each of sections of the LCD in accordance with the ninth embodiment:

DETAILED DESCRIPTION OF THE PREFERRED EMBODIMENTS

Figure 7:
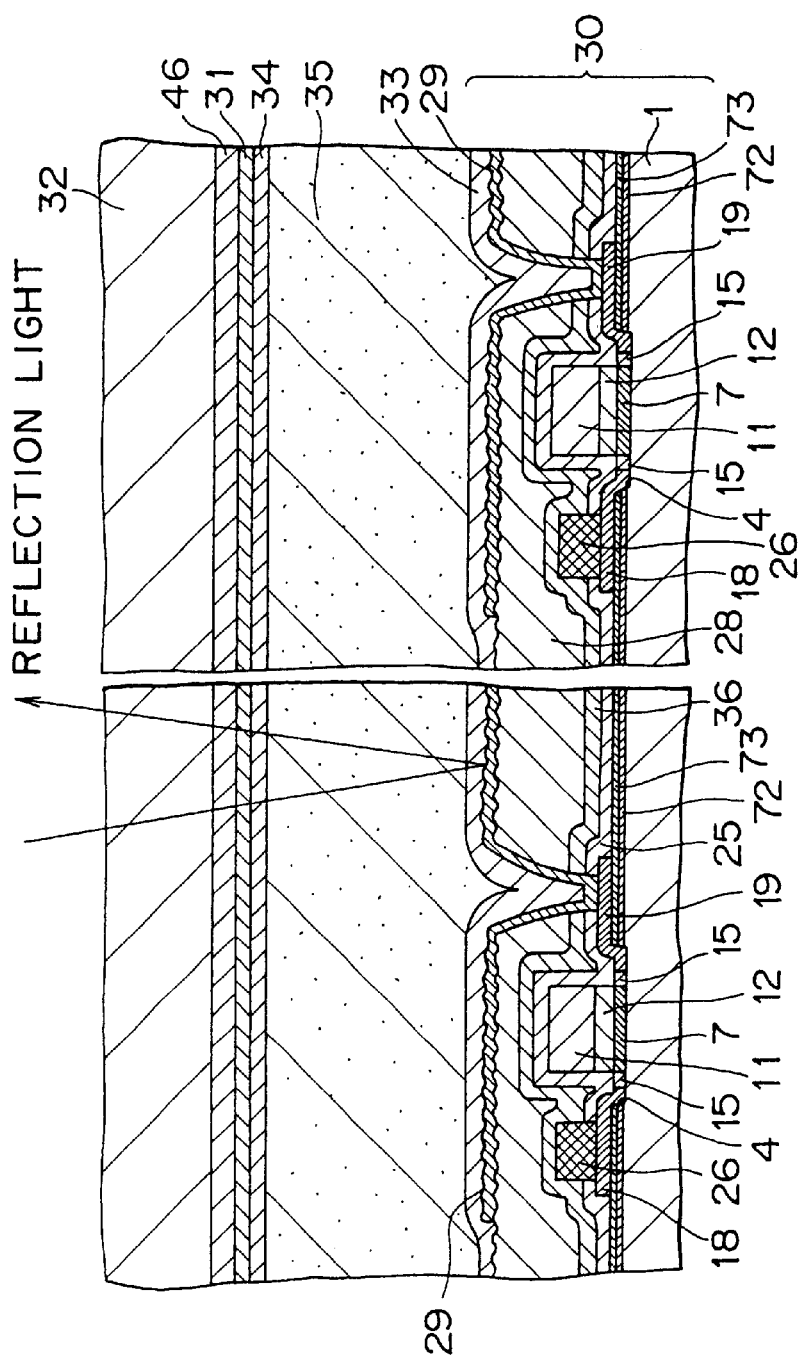
FIG. 7 is a cross sectional view for a main portion of the LCD in accordance with the first embodiment.

In the present invention, the step is preferably formed as a concave portion such that the lateral side in the cross section is orthogonal to the bottom face, or inclined at a bottom angle preferably of 90° or less to the lower end, on an insulation substrate or on a diffusion barrier formed thereon, for example, a film of silicon nitride (hereinafter referred to as SiN) (or on both of them), and the step is used as a seed upon graphoepitaxial growing of the single crystal silicon layer. The step is preferably formed along at least one side of a device region of the thin film transistor formed with a channel region, a source region and a drain region. Further, when a passive device, for example, a resistance is formed with the single crystal silicon layer, the step is preferably formed along at least one side of the device region to form the resistance.

In this case, the first thin film transistor such as the MOSTFT may be disposed within the concave portion of the substrate formed by the step, or it may be disposed on the substrate outside of the concave portion or both outside and inside thereof.

The step can be formed by dry etching such as reactive ion etching and the single crystal silicon layer can be formed by a catalyst CVD process (at a substrate temperature of about 200 to 800° C.). The substrate can be heated by a method of heating the entire substrate uniformly using an electric furnace or a lamp and, in addition, by a method of locally heating only the predetermined position by a light laser or electron beam.

When the single crystal silicon layer is formed by the catalyst CVD process, a gas comprising silicon hydride as the main ingredient is decomposed by being in contact with a catalyst heated to 800 to 2000° C. (lower than melting point) and the single crystal silicon layer can be deposited on the substrate.

In this case, it is possible to use a silane type gas such as monosilane, disilane, trisilane and tetrasilane as silicon hydride and use at least one material selected from the group consisting of tungsten, tungsten containing thorium oxide, molybdenum, platinum, palladium, silicon, alumina, metal-deposited ceramics and silicon carbide as the catalyst.

In the method according to the present invention, since an insulation substrate, particularly, a glass substrate of low distortion point or heat resistant organic substrate is used for the substrate, a single crystal silicon layer can be prepared on a large sized glass substrate (for example, 1 m² or more). Since the substrate temperature upon catalyst CVD is low as described above, glass having a distortion point as low as 470 to 670° C. can be used for the glass substrate. Such a substrate is less expensive, easily formed into a thin sheet and a rolled long glass plate can be prepared. Using the material, a single crystal silicon thin film can be prepared continuously or discontinuously by graphoepitaxial growing on the rolled long glass plate or heat resistant organic substrate by the method described above.

Since constituent elements tend to diffuse easily from the inside to the upper layer of the glass having a low distortion point, it is preferred to form a thin film of a diffusion barrier layer (for example, SiN: about 50 to 200 nm thickness) for suppressing the diffusion.

In the catalyst CVD process, if a doping gas such as $PH_3$ or $B_2H_6$ is mixed into a feed gas, it is possible to make the single crystal silicon layer into N-type or P-type to prepare nMOSTFT or pMOSTFT. Accordingly, cMOSTFT can also be prepared.

As described above, the single crystal silicon layer graphoepitaxially grown on the substrate can be applied to the channel region, source region and drain region of the dual gate type MOSTFT constituting at least a portion of the peripheral driving circuit, to control the impurity species and/or the concentration thereof in each of the regions.

The thin film transistor in the peripheral driving circuit section and the display section may constitute an n-channel type, p-channel type or complementary type insulated gate field effect transistor and it may comprise, for example, a set of complementary type and n-channel type, a set of complementary type and p-channel type or a set of complementary type, n-channel type and p-channel type. Further, at least a portion of the thin film transistor in the peripheral driving circuit section and/or the display section preferably has an LDD (Lightly Doped Drain) structure. The LDD structure may be disposed not only between the gate and the drain but also between the gate and the source, or between the gate and source and between the gate and drain (hereinafter referred to as a double LDD).

Particularly, the MOSTFT preferably constitutes a LDD type TFT of nMOS, pMOS or cMOS in the display section, and cMOS, nMOS, pMOS TFT or a combination thereof in the peripheral driving circuit section.

The MOSTFT may be disposed inside of the concave portion of the substrate and/or near the concave portion out of the concave portion of the substrate.

In this case, it is possible to form the step on one surface of the first substrate, form a single crystal, polycrystal or amorphous silicon layer on the substrate including the step, and the second thin film transistor may be constituted as a top gate type, bottom gate type or dual gate type having the single crystal, polycrystal or amorphous silicon layer as the channel region, the source region and the drain region, and having the gate portion above and/or below the channel region.

Also in this case, the same step as described above is formed as a concave portion such that the lateral side in the cross section is orthogonal to the bottom face or inclined at a bottom angle preferably of 90° or less toward the lower end, and the step is used as a seed upon graphoepitaxial growing of the single crystal silicon layer.

The second thin film transistor may be disposed at the inside and/or the outside of the concave portion of the substrate attributable to the step formed on the first substrate and/or a film formed thereon, and each of the regions of source, drain and channel may be formed by using the graphoepitaxially grown single crystal silicon layer like that the first thin film transistor.

Also in the second thin film transistor, like that described previously, the group III or group V impurity species and/or the concentration thereof of the single crystal, polycrystal or amorphous silicon layer may be controlled, and the step may be formed along at least one side of the device region of the second thin film transistor formed with the channel region, the source region and the drain region. Further, the lateral end of the gate electrode below the single crystal, polycrystal or amorphous silicon layer may be preferably trapezoidal. A diffusion barrier layer may be disposed between the first substrate and the single crystal, polycrystal or amorphous silicon layer.

The source or the drain electrode of the first and/or the second thin film transistor is preferably formed on the region including the step.

The first thin film transistor may be at least the dual gate type selected from the top gate type, the bottom gate type or the dual gate type having the gate portion above and/or below the channel region, and the switching device for switching the pixel electrode in the display section may be made as the top gate type, bottom gate type or dual gate type second thin film transistor.

In this case, the gate electrode disposed below the channel region may be formed of a heat resistant material or the upper gate electrode of the second thin film transistor and the gate electrode of the first thin film transistor may be formed of a common material.

In addition to the first thin film transistors, the peripheral driving circuit section may comprise top gate type, bottom gate type or dual gate type thin film transistors each using the polycrystal or amorphous silicon layer as the channel region and having a gate portion above and/or below the channel region, or diode, resistance, capacitance and inductance devices using the single crystal silicon layer, the polycrystal silicon layer or the amorphous silicon layer.

The thin film transistor in the peripheral driving circuit section and/or the display section may be constituted as a single gate or a multi-gate.

When the n- or p-channel type thin film transistor is a duel gate type in the peripheral driving circuit section and/or the display section, it is preferred to make the upper or lower gate electrode electrically open, or to apply an optional negative voltage (in a case of the n-channel type) or a positive voltage (in a case of the p-channel type) to operate as the bottom gate type or top gate type thin film transistor.

The thin film transistor in the peripheral driving circuit section may be an n-channel type, p-channel type or complementary type first thin film transistor, the thin film transistor in the display section is an n-channel type, p-channel type or complementary type when the polycrystal silicon layer is used for the channel region, an n-channel type, p-channel type or complementary type when the polycrystal silicon layer is used as the channel region, and an n-channel type, p-channel type or complementary type when the amorphous silicon layer is used as the channel region.

In the present invention, after the growing the single crystal silicon layer, an upper gate portion comprising the gate insulation film and the gate electrode may be formed on the single crystal silicon layer, and the group III or group V impurity element is introduced into the single crystal silicon layer using the upper gate portion as a mask to form the channel region, the source region and the drain region.

Further, when the second thin film transistor is the bottom gate type or the dual gate type, a lower gate electrode made of a heat resistant material may be disposed below the channel region and, after forming the gate insulation film on the gate electrode to form the lower gate portion, the second thin film transistor may be formed through the steps in common with those for the first thin film transistor including the process of forming the step. In this case, the upper gate electrode of the second thin film transistor and the gate electrode of the first thin film transistor can be formed with a common material.

Further, after forming the single crystal silicon layer on the lower gate portion, the group III or group V impurity element can be introduced into the single crystal layer to form the source and drain regions and then an activating treatment can be applied.

Further, after forming the single crystal silicon layer, each of the source and drain regions of the first and second thin film transistors can be formed by ion implantation of the impurity element using a resist as a mask, the activating treatment is applied after the ion implantation and, after forming the gate insulation film, the upper gate electrode of the first thin film transistor and, if required, the upper gate electrode of the second thin film transistor may be formed.

If the second thin film transistor is the top gate type, each of the source and drain regions of the first and second thin film transistors may be formed by ion implantation of the impurity element using a resist as a mask after forming the single crystal silicon layer, the activating treatment may be applied after the ion implantation and, subsequently, each of the gate portions comprising the gate insulation film and the gate electrode of the first and second thin film transistors can be formed.

Alternatively, when the second thin film transistor is the top gate type, each of the gate insulation films and each of the gate electrodes made of the heat resistant material of the first and second thin film transistors are formed to form each of the gate portions after forming the single crystal silicon layer, each of the source and drain regions of the first and second thin film transistors are formed by ion implantation of the impurity element using the gate portions and the resist as a mask, and the activating treatment may be applied after the ion implantation.

Further, ion implantation for forming the source region and the drain region can be conducted by leaving the resist mask used upon forming the LDD structure and using the resist mask covering the same.

Further, the substrate may be optically transparent or not transparent and reflection type or transmission type display pixel electrodes may be disposed.

In a case where the display section has a laminate structure of the pixel electrode and a color filter layer, preparation of the color filter on the display array section can provide improvement for the aperture ratio of the display panel and brightness, as well as attain the reduction of cost by saving the color filter substrate and improvement of the productivity.

In this case, when the pixel electrode is a reflection electrode, a concave/convex portion is formed to the resin film for providing optimum reflection characteristics and view angle characteristics, on which pixel electrodes are disposed. When the pixel electrode is a transparent electrode, the surface is flattened by a transparent flattening film, and pixel electrodes are preferably disposed on the flattened surface.

The display section may be constituted so as to conduct light emission or light control by MOS TFT driving and may be constituted, for example, as a liquid crystal display device (LCD), an electro-luminescent display device (EL), or an electric field emission type display device (FED), a light emission polymer display device (LEPD) or a light emission diode display device (LED). In this case, a plurality of the pixel electrodes may be arranged in a matrix in the display section and the switching element may be connected to each of the pixel electrodes.

Then, the present invention is to be explained more in details with reference to preferred embodiments.

[First Embodiment]

FIG. 1 to FIG. 12 show a first embodiment of the present invention.

This embodiment concerns an active matrix reflection type liquid crystal display device (LCD) formed by cold graphoepitaxial growing of a single crystal silicon layer using a catalyst CVD process from a step (concave portion) disposed on a heat resistant substrate as a seed and constituting a dual gate type MOSTET to a peripheral driving circuit section using the same. An overall layout of the reflection type LCD is at first explained with reference to FIG. 10 to FIG. 12.

Figure 11:
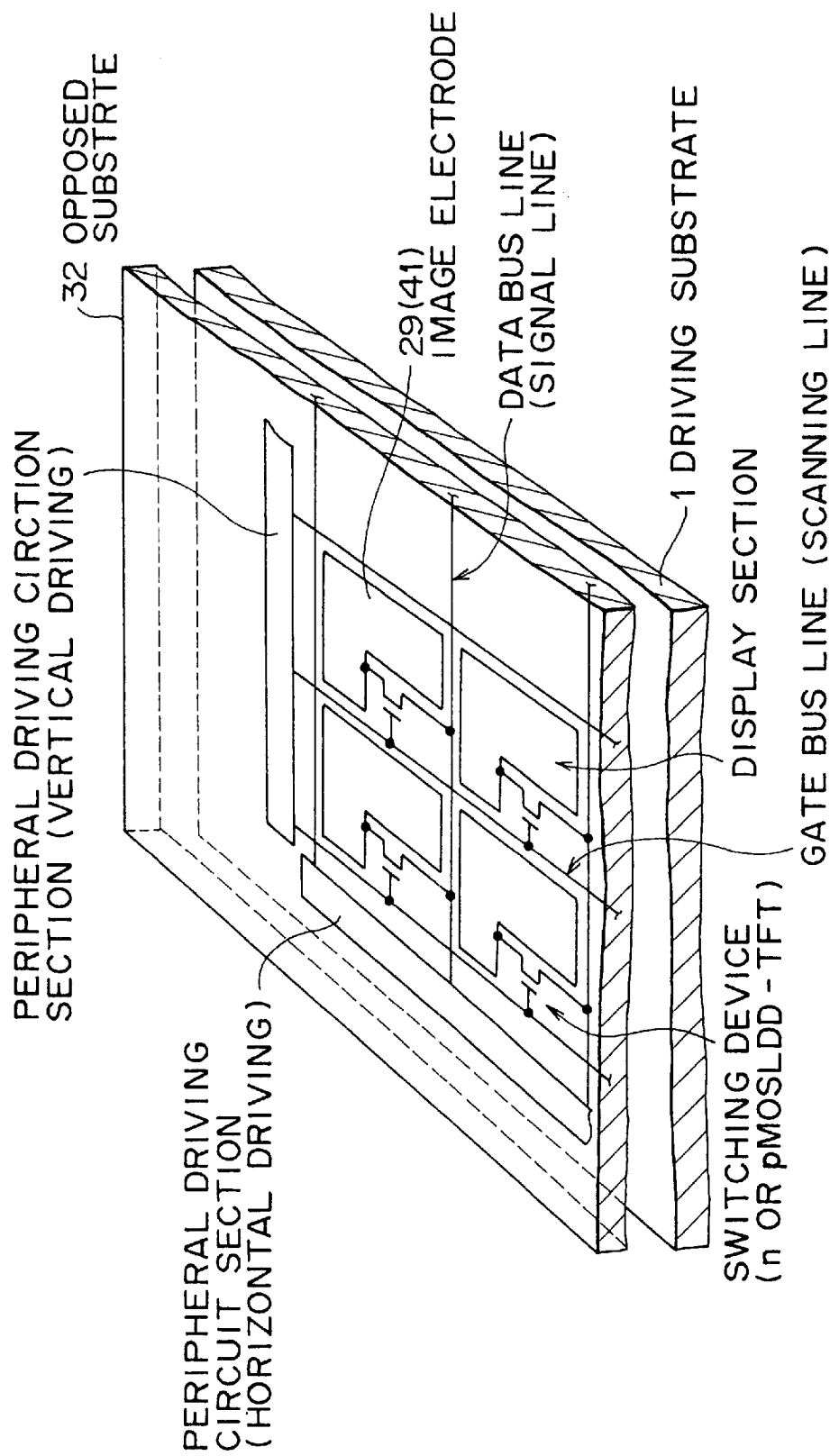
FIG. 11 is a perspective view showing a schematic layout for the entire LCD in accordance with the first embodiment of the present invention.

As shown in FIG. 11, the active matrix reflection type LCD comprises a flat panel structure in which a main substrate 1 (constituting an active matrix substrate) and an opposing substrate 32 are bonded by way of a spacer (not illustrated) and a liquid crystal (not illustrated here) sealed between both of the substrates 1 and 32. On the surface of the main substrate 1 are disposed a display section comprising pixel electrodes 29 (or 41) disposed in matrix and switching devices for driving the pixel electrodes, and a peripheral driving circuit section connected with the display section.

The switching device in the display section are nMOS, pMOS or cMOS top gate type MOSTFT of an LDD structure according to the present invention. Further, a dual gate type MOSTFT of cMOS, nMOS or pMOSTFT, or a combination thereof according to the present invention are formed as circuit device also in the peripheral driving circuit sections. Further, one of the peripheral driving circuit sections is a horizontal driving circuit for supplying data signals and driving a TFT of each pixel on every horizontal line, while the other of the peripheral driving circuit sections is a vertical driving circuit for driving a TFT of each pixel on every scanning line and, usually, they are disposed to both sides of the display section respectively. The driving circuits may be constituted either as a spot sequential analog system or a linear sequential digital system.

Figure 12:
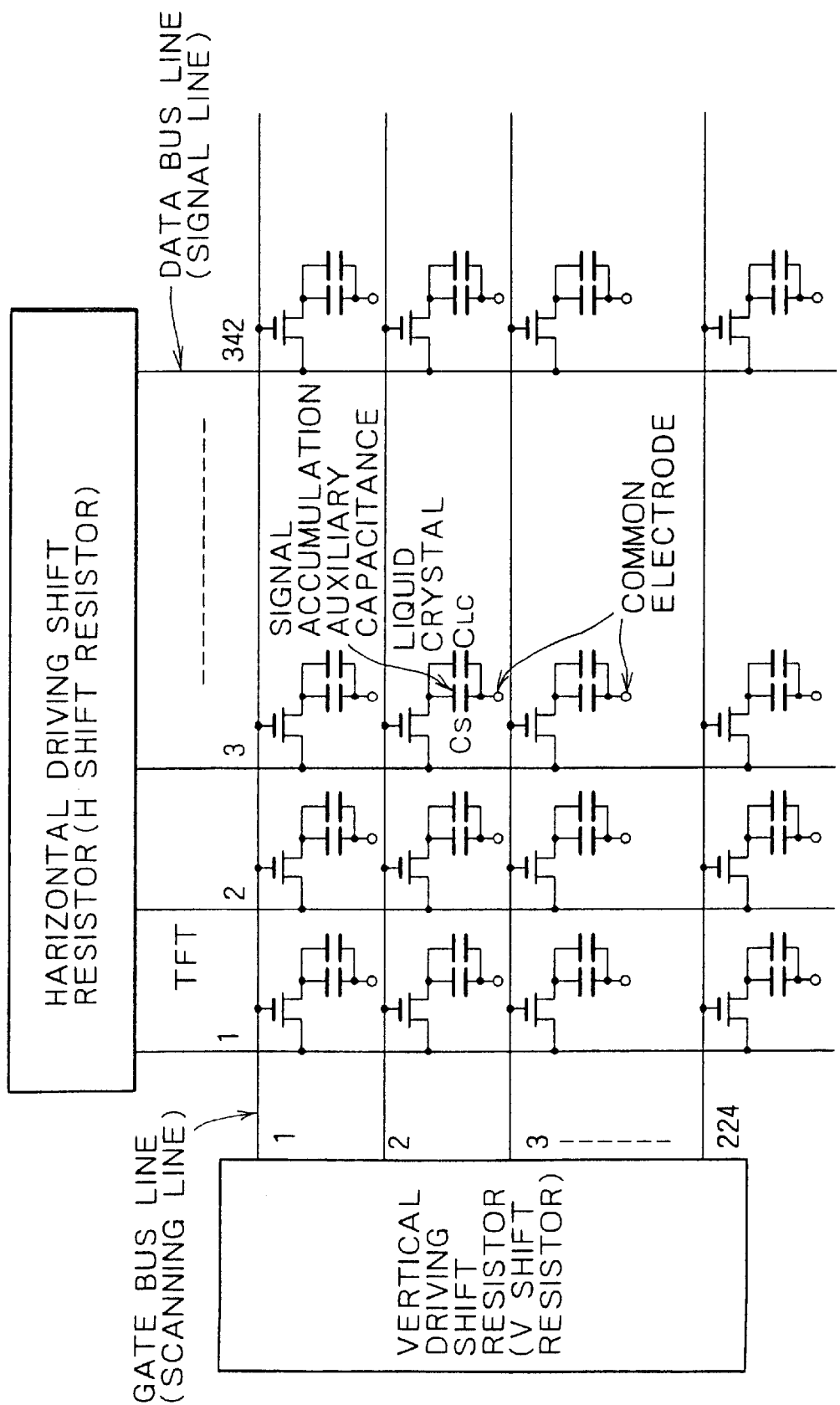
FIG. 12 is a equivalent circuit diagram of the LCD in accordance with the first embodiment.

As shown in FIG. 12, the TFT is located at an intersection between a gate bus line and a data bus line orthogonal to each other and image information is written by way of TFT into liquid crystal capacitance ($C_{LC}$) and electric charges are kept until arrival of the succeeding information. In this case, since the charges can not be kept sufficiently merely by a channel resistance of TFT, an accumulation capacitance (auxiliary capacitance) ($C_S$) is added in parallel with the liquid crystal capacitance for compensating the same thereby compensating lowering of a liquid crystal voltage caused by leak current. In the TFT for the LCD, required performance is different between the characteristics of the TFT used for the pixel section (display section) and characteristics of the TFT used for the peripheral driving circuits, and it is particularly important to control OFF current and ensure ON current for the TFT in the pixel section. Accordingly, TFT of the LDD structure to be described later is disposed in the display section, to attain a structure in which a lesser electric field is applied between the gate and the drain thereby decreasing an effective electric field applied on the channel region, reducing the OFF current and restricting the change of characteristics. However, since this makes the process complicated, enlarges the device size and lowers the ON current, an optimal design is necessary so as to conform the respective purposes of use.

Liquid crystals usable herein can include those liquid crystals for various kinds of modes such as TN liquid crystal (nematic liquid crystal used for TN mode of active matrix driving, STN (super twisted nematic), GH (guest-host), PC (phase-change), FLC (ferroelectric liquid crystal), AFLC (antiferroelectric liquid crystal), and PDLC (polymer dispersed type liquid crystal).

Further, outline for the circuit system of the peripheral driving circuit and the driving method will be explained with reference to FIG. 13. The driving circuit is partitioned into a gate side driving circuit and a data side driving circuit and both of the gate side and the data side have to be constituted as a shift register. Generally, the shift register includes those using both of pMOSTFT and nMOSTFT (so-called CMOS circuit) or those using only one of MOSTFT(s), and cMOSTFT or CMOS circuit is ordinary in view of the operation speed, reliability and electric power consumption.

The scanning side driving circuit comprises a shift register and a buffer, which supplies pulses in synchronization with a horizontal scanning period from the shift register to each of the lines. On the other hand, the data side driving circuit includes two driving methods of a spot sequential system and a line sequential system. In the illustrated spot sequential system, the circuit structure is relatively simple and display signal is directly written through an analog switch to each of pixels under control by the shift register. The signals are written into each of pixels successively in one horizontal scanning period (R, G and B in the figure schematically show pixels on every color).

Then, the active matrix reflection type LCD according to this embodiment is to be explained in accordance with manufacturing steps with reference to FIG. 1 to FIG. 10. In FIG. 1 to FIG. 6, the left part shows manufacturing steps for the display section while the right part shows manufacturing steps for the peripheral driving section in each of the figures.

At first, as shown in FIG. 1(1), a sputtered film 71 (500–600 nm thickness) of a molybdenum/tantalum (Mo—Ta) alloy is formed on one main surface of an insulation substrate, such as made of borosilicate glass, quartz glass and transparent crystal glass.

Then, as shown in FIG. 1(2), a photoresist 70 is formed in a predetermined pattern and the Mo—Ta film 71 is taper-etched using the pattern as a mask to form a gate electrode 71 in which a lateral end 71a is moderately inclined in a trapezoidal shape at an angle of 20 to 45°.

Then, as shown in FIG. 1(3), after removing the photoresist 70, a gate insulation film is formed by laminating an SiN film (about 100 nm thickness) 72 and an $SiO_2$ film (about 200 nm thickness) 73 in this order by plasma CVD process or the like on the substrate 1 containing the molybdenum-tantalum alloy film 71.

Then, as shown in FIG. 2(4), a photoresist 2 is formed in a predetermined pattern at least in a TFT forming region and, for example, $F^+$ ions 3 of $CF_4$ plasmas are irradiated using the pattern as a mask, and a plurality of steps 4 are formed in an appropriate shape and a size to the gate insulation film (further also to the substrate 1) by generally used photolithography and etching (photoetching) such as reactive ion etching (RIE).

In this case, as the insulation substrate 1, highly heat resistant substrates (8–12 inch$\phi$, 700–800 $\mu$m thick) such as made of quartz glass, transparent crystal glass or ceramic (not transparent ceramic substrate or less transparent crystal glass can not be used in a transmission type LCD to be described later) can be used as the insulation substrate 1. Further, the step 4 forms a seed upon graphoepitaxial growing of single crystal silicon to be described later, which may have a depth d of 0.3–0.4 μm, a width w of 2–10 μm and a length (orthogonal to the drawing) of 10–20 μm with an angle formed between the bottom and the lateral side (bottom angle) being a right angle. An SiN film (for example, of 50–200 μm thickness) and, if necessary, a silicon oxide film (hereinafter referred to as $SiO_2$ film) (for instance of about 100 nm thickness) may be previously formed continuously on the surface of the substrate 1 for preventing diffusion of Na ions form the glass substrate.

Then, as shown in FIG. 2(5), after removing the photoresist 2, a single crystal silicon film 7 is graphoepitaxially grown over the entire surface including the step 4 to a thickness of several μm to 0.005 μm (for example, 0.2 μm) by a catalyst CVD process (at a substrate temperature of 200 to 800° C.) as also disclosed in Japanese Published Unexamined Patent Application No. Sho 63-40314. In this case, since the lateral end 71a of the underlying gate electrode 71 forms a moderate slope, the step 4 does not hinder the epitaxial growing and the single crystal silicon layer 7 grows with no disconnection. If the substrate 1 is made of borosilicate glass, the substrate temperature is set to 200–800° C. and if it is made of a quartz glass, crystal glass or ceramic substrate, the substrate temperature is set to 600–800° C.

Figure 8:
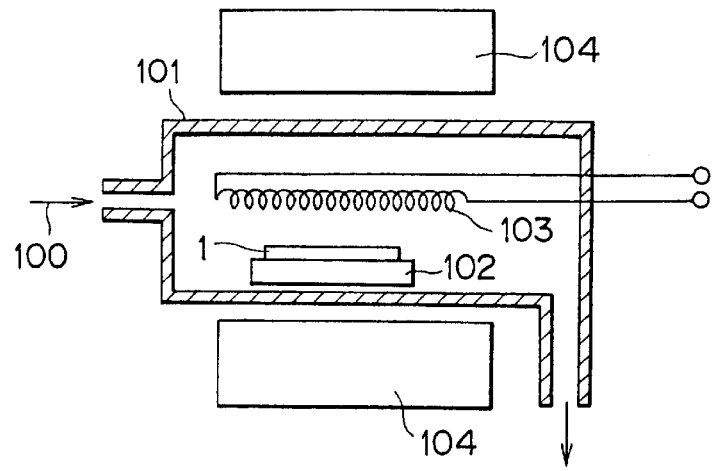
FIG. 8 is a schematic view for a catalyst CVD apparatus used for the manufacture of the LCD in accordance with the first embodiment.

In this case, the catalyst CVD may be carried out using an apparatus shown in FIG. 8. According to this catalyst CVD apparatus, a silicon hydride (for example, monosilane or disilane) gas 100 (and, if necessary, doping gas such as $B_2H_6$, $PH_6$ or $AsH_3$) is introduced from a supply conduit to a deposition chamber 101. At the inside of the deposition chamber 101, are disposed a suscepter 102 for supporting the substrate 1, and a coiled catalyst 103 opposed to the suscepter. Then, the substrate 1 is heated by an external heating means 4 (for example, electric heating means) and the catalyst 103 is heated, for example, in the form of a resistor wire to a temperature lower than the melting point (particularly, at 800–2000° C. and about 1700° C. in the case of tungsten) activation.

In the deposition chamber 101, the atmosphere is replaced from nitrogen to hydrogen (for about 15 to 20 min) and the temperature is elevated to about 200–800° C., by which the silane gas is decomposed catalytically being in contact with the catalyst 103 and deposited on the substrate 1 kept at a low temperature (for example, 300° C.). The deposition time is determined based on the thickness of the epitaxial growing layer to be grown. After the completion of the growing, the temperature is lowered, hydrogen is replaced with nitrogen and the substrate 1 is taken out. As described above, since silicon atoms or groups of atoms at a high energy are formed by the catalytic reaction or thermal decomposing reaction by the catalyst 103 and they are deposited on the step 4 as the seed, the single crystal silicon layer can be deposited in a temperature region much lower than the depositable temperature in the usual thermal or plasma CVD process.

The substrate 1 can be heated by a method of uniformly heating the entire substrate using an electric furnace or the like and also can be heated by a method of locally heating only the predetermined position, for example, only the TFT forming region by an optical laser or electron beam.

Figure 9A:
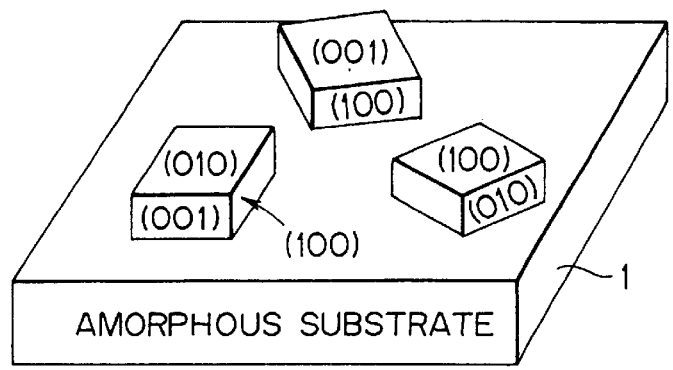
FIGS. 9A and 9B are schematic perspective views for explaining the state of growing silicon crystals on an amorphous substrate.
Figure 9B:
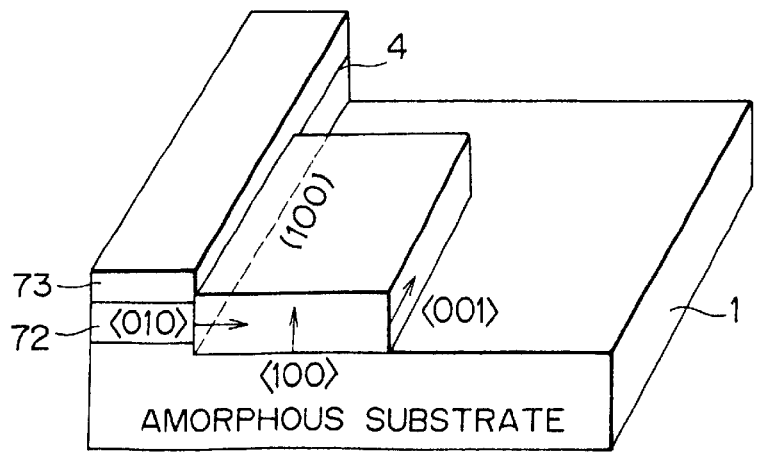
Figure 10A:
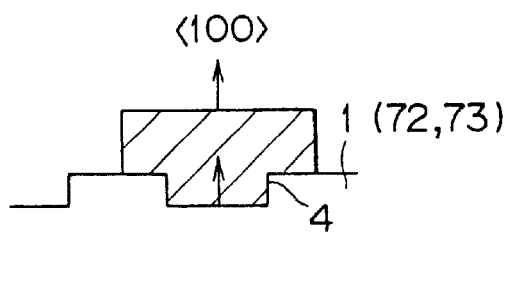
FIGS. 10A to 10F are schematic cross sectional views showing various shapes of steps and direction of crystallization in graphoepitaxial growing.
Figure 10B:
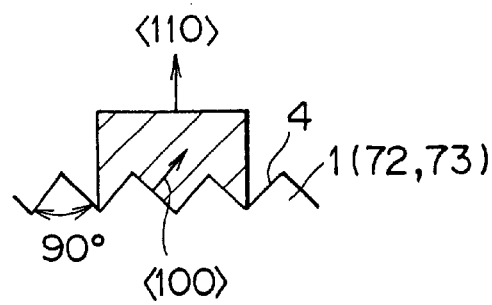
Figure 10C:
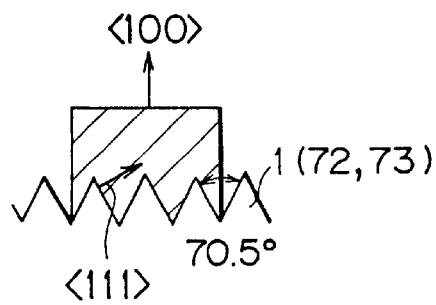
Figure 10D:
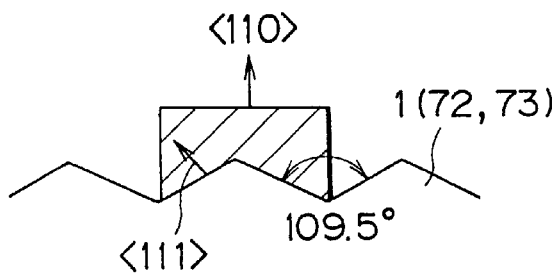
Figure 10E:
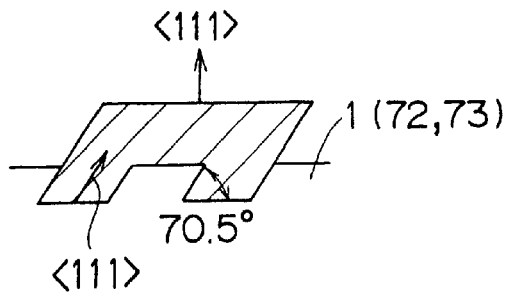
Figure 10F:
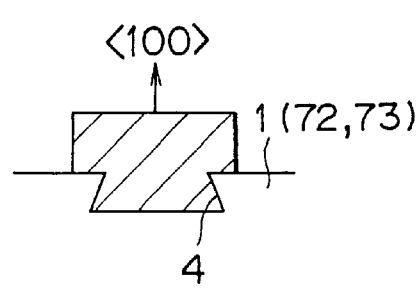

In the single crystal silicon layer 7 deposited as described above, face, (100) is epitaxially grown on the substrate, which is formed by the known phenomenon referred to as graphoepitaxial growing. As shown in FIGS. 9A and 9B, when a vertical wall such as the step described above is formed on the amorphous substrate (glass) 1 as shown in FIGS. 9A and 9B, on which an epitaxial growing layer is formed, those having random face directions shown in FIG. 9A are put to crystal growing with face, (100) being along the surface of the step 4 as shown in FIG. 9B. The size of the single crystal grain increases in proportion with temperature and time, and the distance of the step has to be shortened when the temperature and time are lowered and shortened. Further, by changing the shape of the step variously as shown in FIGS. 10A to 10F, the direction of crystallization of the growing layer can be controlled. When MOS transistors are prepared face, (100) is adopted most generally. In summary, for the sectional shape of the step 4, the angle at the corner of the bottom (bottom angle) may be of a right angle, or it may be inclined inwardly or outwardly from the upper end to the lower end, so long as it gives a face in a predetermined direction capable of facilitating crystal growth. The bottom angle of the step 4 is preferably a right angle or less and the corner at the bottom preferably has a slight radius of curvature.

After depositing the single crystal silicon layer 7 on the substrate by the catalyst CVD process and the graphoepitaxial growing, a dual gate type MOSTFT having the single crystal silicon layer 7 as a channel region is prepared in the peripheral driving circuit section, while the top gate type MOSTFT in the display section, respectively.

At first, since the impurity concentration in the single crystal silicon 7 formed by graphoepitaxial growing varies, the specific resistivity is controlled by doping a p-type carrier impurity, for example, boron ions over the entire surface by an appropriate amount. Further, N-type carrier impurities are doped selectively only in the pMOSTFT forming region to form an N-type well. For example, the specific resistivity is controlled by masking the p-channel TFT portion with a photoresist (not illustrated) and doping p-type impurities (for example, $B^+$) at a dose of $2.7 \times 10^{11}$ atoms/cm$^2$ under 10 kV. Further, as shown in FIG. 2(6), for controlling the impurity concentration in the MOSTFT forming region, the nMOSTFT portion is masked by a photoresist 60 and N type impurity ions (for example, $P^+$) 65 are doped at a dose of $1 \times 10^{11}$ atoms/cm$^2$ under 10 kV, to form an N-type well 7A.

Then, as shown in FIG. 3(7), $SiO_2$ (about 200 nm thickness) and SiN (about 100 nm thickness) are formed in this order successively over the entire surface of the single crystal silicon layer 7 by way of plasma CVD, high density plasma CVD or catalyst plasma CVD, to form a gate insulation film 8, and a sputtered film 9 (500–600 nm thickness) of molybdenum-tantalum (Mo—Ta) alloy is further formed.

Then, as shown in FIG. 3(8), a photoresist pattern 10 is formed in the step region (concave portion) of the TFT portion in the display region and outside of the step region (concave portion ) of the TFT portion in the peripheral driving region by the generally used photolithography, a gate electrode 11 of an Mo—Ta alloy and a gate insulation film (SiN/$SiO_2$) 12 are formed to expose the single crystal silicon 7. The (Mo—Ta) alloy film 9 is treated by an acidic etching solution, and SiN is treated by plasma etching of a $CF_4$ gas, and $SiO_2$ is treated by a hydrofluoric acid etching solution.

Then, as shown in FIG. 3(9), the entire portion for nMOS and pMOSTFT in the peripheral driving regions and a gate portion of nMOSTFT in the display region are covered with a photoresist 13, and phosphorous ions 14 are doped to an exposed nMOSTFT source/drain region, for example, at a dose of $5 \times 10^{13}$ atoms/cm$^2$ under 20 kV (ion implantation), to form an LDD portion 15 comprising the N$^-$ type layer in self-alignment.

Then, as shown in FIG. 4(10), the entire pMOSTFT in the peripheral driving region, the gate portion of the nMOSTFT in the peripheral driving region and the gate portion of the nMOSTFT and the LDD portion in the display region are covered with a photoresist 16, and phosphorus or arsenic ions 17 are doped (ion implanted) to the exposed region, for example, at a dosage of $5 \times 10^{15}$ atoms/cm$^2$ under 20 kV, to form a source portion 18 and a drain portion 19 comprising the nMOSTFT N$^+$-type layer and the LDD portion 15 are formed.

Then, as shown in FIG. 4(11), the entire portion of the nMOSTFT in the peripheral driving region and the nMOSTFT and the gate portion of the pMOSTFT in the display region are covered by a photoresist 20, and boron ions 21 are doped (ion implanted) to the exposed region, for example, at a dose of $5 \times 10^{15}$ atoms/cm$^2$ under 10 kV, to form a source portion 22 and a drain portion 23 in the p$^+$ layer of pMOSTFT. In the case of the MOS peripheral driving circuit, this operation is not necessary since the pMOSTFT is not present in the case of the nMOS driving circuit.

Then, as shown in FIG. 4(12), for making active device portions such as TFT and diode and passive device portions such as resistance and inductance into islands, a photoresist 24 is disposed and the single crystal silicon thin layer in the peripheral driving region and the display region are entirely eliminated except for the active device portions and passive device portions by generally used photolithography and etching technique. The etching solution is a hydrofluoric acid type solution.

Then, as shown in FIG. 5(13), an SiO$_2$ film (200 nm thickness) and a phosphor silicate glass (PSG) film (about 300 nm thickness) are formed continuously in this order over the entire surface, for example, by plasma CVD, density plasma CVD and catalyst CVD to form a protection film 25.

Then, the single crystal silicon layer is activated in this state. In the activation, annealing condition by halogen lamp or the like is about at 1000° C. for about 10 sec and a gate electrode material enduring the condition is necessary. High melting Mo—Ta alloy is suitable to this purpose. Accordingly, the gate electrode material can be disposed not only to the gate portion but also extending over a wide range as wirings. Expensive excimer annealing is not used in this embodiment. However, if it is used, overlap scanning for the entire surface, or for 90% or more selective only for the active device portion and the passive device portion at XeCl (308 nm wavelength) is preferred for the condition.

Then, as shown in FIG. 5(14), contact holes are opened for the entire source/drain portions of TFT in the peripheral driving circuit and for the source portion of the display TFT by the generally used photolithography and etching technique.

Then, a sputtered film of aluminum or aluminum alloy, for example, 1% Si incorporated aluminum or 1–2% copper incorporated aluminum, or copper is formed over the entire surface to 500–600 nm thickness, to form source electrodes 26 for the entire TFT in the peripheral driving circuit and the display section, and drain electrodes 27 in the peripheral driving circuit and, at the same time, data lines and gate lines are formed. Subsequently, sintering is applied in a forming gas (N$_2$+H$_2$) at about 400° C./1 h.

Then, as shown in FIG. 5(15), an insulation film 36 comprising a PSG film (about 300 nm thickness) and an SiN film (about 300 nm thickness) is formed over the entire surface by using, for example, plasma CVD, high density plasma CVD catalyst CVD process. Then, a contact hole is opened for the drain portion of the display TFT. There is no requirement for removing SiO$_2$, PSG and SiN films in the pixel section.

As the basic requirements for the reflection type liquid crystal display device, both functions of reflecting the incident light to the inside of the liquid crystal panel and a function of scattering the same have to be satisfied together. This is because the direction of an observer relative to the display is substantially determined, where as the direction of an incident light can not be determined definitely. Therefore, the reflection plate has to be designed while assuming that spot optical sources are present in optional directions. Then, as shown in FIG. 6(16), a light sensitive resin film 28 of 2 to 3 μm thickness is formed over the entire surface, for example, by spin coating and, as shown in FIG. 6(17), a concave/convex pattern for obtaining optimal characteristics and view angle characteristics is formed at least to the pixel section by the generally used photolithography and etching technique, and caused to reflow to form a lower portion for the reflection surface comprising a concave/convex roughened surface 28A. At the same time, contact resin hole is opened for the drain portion of the display TFT.

Then, as shown in FIG. 6(18), a sputtered film such as of aluminum or 1% Si-incorporated aluminum is formed over the entire surface to a thickness of 400 to 500 nm, and an aluminum film or the like other than the pixel portion is eliminated by the generally used photolithography and etching technique to form a concave/convex reflection portion 29 such as made of aluminum in contiguous with the drain portion 19 of the display TFT. This is used as a pixel electrode for display. Subsequently, it is sintered at about 300° C./1 h in a forming gas to make the contact intact. Further, silver or silver alloy may also be used instead of aluminum series material in order to improve the reflectivity.

As described above, the single crystal silicon layer 7 is formed by the catalyst CVD process using the step 4 as the seed for the cold graphoepitaxial growing, and a display section-peripheral driving section integration type active matrix substrate 30 can be manufactured in which top gate type nMOSLDD-TFT and CMOS circuits constituted by dual gate type pMOSTFT and pMOSTFT are prepared into the display section and the peripheral driving circuit section, respectively, using the single crystal silicon layer 7.

Then, a method of manufacturing the reflection type liquid crystal display device (LCD) using the active matrix substrate (driving substrate) 30 is to be explained with reference to FIG. 7. In the succeeding portion of this text, the active matrix substrate is referred to as a TFT substrate.

In a case of manufacturing the LCD liquid crystal cell by both face assembling (suitable to medium/large size liquid crystal panel of 2 inch size or greater), polyimide orientation films 33, 34 are formed on device forming surfaces of the TFT substrate 30 and the opposing substrate 32 provided with an entirely solid ITO (indium thin oxide) electrode 31. The polyimide orientation film is formed at 50 to 100 nm thickness, for example, by roll coating or spin coating and cured at 180° C./2 h.

Then, the TFT substrate 30 and the opposing substrate 32 are subjected to rubbing or light orientation. A rubbing buff material includes cotton or rayon and cotton is more stable in view of buffing residues (dusts) or retardation. The light orientation is a technique of orienting liquid crystal molecules by contactless linear polarized UV-ray irradiation. Referring to the orientation, a polymeric oriented film can be formed by obliquely applying polarized or non-polarized light in addition to rubbing (such polymeric compound can include, for example, polymethyl methacrylate polymers having azobenzene).

After cleaning, a common agent is coated on the TFT substrate 30, while a sealing agent is coated on the opposing substrate 32. For removing rubbing buff residues, cleaning is applied with water or IPA (isopropyl alcohol). The common agent may be an acrylic, epoxy acrylate or epoxy type adhesive containing a conductive filler and the sealing agent may be an acrylic, epoxy acrylate or epoxy type adhesive. Any of heat curing, UV-radiation curing and UV radiation curing+heat curing may be used, and UV-ray radiation curing+heat curing type is preferred in view of the alignment accuracy and operability.

Then, a spacer for obtaining a predetermined gap is scattered on the opposing substrate 32, which is stacked at a predetermined position with the TFT substrate 30. After aligning an alignment mark on the opposing substrate 32 and an alignment mark on the TFT substrate 30, accurately, the seal agent is cured provisionally by UV ray irradiation and, subsequently, they are heat cured collectively.

Then, scribe breaking is applied and a unitary liquid crystal panel comprising the TFT substrate 30 and the opposing substrate 32 stacked to each other is prepared.

Then, liquid crystals 35 are cast into a gap between the substrates 30 and 32, a casting port is sealed with a UV-ray adhesive and then IPA cleaning is applied. Any kind of liquid crystals may be used and, for example, a high speed responsive TN (twisted nematic) mode using nematic liquid crystals is generally used.

Then, heating/quenching treatment is applied to orient the liquid crystals 35.

Then, flexible wirings are connected by hot press bonding of an anisotropic conductive film to a panel electrode lead-out portion of the TFT substrate 30 and, further, a polarization plate is appended to the opposing substrate 32.

Further, in a case of a single face assembling of a liquid crystal panel (suitable to a small sized liquid crystal panel of 2 inch size or less), polyimide orientation 33, 34 are formed on the device forming surfaces of the TFT substrate 30 and the opposing substrate 32, both of the substrates are put to rubbing, or to orientation by contactless linear polarized UV-rays.

Then, the TFT substrate 30 and the opposing substrate 32 are divided into unitary pieces by dicing or scribe breaking and washed with water or IPA. A common agent is coated on the TFT substrate 30, while a spacer-containing sealing agent is coated on the opposing substrate, and both of the substrates are stacked. Subsequent processes are according to those described previously.

In the reflection type LCD described above, the opposing substrate 32 is a CF (color filter) substrate, in which a color filter layer 46 is disposed below the ITO electrode 31. An incident light from the opposing substrate 32 is reflected efficiently on the reflection film 29 and emitted from the opposing substrate 32.

On the other hand, in a case of using a TFT substrate of an ON chip color filter (OCCF) structure in which a color filter is disposed to the TFT substrate 30 other than the substrate structure as shown in FIG. 7 as the TFT substrate 30, the opposing substrate 32 is entirely applied with an ITO electrode (or entirely applied with an ITO electrode having a black mask).

When an auxiliary capacitance $C_S$ shown in FIG. 12 is incorporated into the pixel section, a dielectric layer disposed on the substrate 1 (not illustrated) may be connected with the drain region 19 of the single crystal silicon.

As has been described above according to this embodiment, the following remarkable functions and effects can be obtained.

(a) Since a single crystal silicon layer 7 of high electron mobility of 540 $cm^2$/v.sec or higher can be obtained by forming a predetermined shape/size of step 4 on the substrate 1, and conducting cold graphoepitaxial growing (at a relatively low heating temperature during growing of 200~800° C., preferably, 300~400° C.) using the corner at the bottom of the step as a seed, it is possible to manufacture an LCD incorporated with a high performance driver.

(b) Since the single crystal silicon layer shows high electron and hole mobility equal with that of the single crystal silicon substrate compared with extent amorphous silicon layers or polycrystal silicon layers, the single crystal silicon dual gate type MOSTFT obtained thereby can constitute an integrated structure having a display section comprising nMOS, pMOS or cMOSTFT having an LDD structure of high switching characteristics and low leak current and a peripheral driving circuit section comprising cMOS, nMOS or pMOSTFT, or a combination thereof of high driving performance, to attain a display panel of high image quality, high fineness, narrow frame edge, large area screen and high efficiency. Since the single crystal silicon thin film 7 has a sufficiently high hole mobility, it is possible to manufacture a peripheral driving circuit capable of driving electrons and holes individually or in combination of them, and can provide a panel integrating them with nMOS, pMOS or cMOS display TFT of an LDD structure. Further, in a case of a small-medium sized panel, it is possible to save one of the pair of peripheral vertical driving circuits.

(c) Particularly, since the dual gate type MOSTFT is used in the peripheral driving circuit, cMOS, nMOS or pMOSTFT having a driving performance 1.5 to 2 times as high as that of the single gate type TFT can be constituted to form a higher performance and larger driving performance TFT compared with the single gate type TFT, and it is suitable particularly to a case of requiring TFT of a large driving performance to a portion of the peripheral driving circuit. Further, the dual gate structure can be changed easily to the top gate type or the bottom gate type by the selection of the upper or lower gate portion and, in addition, one of upper and lower gate portions can be used advantageously even if the other of them becomes not operable.

(d) Then, since the temperature for the heat treatment upon epitaxial silicon growing can be 800° C. or lower, the single crystal silicon film 7 can be formed uniformly on the insulation substrate at a relatively low temperature (for example, 300~400° C. or lower). As the substrate, there can be optionally selected, for example, quartz glass, crystal glass and ceramic substrates, as well as those materials for substrates having low distortion point, available at reduced cost and having good physical properties such as borosilicate glass (further, heat resistant organic substrate), and the size of the substrate can be enlarged.

(e) Since annealing at medium temperature for a long time as in a case of a solid phase growing process or excimer laser annealing is no more necessary, the productivity is high, and expensive production facilities are not required, making it possible to reduce the cost.

(f) In the graphoepitaxial growing, since it is possible to easily obtain a single crystal silicon layer having a wide range of conduction types such as N-type or P-type and having high mobility by controlling the condition such as gas compositional ratio in the catalyst CVD, shape of the step, heating temperature for the substrate and concentration of N-type or P-type carrier impurity to be added, and $V_{th}$ (threshold value) can be controlled easily and high speed operation is possible by lowering the resistance.

(g) When a color filter is prepared in the display array section, it is possible to attain improvement for the aperture ratio of the display panel, and the brightness, and cost down by saving the color filter substrate or improvement in the productivity.

Second Embodiment

The second embodiment of the present invention is to be explained with reference to FIG. 14 to FIG. 16.

When compared with the first embodiment described previously, this embodiment has the same kind of the top gate type MOSTFT in the display section and the dual gate type MOSTFT in the peripheral driving circuit section, but this embodiment concerns a transmission type LCD different from the first embodiment. That is, the steps from FIG. 1(1) to FIG. 4(15) are identical but, after the steps, as shown in FIG. 14(16), a contact hole 19 is opened in insulation films 25, 36 for the drain portion of the display TFT and, at the same time, unnecessary SiO$_2$, PSG and SiN films at the pixel opening are removed for improving the transmittance.

Then as shown in FIG. 14(17), a flattening film 28 made of a light sensitive transparent acrylic resin is formed at 2 to 3 μm thickness over the entire surface, for example, by spin coating, and hole is opened for the transparent resin 28b on the drain side of the display TFT by a generally used photolithography, and cured under a predetermined condition.

Then, as shown in FIG. 14(18), an ITO sputtered film is formed over the entire surface at 130to 150 nm thickness, to form an ITO transparent electrode 41 in contact with the drain portion 19 of the display TFT by generally used photolithography and etching technique. Then, heat treatment (200–250° C./1 h in a forming gas) is applied to lower the contact resistance between the drain of the display TFT and ITO and improvement in the transparency of ITO.

Figure 15:
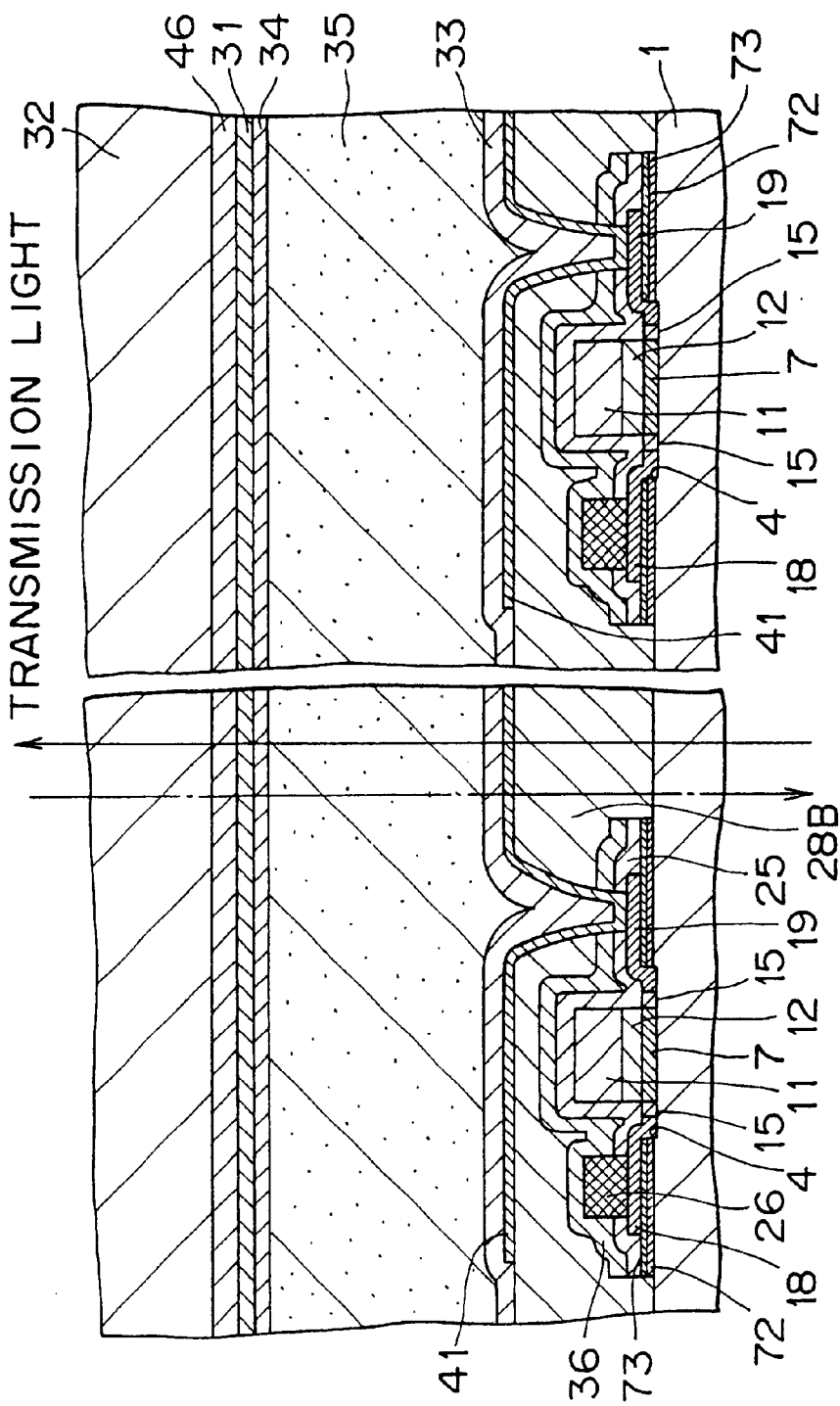
FIG. 15 is a cross sectional view for a main portion of the LCD in accordance with the second embodiment.

As shown in FIG. 15, this is combined with an opposing substrate 32, and a transmission type LCD is assembled like that in the first embodiment. In this case, a polarization plate is appended also on the TFT substrate. In the transmission type LCD, a transmission light is obtained as shown by a solid line but a transmission light from the opposing substrate 32 may also be obtained as shown by a dotted line.

In this transmission type LCD, an ON chip color filter (OCCF) structure and an ON chip black (OCB) structure can be manufactured as below.

The steps from FIG. 1(1) to FIG. 5(14) are conducted in accordance with the steps described previously. Subsequently, as shown FIG. 5(15), a hole is opened also in the drain portion of a PSG/SiO$_2$ insulation film 25 and an aluminum buried layer 41A for the drain electrode us formed and then an SiN/PSG insulation film 36 is formed.

Then, as shown in FIG. 16(16), a photoresist 61 in which a pigment for each of colors R, G and B is dispersed on every segment is formed at a predetermined thickness (1–1.5 μm) and then, as shown in FIG. 16(17), each of color filter layers (61)R, 61(G) and 61(B) is formed by patterning leaving only the predetermined position (each pixel portion) by the generally used photolithographic technique (ON chip color filter structure). In this case, hole is opened also in the drain portion. Not transparent ceramic substrates or substrate of glass or heat resistant resin of low transmittance can not be used.

Then, as shown in FIG. 16(17), a light shielding layer 43 as a black mask layer is formed in the contact hole in communication with the drain of the display TFT and extending on the color filter layer by metal patterning. For example, molybdenum is formed into a film of 200 to 250 nm thickness by a sputtering method and patterned to a predetermined shape covering the display TFT for light shielding (ON chip black structure).

Then, as shown in FIG. 16(18), a flattening film 28b of a transparent resin is formed, and an ITO transparent electrode 41 is formed in a through hole disposed in the flattening film so as to be in contiguous with the light shielding layer 43.

By preparing the color filter 61 or the black mask 43 on the display array section, the aperture ratio of the liquid crystal display panel can be improved and the electric power consumption of the display module including the back light can be reduced.

Third Embodiment

FIG. 17 to FIG. 25 show a third embodiment of the present invention.

In this embodiment, the peripheral driving circuit section is constituted with a CMOS driving circuit comprising the same dual gate type pMOSTFT and nMOSTFT as that in the first embodiment described previously. The display section is a reflection type and TFT(s) of various kinds of gate structures are combined variously.

Namely, FIG. 17A shows a display section in which the same top gate type nMOSLDD-TFT as the first embodiment is disposed, FIG. 17B shows a display section in which a bottom gate type nMOSLDD-TFT is disposed and FIG. 17C shows a display section in which a dual gate type nMOSLDD-TFT is disposed respectively. Any of the bottom gate type and the dual gate type MOSTFT can be manufactured as described later through steps in common with the dual gate type MOSTFT in the peripheral driving circuit section. Particularly, the dual gate type improves the driving performance by upper and lower gate portions, is suitable to high speed switching and can be operated either as the top gate type or the bottom gate type depending on the case of using either the upper or the lower gate portion selectively.

In the bottom gate type MOSTFT in FIG. 17B, 71 in the figure represents a gate electrode such as made of Mo—Ta, 72 represents an SiN film and 73 represents an SiO$_2$ film, which form a gate insulation film, and a channel region or the like using the same single crystal silicon layer as the dual gate type MOSTFT in the peripheral driving circuit section is formed on the insulation film. Further, in the dual gate type MOSTFT in FIG. 17C, the lower gate portion is identical with that of the bottom gate type MOSTFT but, in the upper gate portion, a gate insulation film 82 is formed of an SiO$_2$ film and an SiN film, on which an upper gate electrode 83 is disposed. In each of the cases, each of the gate portions is constituted to the outside of a step 4 as a seed in graphoepitaxial growing.

Then, a method of manufacturing the bottom gate type MOSTFT is explained with reference to FIG. 18 to FIG. 22, while a method of manufacturing the dual gate type MOSTFT is explained with reference to FIG. 23–FIG. 25, respectively. Since a method of manufacturing the dual gate type MOSTFT in the peripheral driving circuit section is identical with that explained with reference to FIG. 1 to FIG. 6, it is not illustrated here.

For manufacturing the bottom gate type MOSTFT in the display section as shown in FIG. 18(1), a sputter film 71 (500–600 nm thickness) of a molybdenum/tantalum Mo—Ta alloy is at first formed on a substrate 1 in the same step as in FIG. 1(1).

Then, as shown in FIG. 18(2), a photoresist 70 is formed into a predetermined pattern in the same step as in FIG. 1(2), and an Mo—Ta film 71 is taper-etched using the same as a mask to form a gate electrode 71 in which a lateral end 71a is moderately inclined at 20 to 450 in a trapezoidal shape.

Then, as shown in FIG. 18(3), after removing the photoresist 70 in the same step as in FIG. 1(3), an SiN film (about 100 nm thickness) 72 and an $SiO_2$ film (about 200 nm thickness) 73 are laminated in this order to form a gate insulation film on the substrate 1 containing the molybdenum-tantalum alloy film 71 by a plasma CVD process or the like.

Then, as shown in FIG. 19(4), in the same step as in FIG. 2(4), a photoresist 2 is formed into a predetermined pattern at least in a TFT forming region, and a plurality of steps 4 are formed each in an appropriate shape and size on a gate insulation film on the substrate 1 (also on the substrate itself) in the same manner as described above using the photoresist as a mask. The step 4 constitutes a seed upon graphoepitaxial growing of the single crystal silicon to be described later, which may have a depth d=0.3–0.4 μm, a width w=2–3 μm, and a length (in orthogonal to the drawing)=10–20 μm, in which the angle formed between the bottom and the lateral side (bottom angle) is a right angle.

Then, as shown in FIG. 19(5), after removing the photoresist 2, the single crystal silicon is graphoepitaxially grown by the catalyst CVD process as described above and is deposited as a single crystal silicon layer 7 at a thickness, for example, of about 0.1 μm. In this case, since the lateral end 71a of an underlying gate electrode 71 forms a moderate slope, the single crystal silicon layer 7 is grown on the surface with no hindrance for the epitaxial growing by the step 4 and with no disconnection.

Then, as shown in FIG. 19(6), in the same step as in FIG. 3(9), the gate portion of the nMOSTFT in the display section is covered with the photoresist 13 phosphorus ions 14 are doped into the exposed source/drain region of nMOSTFT (ion implantation), to form an LDD portion 15 comprising an $N^-$-type layer in self alignment. In this case, presence of the bottom gate electrode 71 makes the surface height difference (or pattern) easily recognizable and facilitates positional alignment for the photoresist 13 (mask alignment), so that misalignment is less caused.

Figure 20:
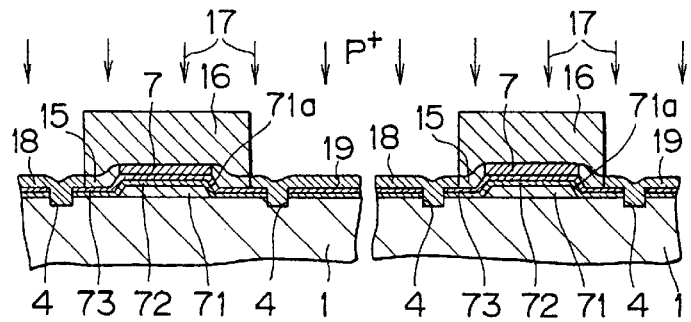
FIGS. 20(7) to 20(10) are cross sectional views showing the manufacturing process of the LCD according to the third embodiment in the order of the steps.
Figure 20:
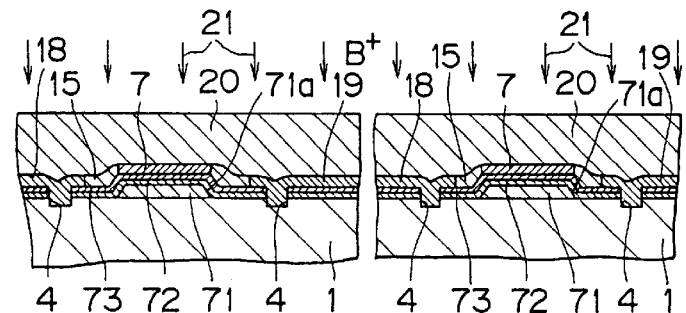
Figure 20:
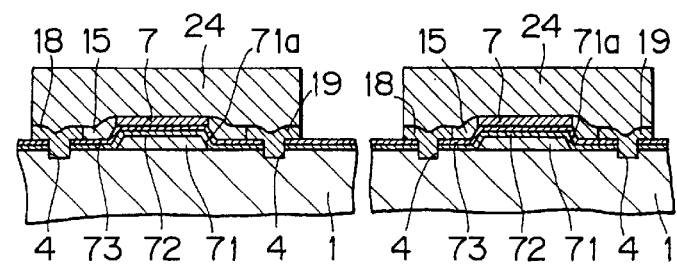
Figure 20:
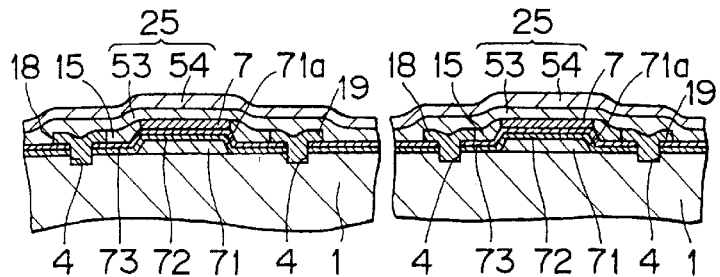

Then, as shown in FIG. 20(7), in the same step as in FIG. 4(10), the gate portion and the LDD portion of the nMOSTFT covered with a photoresist 17, phosphorus or arsenic ions 17 are doped to the exposed region (ion implantation), to form a source portion 18 and a drain portion 19 comprising the $N^+$ type layer of the nMOSTFT.

Then, as shown in FIG. 20(8), in the same step as in FIG. 4(11), the nMOSTFT is entirely covered with a photoresist 20, boron ions 21 are doped (ion implanted) to form the source portion and the drain portion of the $P^+$ layer of pMOSTFT in the peripheral driving circuit section.

Then, as shown in FIG. 20(9), in the same step as in FIG. 4(12), a photoresist 24 is disposed, and the single crystal silicon layer is selectively removed by the generally used photolithography and etching technique for making the active device portion and the passive device portion into islands.

Then, as shown in FIG. 20(10), in the same step as in FIG. 5(13), an $SiO_2$ film 53 (about 300 nm thickness) and a phosphor silicate glass (PSG) film (about 300 nm thickness) are formed in this order over the entire surface, for example, by a plasma CVD, high density plasma CVD or catalyst CVD process. The $SiO_2$ film 53 and the PSG film 54 correspond to the protection film 25 described above. Then, in this state, the single crystal silicon film is activated in the same manner as described above.

Then, as shown in FIG. 21(11), in the same step as in FIG. 5(14), a contact hole is opened in the source portion by the generally used photolithography and etching technique.

Then, an aluminum sputtered film of 400 to 500 nm thickness is formed for the entire surface, to form a source electrode 26 of TFT and, at the same time, data lines and gate lines by the generally used photolithography and etching technique. Subsequently, sintering is applied in a forming gas at 400° C./1 h.

Then, as shown in FIG. 21(12), in the same step as in FIG. 5(15), an insulation film 36 comprising, a PSG film (about 300 nm thickness) and an SiN film (about 300 nm thickness) is formed for the entire surface, for example, by a high density plasma CVD or catalyst CVD process and a contact hole is opened in the drain portion of display TFT.

Then, as shown in FIG. 21(13), in the same step as in FIG. 6(16), a light sensitive resin film 28 of 2 to 3 μm thickness is formed by spin coating or the like and, as shown in FIG. 21(14), a concave/convex pattern is formed by the generally used photolithography and etching technique so as to obtain optimal reflection characteristics and view angle characteristics to at least the pixel section, which is caused to reflow to form a lower portion for the reflection surface comprising coarse concave/convex surface 28A. At the same time, contact hole for the resin is opened in the drain portion of the display TFT.

Then, as shown in FIG. 21(14), in the same step as in FIG. 6(18), an aluminum sputtered film of 400 to 500 nm thickness is formed for the entire surface and a concave/convex shaped reflection portion 29 such as made of aluminum in contiguous with a drain portion 19 of the display TFT is formed by the generally used photolithography and etching technique.

As described above, it is possible to manufacture an active matrix substrate 30 of a display section-peripheral driving circuit section integration type in which a bottom gate type nMOSLDD-TFT (CMOS driving circuit comprising a dual gate type pMOSTFT and nMOSTFT in the peripheral section) is prepared in the display section using the single crystal silicon layer 7 formed with the step 4 as the seed for cold graphoepitaxial growing by the catalyst CVD process.

FIG. 22 shows an example of forming the bottom gate type MOSTFT gate insulated film to be disposed to the display section by an Mo—Ta anodizing method.

That is, after the step shown in FIG. 18(2), a molybdenum-tantalum alloy film 71 is treated by a known anodization to form a gate insulation film 74 comprising $Ta_2O_5$ at 100 to 200 nm thickness on the surface as shown in FIG. 21(3).

In the succeeding steps, as shown in FIG. 22(4), a step 4 is formed like that in the steps shown in FIG. 19(4) and (5), and then a single crystal silicon film 7 is graphoepitaxially grown by a catalyst CVD process and, subsequently, an active matrix substrate 30 is prepared as shown in FIG. 22(5) in the same manner as in the steps shown in FIG. 19(6)–FIG. 21(14).

Then, for manufacturing a dual gate type MOSTFT in the display section, the steps in FIG. 18(1)–FIG. 19(5) are at first conducted in the same manner as described above.

Figure 23:
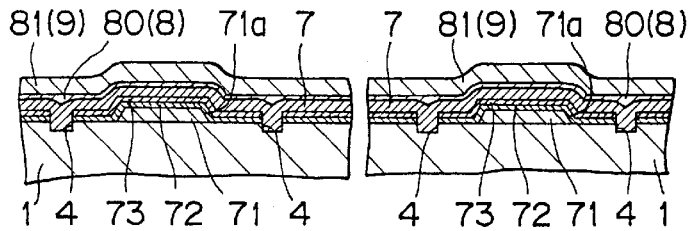
FIGS. 23(6) to 23(9) are cross sectional views showing the manufacturing process of the LCD according to the third embodiment in the order of the steps.
Figure 23:
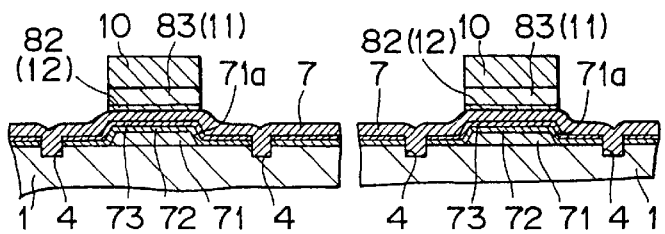
Figure 23:
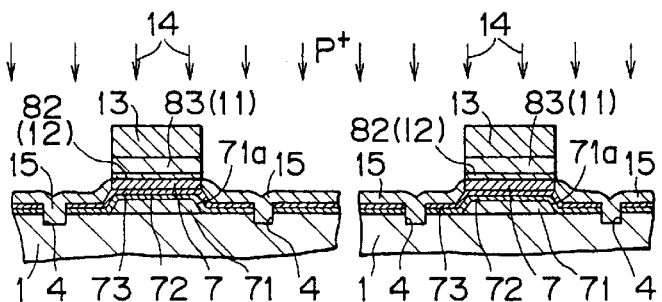
Figure 23:
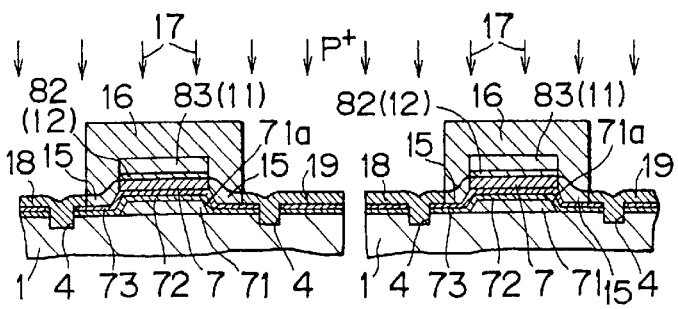

That is, as shown in FIG. 23(6), a step 4 is formed in insulation films 72, 73 and a substrate 1 and, further, a single crystal silicon layer 7 is graphoepitaxially grown using the step 4 as a seed. Then, in the same step as in FIG. 3(7), an $SiO_2$ film (about 200 nm thickness) and an SiN film (about 100 nm thickness) are formed continuously in this order over the entire surface of the single crystal silicon film 7, for example, by a plasma CVD or a catalyst CVD process to form an insulation film 80 (corresponding to the insulation film 8 described above) and, further, a sputter film 81 (500 to 600 nm thickness) of an Mo—Ta alloy (corresponding to the sputtered film 9) is formed.

Then, as shown in FIG. 23(7), in the same step as in FIG. 3(8), a photoresist pattern 10 is formed and a top gate electrode 82 (corresponding to the gate electrode 12 described above) and a gate insulation film 83 (corresponding to the gate insulation film 11 described above) made of an Mo—Ta alloy is formed by continuous etching to expose the single crystal silicon film layer 7.

Then, as shown in FIG. 23(8), in the same step as in FIG. 3(9), the top gate portion of the nMOSTFT is covered with a photoresist 13, and phosphorus ions 14 are doped (ion implanted) to the exposed source/drain region of the display nMOSTFT to form an LDD portion 15 of an N⁻-type layer.

Then, as shown in FIG. 23(9), in the same step as in FIG. 14(19), the gate portion and the LDD portion of the nMOSTFT are covered with a photoresist 16, and phosphorus or arsenic ions 17 are doped (ion implanted) to the exposed region, to form a source portion 18 and a drain portion 19 comprising an N⁺-type layer of nMOSTFT.

Then, as shown in FIG. 24(10), in the same step as in FIG. 4(11), the gate portion of the pMOSTFT is covered with a photoresist 20, boron ions 21 are doped (ion implanted) to the exposed region to form a source portion and a drain portion of a p⁺-type layer of the pMOSTFT in the peripheral driving circuit section.

Then, as shown in FIG. 24(11), in the same step as in FIG. 4(12), for making an active device portion and a passive device portion into islands, a photoresist 24 is disposed and the single crystal silicon film layer other than the active device portion and the passive device portion is selectively removed by the generally used photolithography and etching technique.

Then, as shown in FIG. 24(12), in the same step as in FIG. 5(13), an $SiO_2$ film 53 (about 200 nm thickness) and a phosphor silicate glass (PSG) film 54 (about 300 nm thickness) are formed over the entire surface, for example, by a plasma CVD, high density plasma CVD or catalyst CVD process. The films 53 and 54 correspond to the protection film 25 described above. Then, the single crystal silicon layer 7 is activated.

Then, as shown in FIG. 24(13), in the same step as in FIG. 5(14), a contact hole is opened in the source portion. Then, a sputtered film made of aluminum is formed over the entire surface at 400 to 500 nm thickness, and a source electrode 26 is formed and, at the same time, data lines and gate lines are formed by the generally used photolithography and etching technique.

Figure 25:
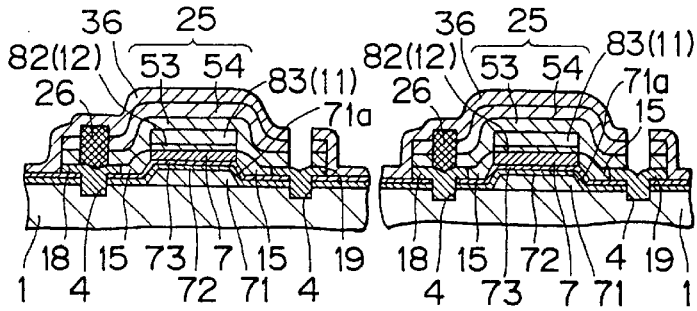
FIGS. 25(14) to 25(16) are cross sectional views showing a manufacturing process of an LCD according to a third embodiment in the order of the steps.
Figure 25:
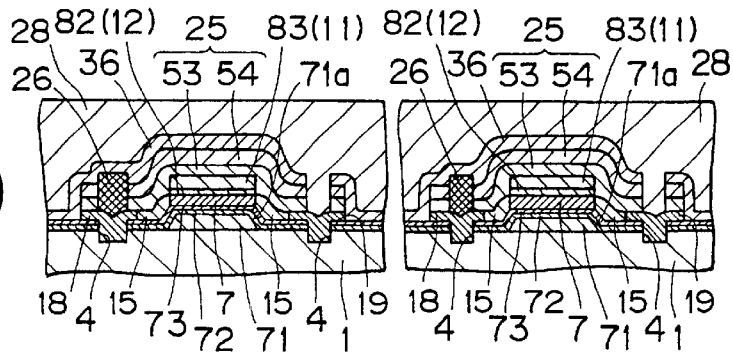
Figure 25:
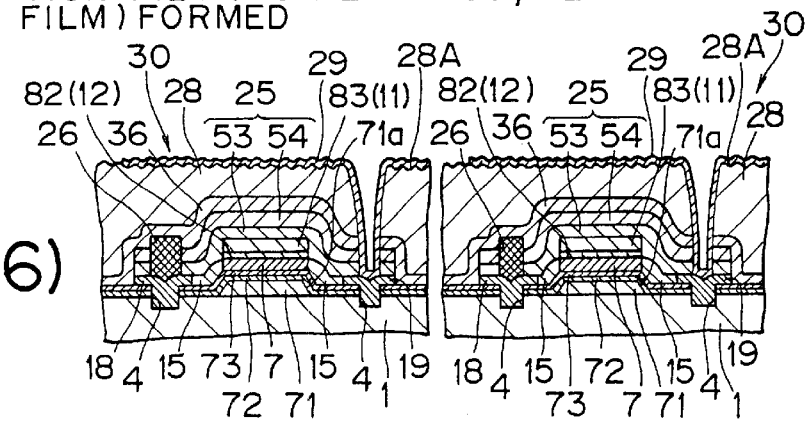

Then as shown in FIG. 25(14), in the same step as in FIG. 5(15), an insulation film 36 comprising a PSG film (about 300 nm thickness) and an SiN film (about 300 nm thickness) is formed over the entire surface, and a contact hole is opened in the drain portion of the display TFT.

Then, as shown in FIG. 25(15), a light sensitive resin film 28 of 2 to 3 μm thickness is formed over the entire surface by spin coating or the like and, as shown in FIG. 25(16), in the same steps as in FIG. 6(17), (18), a lower portion of a reflection surface comprising a coarse concave/convex surface 28A is formed at least to the pixel section and, at the same time, contact resin hole is opened in the drain portion of the display TFT and, further, a concave/convex shape reflection portion 29 made of aluminum in connection with a drain portion 19 of the display TFT for obtaining optimum reflection characteristics and view angle characteristics is formed.

As described above, it is possible to manufacture an active matrix substrate 30 of a display section-peripheral driving integration type in which the dual gate type nMOSLDD TFT is prepared in the display section and a cMOS driving circuit comprising dual gate type pMOSTFT and nMOSTFT are prepared in the peripheral driving circuit section, by using the single crystal silicon layer 7 formed with the step 4 used as the seed for cold graphoepitaxial growing by the catalyst CVD process.

Fourth Embodiment

FIG. 26 to FIG. 33 show a fourth embodiment of the present invention.

In this embodiment, a gate electrode of a top gate portion is formed of a material with relatively low heat resistance such as aluminum, different from the embodiments described previously.

At first, when a top gate type MOSTFT is disposed in the display section and a dual gate type MOSTFT is disposed in the peripheral driving circuit section, the steps from FIG. 1(1) to FIG. 2(5) in the first embodiment are conducted in the same manner, and an N-type well 7A is formed to a pMOSTFT portion in the peripheral driving circuit section as shown in FIG. 26(6).

Then, as shown in FIG. 26(7), the entire portion of the nMOS and pMOS TFT in the peripheral driving region and the gate portion of the nMOS TFT in the display region are covered with a photoresist 13, and phosphorus ions 14 are doped to the exposed source/drain region of the nMOSTFT, for example, at a dose of $5 \times 10^{13}$ atoms/cm² under 20 kV (ion implanted), to form an LDD portion 15 comprising an N⁻-type layer in self alignment.

Figure 27:
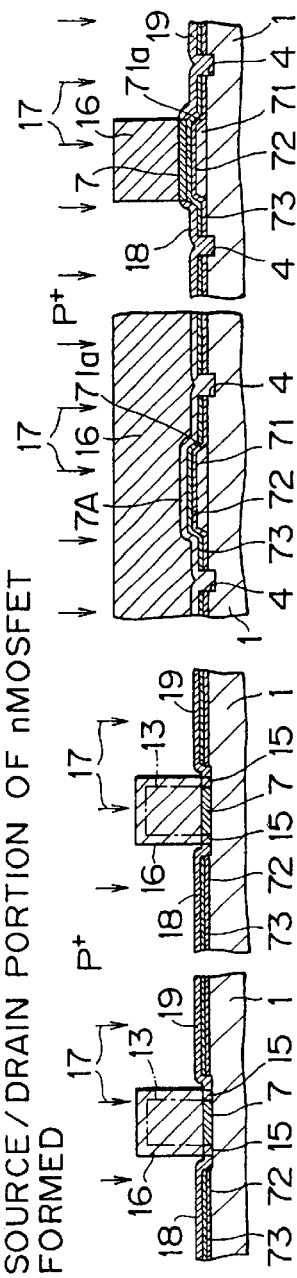
FIGS. 27(8) to 27(10) are cross sectional views showing the manufacturing process of the LCD according to the fourth embodiment in the order of the steps.
Figure 27:
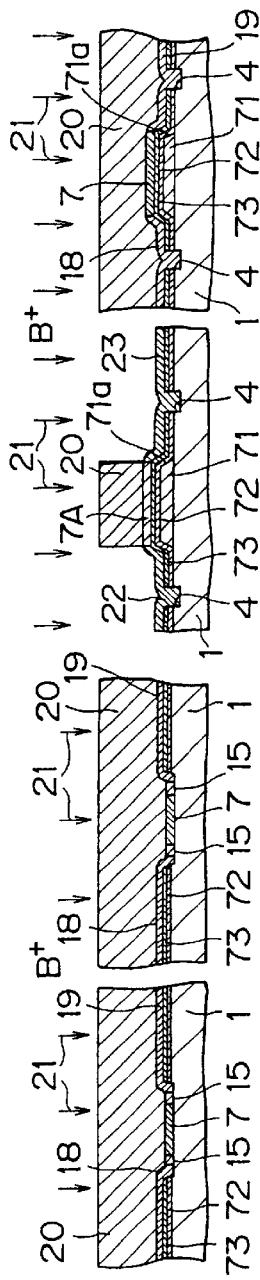
Figure 27:
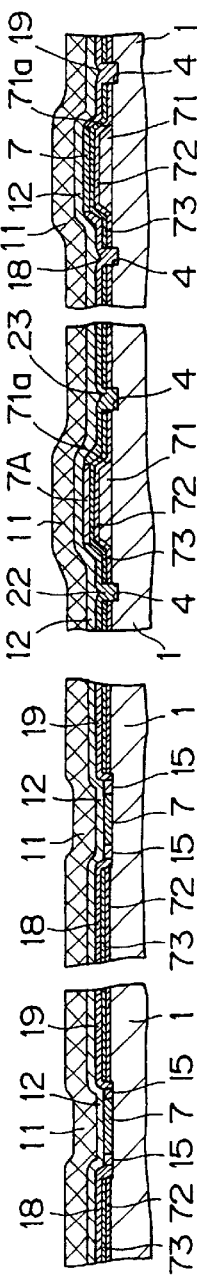

Then, as shown in FIG. 27(8), the entire portion of the pMOSTFT in the peripheral driving region, the gate portion of the nMOSTFT in the peripheral driving region, and the gate and the LDD portion of the nMOSTFT in the display region are covered with a photoresist 16, and phosphorus or arsenic ions 17 are doped (ion implanted), for example, at a dose of $5 \times 10^{15}$ atoms/cm² under 20 kV, to form a source portion 18, a drain portion 19 and an LDD portion 15 comprising an N⁻-type layer of nMOSTFT. In this case, if the resist 13 is left as shown by an imaginary line and a resist 16 is disposed so as to cover the same, the mask can be aligned upon forming the resist 16 with reference to the resist 13 to facilitate mask alignment and decrease misalignment.

Then, as shown in FIG. 27(9), nMOSTFT in the peripheral driving region and the entire portion of nMOSTFT and the gate portion of pMOSTFT in the display region are covered with a photoresist 20, and boron ions 21 are doped (ion implanted) to the exposed region, for example, at a dose of $5 \times 10^{15}$ atoms/cm² under 10 kV, to form a source portion 23 and a drain portion 23 of a p⁺-layer of pMOSTFT.

Then, after removing the resist 20, as shown in FIG. 27(10), the single crystal silicon layers 7, 7A are activated in the same manner as described above and, further, a gate insulation film 12 and a gate electrode material (aluminum or 1% Si incorporated aluminum) 11 are formed on the surface. The gate electrode material layer 11 can be formed by a vacuum deposition or sputtering method.

Then, in the same manner as described above, after patterning each of the gate portions, the active device portion and the passive device portion are made into islands and, further, as shown in FIG. 28(11), an $SiO_2$ film (about 200 nm thickness) and a phosphor silicate glass (PSG) film (about 300 nm thickness) are formed continuously in this order over the entire surface to form a protection film 25.

Then, as shown in FIG. 28(12), contact holes are opened in the source/drain portions of all TFT(s) in the peripheral driving circuit and the source portion for the display TFT by the generally used photolithography and etching technique.

Then, a sputtered film made of aluminum or 1% Si incorporated aluminum is formed at 500 to 600 nm thickness over the entire surface and a source region 26 for all TFT(s) in the peripheral driving circuit and the display section, and a drain electrode 27 in the peripheral driving circuit section and, at the same time, data lines and gate lines are also formed by the generally used photolithography and etching technique. Subsequently, sintering is applied in a forming gas ($N_2+H_2$) at about 400° C./1 h.

Then, in the same manner as in FIG. 5(15)–FIG. 6(18), it is possible, to manufacture an active matrix substrate 30 of a display section-peripheral driving circuit section integration type in which a top gate type nMOSLDD-TFT having a gate electrode made of aluminum or 1% Si incorporated aluminum, and CMOS driving circuit constituted with dual gate type pMOSTFT and nMOSTFT are prepared respectively in the display section and the peripheral driving circuit section using the single crystal silicon layer 7 like that in FIG. (15)–FIG. 6(18).

In this embodiment, since the gate electrode 11 made of aluminum or 1% Si-incorporated aluminum is formed after the activating treatment for the single crystal silicon layer 7, the effect of heat upon activation treatment has no concern with the heat resistance of the gate electrode material, so that aluminum or 1% Si-incorporated aluminum at a reduced cost with relatively low heat resistance can also be used as the material for the top gate electrode, and the electrode material can be selected from a wider range. The situation is identical also in a case where the display section comprises the bottom gate type MOSTFT.

Then, when a dual gate type MOSTFT is disposed in the display section and a dual gate type MOSTFT is disposed in the peripheral driving circuit, the steps from FIG. 18(1) to FIG. 19(5) are conducted in the same way as in the third embodiment and, as shown in FIG. 29(5), an N-type well 7A is formed to the pMOSTFT portion in the peripheral driving circuit section.

Then, as shown in FIG. 28(6), in the same manner as in FIG. 26(7), phosphorus ions 14 are doped to the TFT portion in the display section to form an LDD portion 15.

Then, as shown in FIG. 30(7), in the same manner as in FIG. 27(8), phosphorus ions 17 are doped to the nMOSTFT portion in the display section and the peripheral driving circuit section to form an $N^+$-type source region 18 and a drain region 19, respectively.

Then, as shown in FIG. 30(8), in the same manner as in FIG. 27(9), boron ions 21 are doped to the pMOSTFT portion in the peripheral driving circuit section to form a $p^+$-type source region 22 and a drain region 23, respectively.

Then, after removing a resist 20, as shown in FIG. 30(9), a single crystal silicon layer 7 is patterned to make an active device portion and a passive device portion into islands and then, as shown in FIG. 31(10), the single crystal layers 7, 7A are activated in the same manner as described above and, further, a gate insulation film 80 is formed on the surface in the display section, and an a gate insulation film 12 is formed on the surface in the peripheral driving circuit section.

Then, as shown in FIG. 31(11), an aluminum film formed for the entire surface by a sputtering method is patterned to form each of upper gate electrodes 83 in the display section and each of upper gate electrodes 11 in the peripheral driving circuit section.

Then, as shown in FIG. 31(12), an $SiO_2$ film (about 200 nm thickness) and a phosphor silicate glass (PSG) film (about 300 nm thickness) are formed continuously in this order over the entire surface to form a protection film 25.

Then, in the same manner as described above, source electrodes 26 for all TFT(s) in the peripheral driving circuit and the display section and the drain electrodes 27 in the peripheral driving circuit section are formed, to manufacture an active matrix substrate 30 of a display section-peripheral driving circuit section integration type in which a dual gate type nMOSLDD-TFT and the CMOS driving circuit constituted with the dual gate type pMOSTFT and nMOSTFT having the top gate electrode made of aluminum or the like are prepared in the display section and the peripheral driving circuit section using the single crystal silicon layer 7 respectively.

Also in this embodiment, since the gate electrodes 11, 83 made of aluminum or the like are formed after activation of the single crystal silicon layer 7, the effect of heat upon activation has no concern with the heat resistance of the gate electrode material, so that low cost aluminum or the like with relatively low heat resistance can also be used as the material for the top gate electrode and the electrode material can be selected from a wider range. The source electrode 26 (also the drain electrode) can be formed simultaneously in the step of FIG. 31(11) and this can provide an advantage in view of the manufacturing method.

Figure 32A:
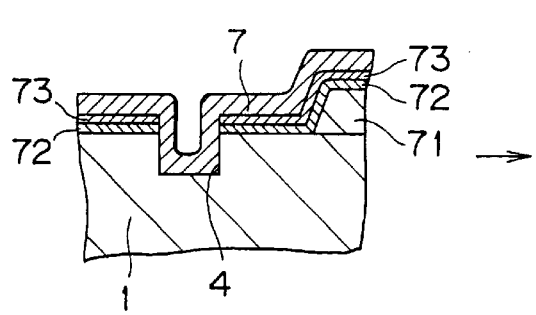
FIGS. 32A to 32C are cross sectional views showing a manufacturing process of an LCD according to a fourth embodiment in the order of steps.
Figure 32B:
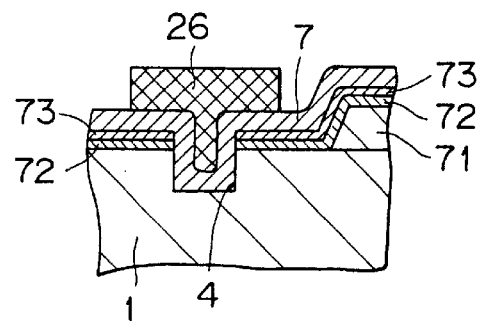
Figure 32C:
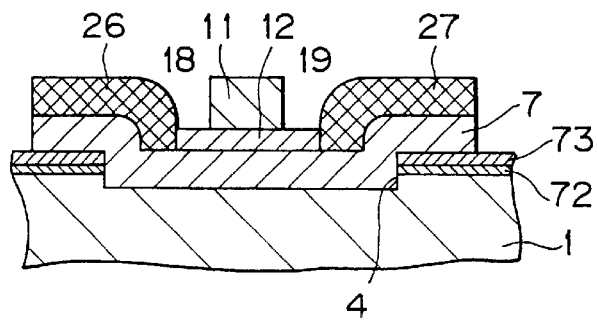

In any of the embodiments described above, when the bottom gate type, the top gate type or the dual gate type MOSTFT is manufactured for instance, if the step 4 is disposed as schematically shown in FIG. 32A, the single crystal silicon film 7 to be grown thereon may possibly cause step disconnection (connection failure) or thinning (increase of resistance) because the film is thin. Accordingly, for reliable connection with the source electrode 26 (or drain electrode), it is desirable to deposit the electrode on a region including the step 4 as shown in FIGS. 32B and 32C.

In the step in FIG. 26(7) or in the step in FIG. 29(6), ion implantation and activation may be applied after forming the top gate insulation film and the single crystal silicon layer 7 and then the top gate electrode, the source and the drain electrode may be formed simultaneously with aluminum.

Figure 33A:
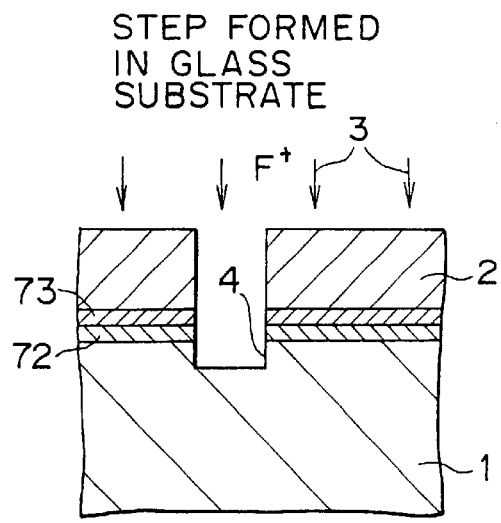
FIGS. 33A and 33B are cross sectional views showing a main portion upon manufacturing the LCD according to the fourth embodiment.
Figure 33B:
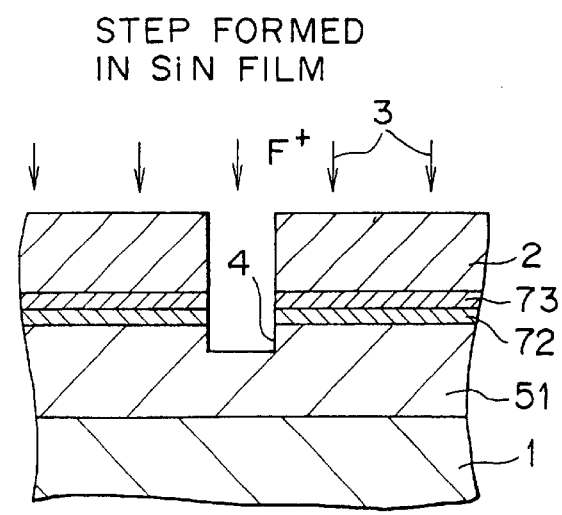
Figure 34A:
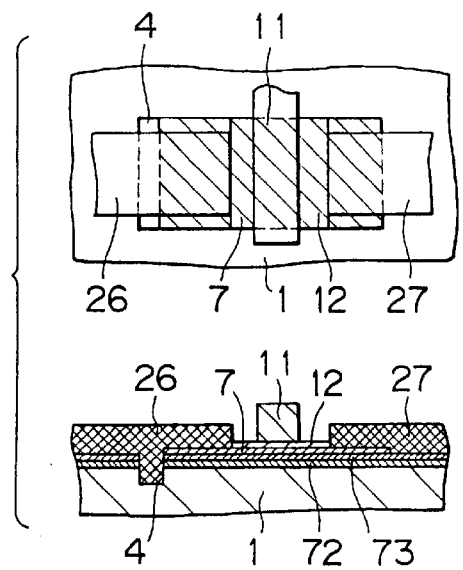
FIGS. 34A to 34E are plan views or cross sectional views showing various kinds of TFT for an LCD according to a fifth embodiment of the present invention.
Figure 34B:
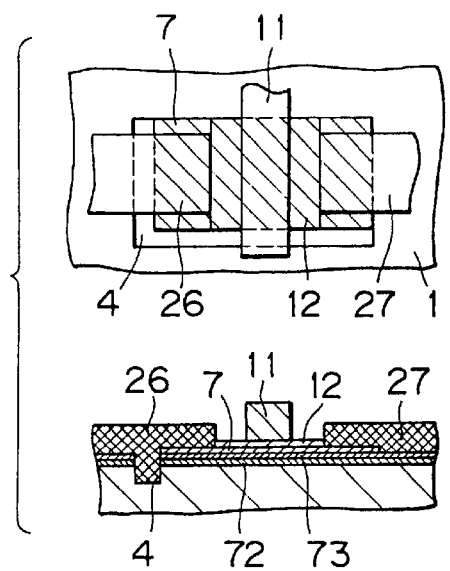
Figure 34C:
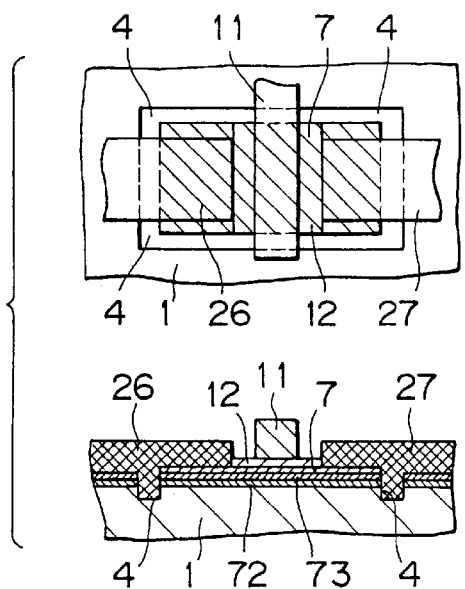
Figure 34D:
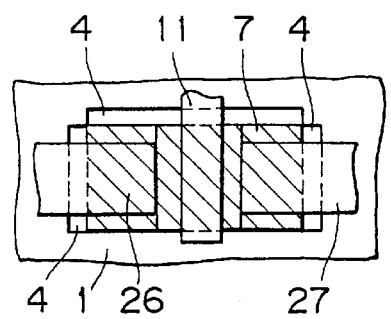
Figure 34E:
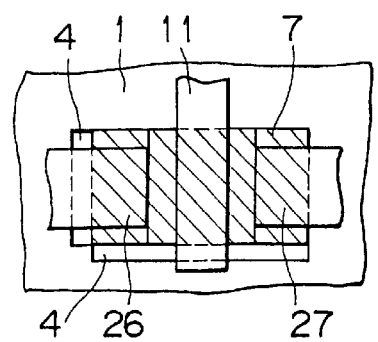

Further, as shown in FIG. 33A, the step 4 is formed to the substrate 1 (also to the SiN film or the like formed thereon) as shown in FIG. 33A, it may be formed also to an SiN film 51 (having a function of stopping diffusion of ions from the glass substrate 1) on the substrate 1 as shown in FIG. 33B. A gate insulation film 72 or 73 may be disposed instead of the SiN film 51 or on the SiN film 51, and the step 4 may be formed to the film.

Fifth Embodiment

Figure 35A:
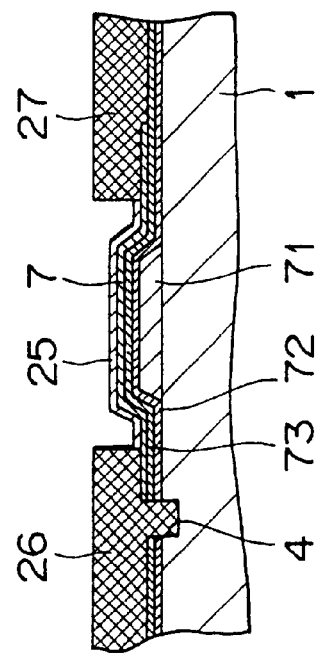
FIGS. 35A to 35C are cross sectional views for various kinds of TFT upon manufacturing the LCD in accordance with the fifth embodiment.
Figure 35C:
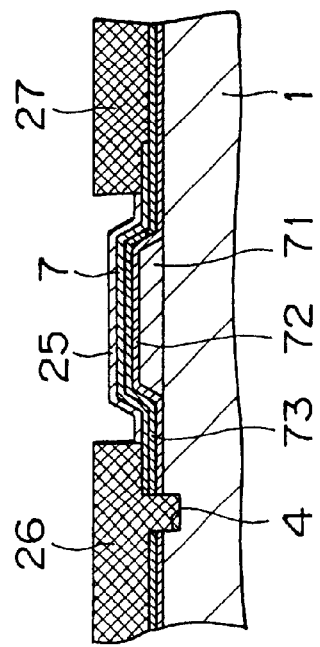
Figure 35B:
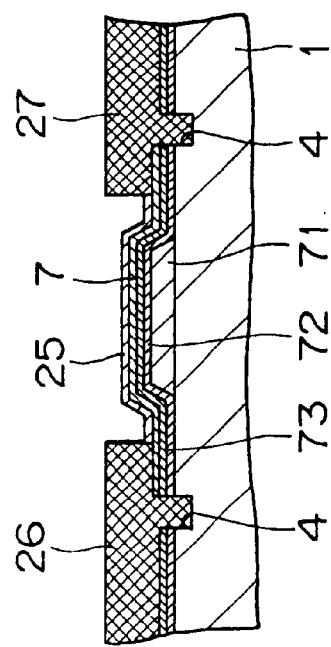
Figure 36:
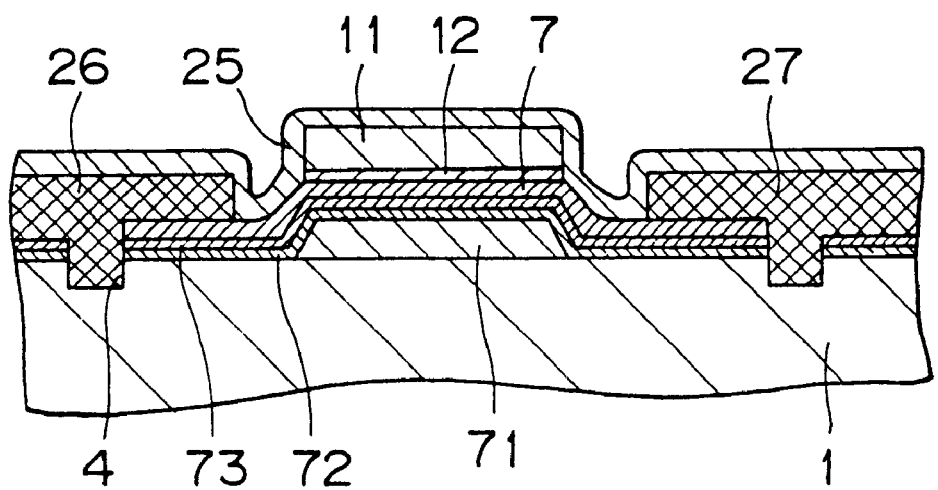
FIG. 36 is a cross sectional view for a main portion of the LCD in accordance with the fifth embodiment.

FIG. 34 to FIG. 36 show a fifth embodiment of the present invention.

This embodiment shows various examples of forming each TFT to the outside of a step 4 (that is, on a substrate at a position other than the step). A single crystal layer 7, and the gate/source/drain electrodes 26, 27 are shown schematically.

At first, FIG. 34 shows a top gate type MOSTFT. FIG. 34A shows an example of forming a concave portion 4 attributable to the step on one side of a source along a source region, and forming a gate insulation film 12 and a gate electrode 11 on a single crystal silicon layer 7 at the flattened surface of the substrate other than the concave portion. FIG. 34B shows an example of forming a concave portion 4 attributable to the step not only to the source region but also extending for the two sides as far as the end of the drain region in the longitudinal direction of the channel in an L-shaped pattern. FIG. 34C shows an example of forming a concave portion 4 in a rectangular shape extending over four sides so as to surround a TFT active region. Further, FIG. 34D shows an example of forming a concave portion 4 for three sides and FIG. 34E shows an example of forming a concave portion 4 for two sides in an L-shaped pattern, in which adjacent concave portions 4 and 4 are not in contiguous to each other.

As described above, since concave portions 4 of various patterns can be formed and TFT is disposed on the flattened surface other than the concave portion 4, this can facilitate manufacture of TFT.

FIG. 35 shows a bottom gate type MOSTFT, in which steps (or concave portions) 4 of various patterns shown in FIG. 35 can be formed in the same manner. That is, FIG. 35A is an example corresponding to FIG. 34A in which a bottom gate type MOSTFT is formed on a flattened surface other than a concave portion 4. In the same manner, FIG. 35B corresponds to FIG. 34B and FIG. 35C corresponds to FIGS. 34C or 34D.

FIG. 36 shows a dual gate type MOSTFT in which steps (or concave portions) 4 of various patterns shown in FIG. 34 can also be formed. For example, a dual gate type MOSTFT can be manufactured on the flattened surface in the inner region of the step 4 shown in FIGS. 34C or 34D.

Sixth Embodiment

Figure 37:
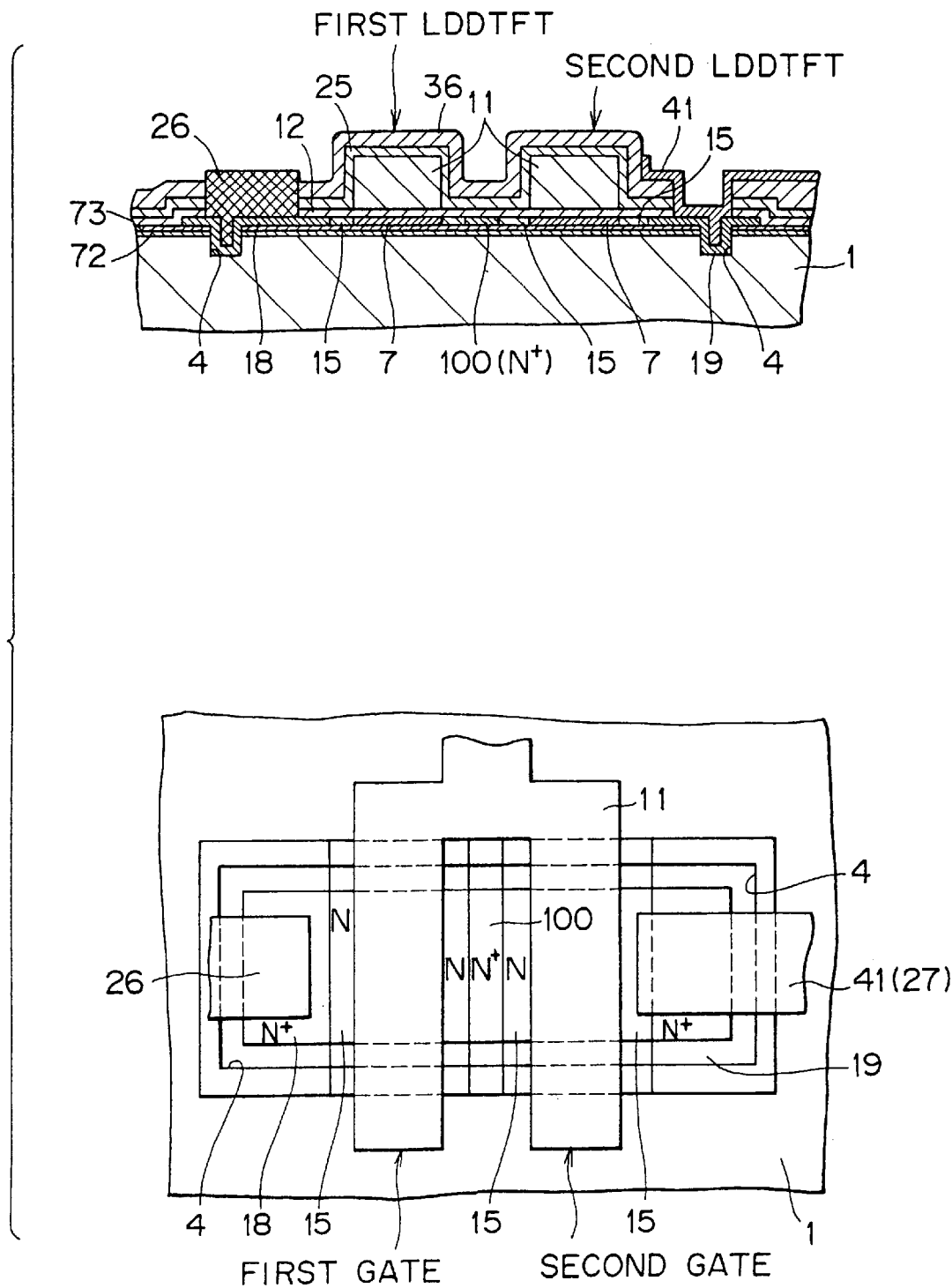
FIG. 37 is a cross sectional view or a plan view for a main portion of an LCD in accordance with a sixth embodiment of the present invention.
Figure 38A:
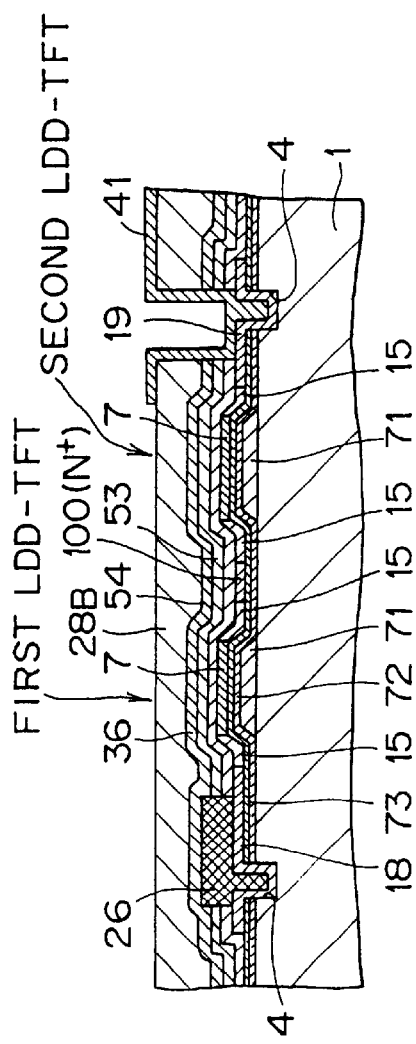
FIGS. 38A and 38B are cross sectional views for a main portion of various kinds of TFT in the LCD in accordance with the sixth embodiment.
Figure 38B:
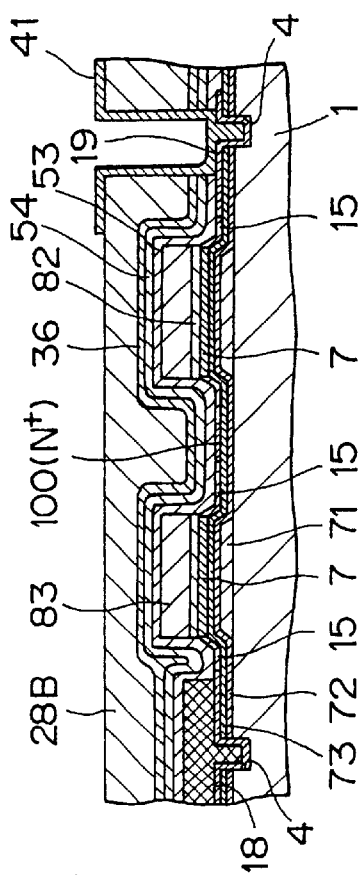

FIG. 37 to FIG. 39 show a sixth embodiment of the present invention.

An example shown in FIG. 37 concerns a TFT of a self aligned LDD structure, for example, a double gate type MOSTFT comprising a plurality of top gate type LDD-TFT in series.

According to this embodiment, a gate electrode 11 is branched in two parts one of which is used as a first gate for a first LDD-TFT, while the other of them is used as a second gate for a second LDD-TFT (in which an N$^+$-type region 100 is disposed between the gate electrodes at a central portion of the single crystal silicon layer for lowering the resistance). In this case, a different voltage may be applied to each of the gates. Further, if one of the gates becomes not operable by some or other reasons, carriers can be moved between source and drain by using the other alive gate to provide a highly reliable device. Further, since the first LDD-TFT and the second LDD-TFT are serially connected by two to form a thin film transistor for driving each pixel, a voltage applied between the source and the drain of each thin film transistor during a turn-off period can be decreased remarkably. Accordingly, leak current flowing during the turn-off period can be decreased to effectively improve the contrast and the image quality of the liquid crystal display. Further, since the two LDD transistors are connected by using only the same semiconductor layer as the low concentration drain region in the LDD transistor, the connection distance between each of the transistors can be shortened, so that required area is not enlarged even when the two LDD transistors are connected. The first and the second gates can be separated completely and operated independently of each other.

FIG. 38 shows examples for a bottom gate type MOSTFT having a double gate structure (A) and a dual gate type MOSTFT having a double gate structure (B).

Also the double gate MOSTFT described above have the same advantage as the top gate type described above. Among them, the dual gate type has a further advantage that even when one of upper and lower gate portions become not operable, the other of the gates can be used.

FIG. 39 shows an equivalent circuit diagram for each of the double gate type MOSTFT. In the foregoing embodiment, the gate is branched into two parts but it may be branched or divided into three or more parts. The double gate or multi-gate structure may have two or more branched gate electrodes at an identical potentials or have divided gate electrodes at different potential or identical potentials in the channel region.

Seventh Embodiment

FIG. 40 shows a seventh embodiment of the present invention in which one of the upper and lower gate portions is operated as a transistor, while the other of the gate portions is operated as below in the TFT of the dual gate type structure nMOSTFT.

That is, FIG. 40A shows an nMOSTFT in which an optional negative voltage is always applied to the gate electrode on the top gate to decrease the leak current in a back channel. The top gate electrode is made open when it is used as the bottom gate type. Further, FIG. 40B shows a case in which an optional negative voltage is always applied to the gate electrode on the bottom gate to decrease the leak current in the back channel. Also in this case, when the bottom electrode is made open, it can be used as the top gate type. In pMOSTFT, the leak current in the back channel can be decreased by always applying an optional positive voltage on the gate electrode.

While crystallinity is poor at the boundary between the single crystal layer 7 and the insulation film and leak current tends to flow, such leak current can be interrupted by the application of the negative voltage to the electrode as described above. This is advantageous in conjunction with the effect of the LDD structure. Furthermore, leak current may be caused by an incident light from the glass substrate 1 but, since the light is shielded by the bottom gate electrode, the leak current can be decreased.

Eighth Embodiment

FIG. 41–FIG. 49 shows an eighth embodiment of the present invention.

As described above, since each of top gate type, bottom gate type and dual gate type TFT has respective differences and features in the function in view of the structures, it may be sometimes advantageous to dispose TFT in various combinations between the display section and the peripheral driving circuit section when they are adopted in such sections.

For instance, as shown in FIG. 41, when one of the top gate type, bottom gate type and dual gate type MOSTFT is adopted for the display section, it is possible to use at least the dual gate type among the top gate type MOSTFT, bottom gate type MOSTFT and the dual gate type MOSTFT, or the combination thereof in the peripheral driving circuit. This includes twelve combinations (No. 1–No. 12). Particularly, when the dual gate structure is used for the MOSTFT in the peripheral driving circuit, such a dual gate structure can be changed easily also into the top gate or bottom gate by the selection of the upper and lower gate portions. Further, if TFT of large driving performance is required to a portion of the peripheral driving circuit, a dual gate type may sometimes be necessary. For example, it is considered that the dual gate type is necessary when the present invention is applied to an organic EL or FED as an electro-optical apparatus other than the LCD.

Various examples of combination for MOSTFT between the peripheral driving circuit section and the display section are shown on every channel conduction type (No. 1–No. 216). FIG. 42 and FIG. 43 show examples in which MOSTFT in the display section has no LDD structure, FIG. 44 and FIG. 45 show examples in which MOSTFT in the display section has an LDD structure, FIG. 46 and FIG. 47 show examples in which MOSTFT in the peripheral driving circuit section include TFT of the LDD structure and FIG. 48 and FIG. 49 show examples in which both of the peripheral driving circuit section and the display section include MOSTFT of the LDD structure.

As described above, the combination on every gate structure shown in FIG. 41 are concretely shown in FIG. 42 to FIG. 49. Same combination is possible when the peripheral driving circuit section comprises MOSTFT in combination of the top gate type with other gate type. Various combinations for TFT shown in FIG. 41–FIG. 49 are applicable not only to a case of forming the channel region of TFT with the single crystal silicon but also to a case of forming the same with polycrystal silicon or amorphous silicon (only for the display section).

Ninth Embodiment

FIG. 50–FIG. 51 shows a ninth embodiment of the present invention.

In this embodiment, TFT using the single crystal silicon layer according to the present invention is disposed in the peripheral driving circuit section in an active matrix driving LCD in view of the improvement for the driving performance. However, this is not restricted only to the dual gate type but it may be a combination with other gate type, and the channel conduction type may be varied. Further, it may include MOSTFT using a polycrystal silicon layer other than the single crystal silicon layer. On the contrary, it is desirable to use the single crystal silicon layer for the MOSTFT in the display section, but it may use the polycrystal silicon or amorphous silicon layer, or at least two kinds of three types silicon layers may be present in combination. When the display section is formed with nMOSTFT, although a practical switching speed can be obtained also by the use of the amorphous silicon layer, the single crystal silicon or polycrystal silicon layer can decrease the TFT area and it is more advantageous than amorphous silicon also in view of the reduction of pixel defects. In the graphoepitaxial growing described previously, not only single crystal silicon but also polycrystal silicon is formed simultaneously to sometimes include also a so-called CGS (Continuous Grain Silicon) structure, which can be also used for the formation of active devices and passive devices.

Figure 50A:
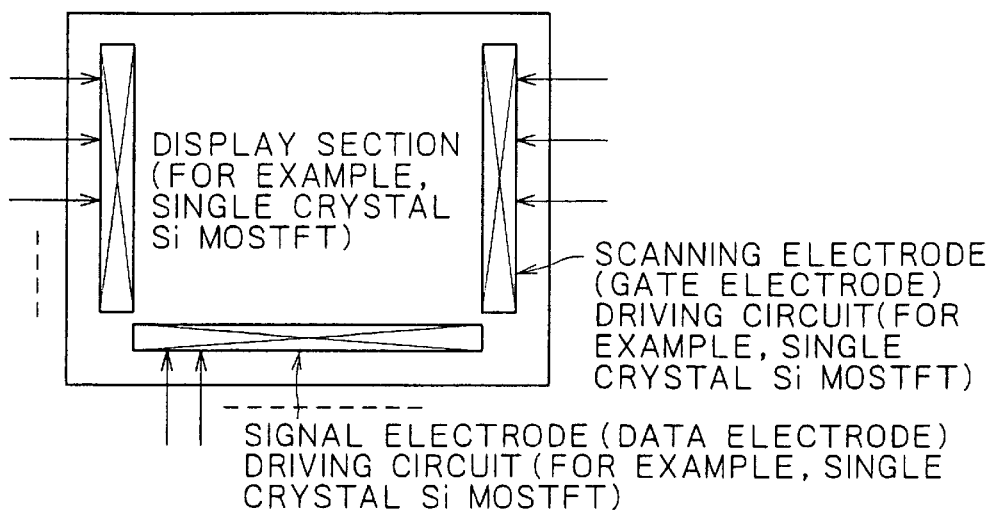
FIGS. 50A to 50C are schematic layout views for an LCD in accordance with a ninth embodiment of the present invention.
Figure 50B:
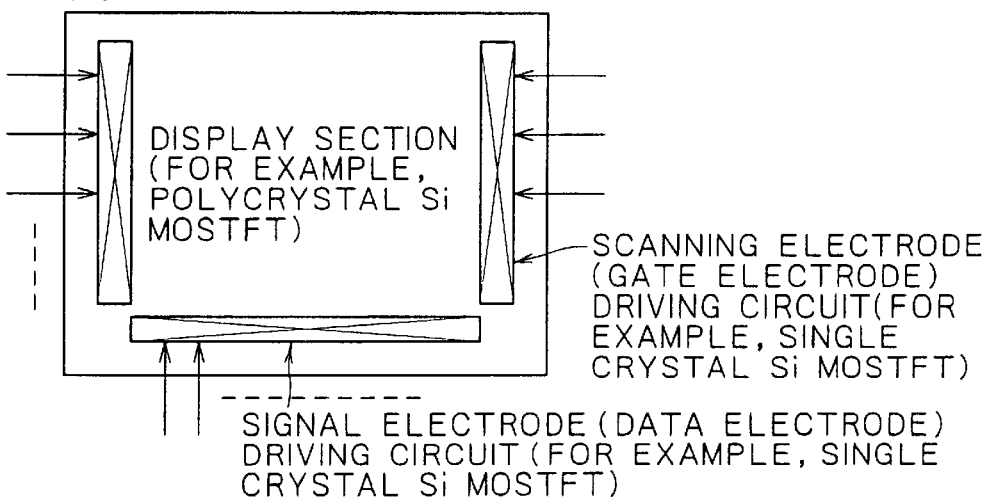
Figure 50C:
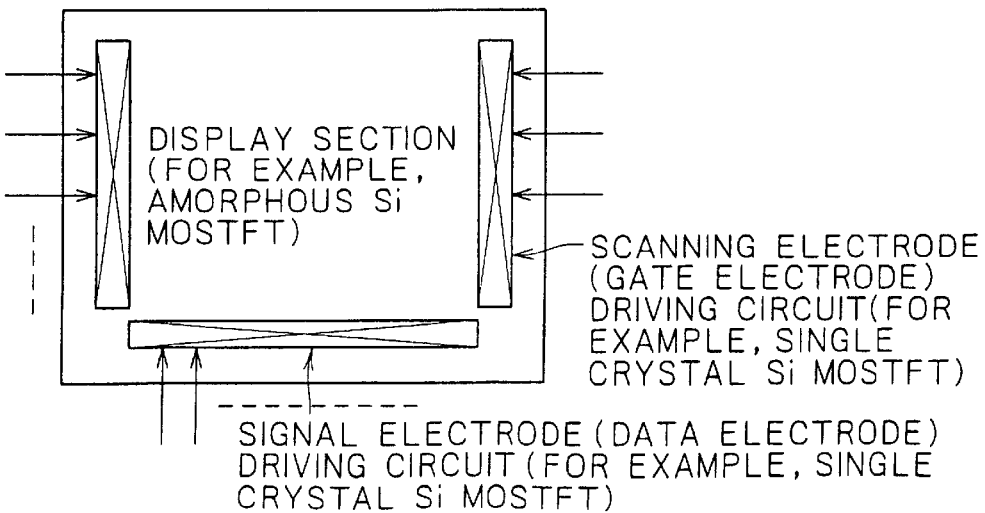

FIGS. 50A to 50C show examples of various combinations of MOSTFT between each of the sections and FIG. 51 shows concrete examples thereof. Since the use of single crystal silicon improves the current driving performance, it is possible to decrease the size of the device, enlarge the screen area and improve the aperture ratio in the display section.

It will be apparent that in the peripheral driving circuit section, electronic circuits having integrated elements such as diodes, capacitances, resistances and inductances can be disposed integrally, in addition to MOSTFT, to the insulation substrate (glass substrate or the like).

Tenth Embodiment

Figure 52:
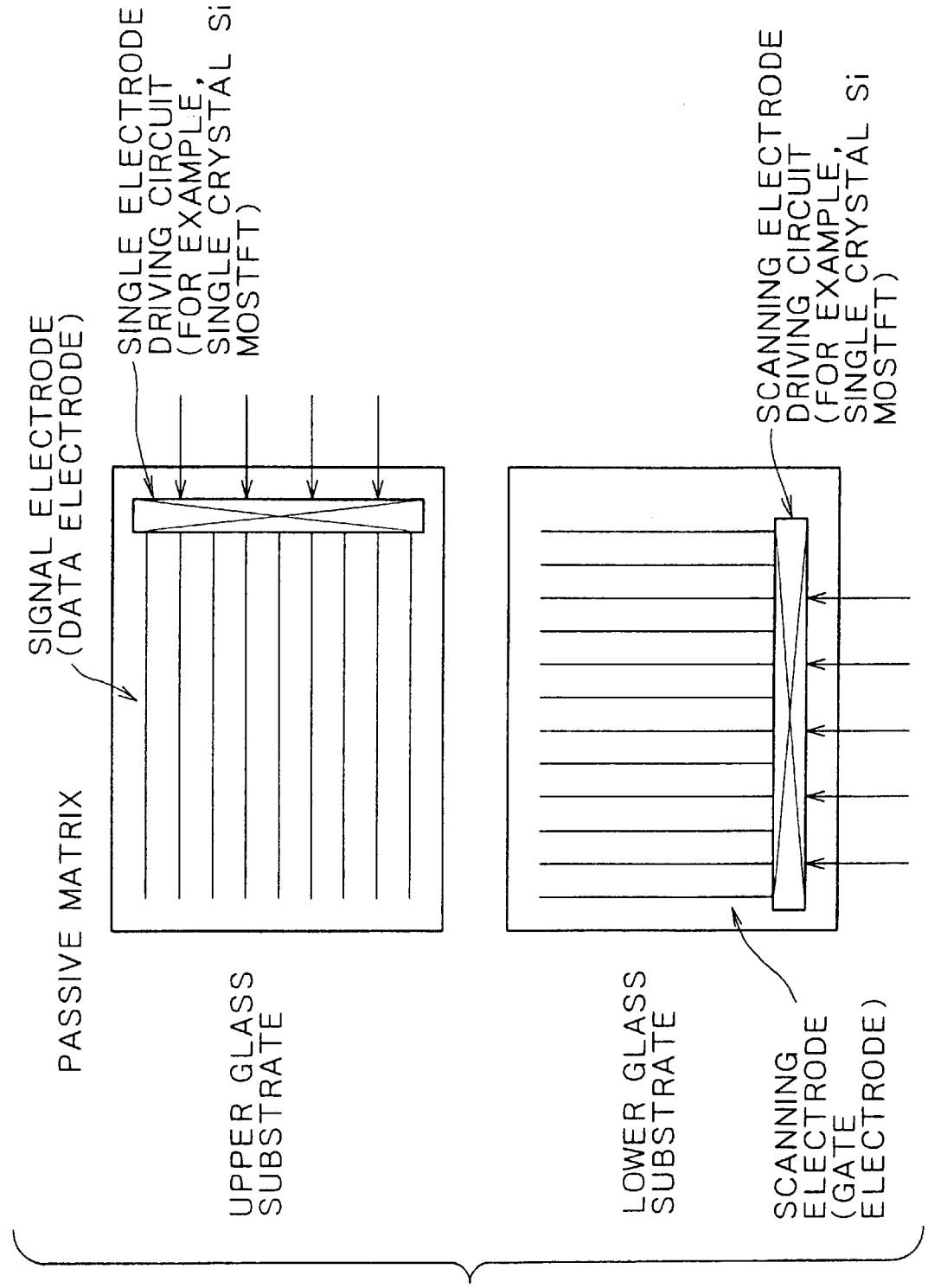
FIG. 52 is a schematic layout view for a device in accordance with a tenth embodiment of the present invention.

FIG. 52 shows a tenth embodiment according to the present invention.

This embodiment is an example of applying the present invention to a passive matrix driving while each of the embodiments described above shows an example of active matrix driving.

While each of the embodiments described above is an example of active matrix driving, the present invention is applied to passive matrix driving in this embodiment.

That is, the switching devices such as MOSTFT described above are not disposed in the display section but the incident light or the reflection light in the display section is controlled only by the potential difference caused by a voltage applied between a pair of electrodes formed in opposing substrates. Such light control devices can include reflection type or transmission type LCD, as well as organic or inorganic EL (Electro Luminescence Display Device), FED (Field Emission type Display Device), LEPD (Light Emitting Polymer Display Device) and LED (Light Emission Diode Display Device).

Eleventh Embodiment

FIG. 53 shows an eleventh embodiment according to the present invention.

In this embodiment, the present invention is applied to electro-optical apparatus other than LCD, namely, organic or inorganic EL (Electro Luminescence Display Device), FED (Field Emission type Display Device), LEPD (Light Emission Polymer Display Device) and LED (Light Emission Diode Display Device).

Figure 53A:
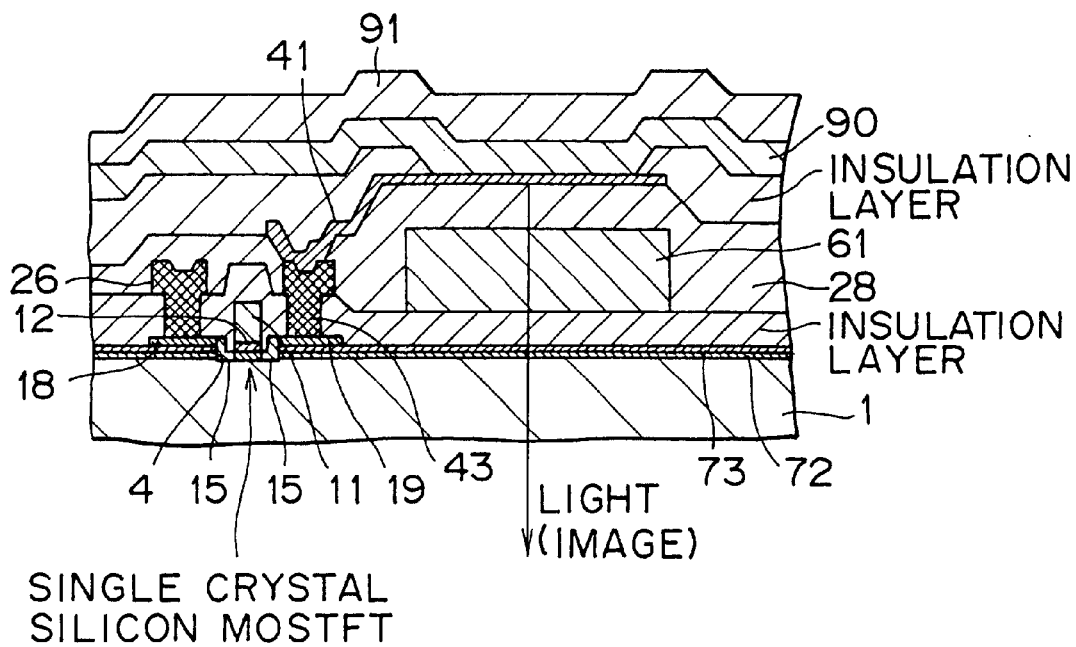
FIGS. 53A and 53B are cross sectional views for main portions of EL and FED in accordance with an eleventh embodiment of the present invention.

That is, FIG. 53A shows an active matrix driving EL device in which an organic EL layer using, for example, an amorphous organic compound (or inorganic EL layer using ZnS:Mn) 90 is disposed on a substrate 1, the transparent electrode (ITO) 41 described above is formed therebelow, a cathode 91 formed thereabove, and light of predetermined color can be obtained by applying voltage through a filter 61 between both of the electrodes.

For applying a data voltage to the transparent electrode 41 by active matrix driving, single crystal silicon MOSTFT (that is, nMOSLDD-TFT) using the single crystal silicon layer grown graphoepitaxially using a step 4 on the substrate 1 as a seed by the catalyst CVD process is prepared on the substrate 1. Similar TFT are disposed also in the peripheral driving circuit. Since the EL device is driven by MOSLDD-TFT using the single crystal silicon layer, it has high switching speed and causes less leak current. Further, if the EL layer 90 emits a light of a predetermined color, the filter 61 can be saved.

In the EL device, since the driving voltage is high, it is advantageous to dispose high voltage withstanding driver devices (high voltage withstanding cMOSTFT and bipolar device) other than the MOSTFT described above in the peripheral driving circuit section.

Figure 53B:
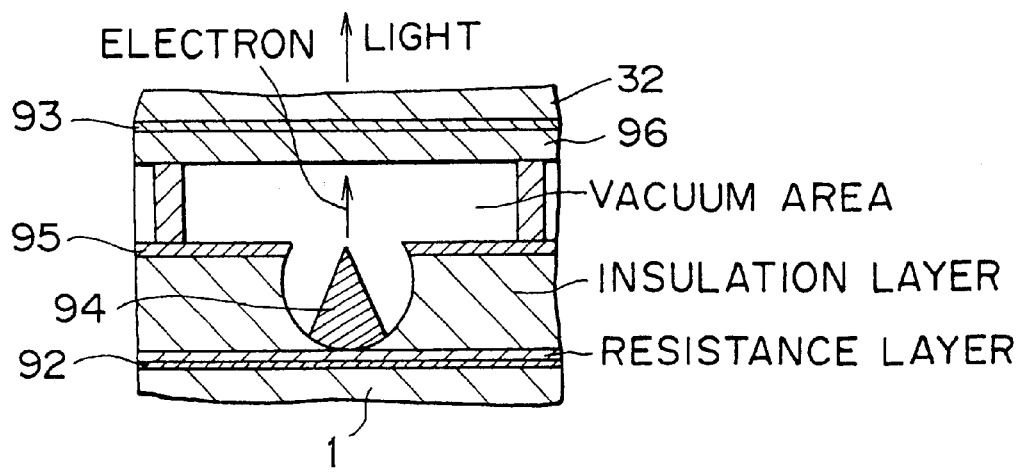

FIG. 53B shows a passive matrix driving FED, in which electrons emitted from a cold cathode 94 by a voltage applied between both of electrodes 92 and 93 in a vacuum region between opposing glass substrates 1 and 32 are entered to an opposing fluorescent layer 96 by the selection of a gate line 95 to obtain emission of light of a predetermined color.

An emitter line 92 is led to the peripheral driving circuit and driven by a data voltage. In the peripheral driving circuit, MOSTFT using the single crystal silicon layer according to the present invention is disposed and contributes to the high speed driving of the emitter line 92. The FED can also be active matrix driven by connecting the MOSTFT to each pixel.

In the device shown in FIG. 53A, if a known light emission polymer is used instead of the EL layer 90, it can be constituted as a passive matrix or active matrix driven light emission polymer display device (LEPD). In addition, in the device shown in FIG. 52B, a device similar to FED using a diamond thin film on the cathode can also be constituted. Further, in a light emission diode, a light emission section comprising, for example, gallium series (gallium aluminum arsenide) can be driven by MOSTFT using epitaxially grown single crystal silicon according to the present invention.

The embodiments of the present invention described previously can be modified variously on the basis of the technical scope of the present invention.

For example, by sputtering diborane ($B_2H_6$), phosphine ($PH_3$), arsine ($AsH_3$) or stibine ($SbH_3$) upon forming the single crystal silicon film 7 by the catalyst CVD process as described above, and doping boron, phosphorus, antimony or arsenic in an appropriate amount to the single crystal silicon layer by the decomposition of the supplied gas, the conduction type for P or N or the carrier concentration thereof in the silicon epitaxially grown layer 7 under growing can be controlled optionally. Further, the single crystal silicon film 7 can be formed also by a high density plasma CVD process, for example, ECR (Electron Cyclotron Resonance) plasma CVD.

Further, for preventing diffusion of ions from the glass substrate, an SiN film (for example, 50~200 nm thickness) and, if required, an $SiO_2$ film (for example, 100 nm thickness) may be disposed to the surface of the substrate, or the step 4 as described previously may be formed to the film. The step can also be formed by an ion milling method other than RIE.

Further, the present invention is suitable to TFT for the peripheral driving circuit but, in addition, an active region for the device such as diode, or a passive region for resistance, capacitance or inductance can be formed with the single crystal silicon layer according to the present invention.

According to the present invention, since single crystal silicon is grown graphoepitaxially using the step formed on the substrate as a seed by the catalyst CVD process or high density plasma CVD process and the obtained single crystal silicon is used, for example, for the dual gate type MOSTFT in the peripheral driving circuit section of an electro-optical apparatus such as a display section-peripheral driving circuit integration type LCD, the following remarkable functions and effects (A)–(G) can be obtained.

(A) Since the single crystal silicon layer 7 of high electron mobility of 540 $cm^2$/v.sec or higher can be obtained by forming a predetermined shape/size of the step 4 on the substrate 1, and conducting cold graphoepitaxial growing, it is possible to manufacture an LCD incorporated with a high performance driver.

(B) Particularly, the single crystal silicon top gate type MOSTFT using the single crystal silicon layer can constitute an integrated structure including a display section comprising nMOS, pMOS or cMOSTFT having an LDD structure of high switching characteristics and a peripheral driving circuit comprising CMOS, nMOS or pMOSTFT, or a combination thereof of high driving performance, to attain a display panel of high image quality, high fineness, narrow frame edge, high efficiency and large area screen.

(C) Particularly, since the dual gate type MOSTFT is used in the peripheral driving circuit, cMOS, nMOS or pMOSTFT having a driving performance 1.5 to 2 times as high as that of the single gate type TFT can be constituted to form a higher performance and larger driving performance TFT compared with the single gate type TFT, and it is suitable particularly to a case of requiring TFT of a large driving performance to a portion of the peripheral driving circuit. For example, it is considered that not only one of the pair of peripheral vertical driving circuits can be saved but also it is advantageous when applied to organic EL or FET as the electro-optical apparatus other than LCD. Further, the dual gate structure can be changed easily to the top gate type or the bottom gate type by the selection of the upper or lower gate portion and, in addition, one of upper and lower gate portions can be used advantageously even if the other of them becomes not operable.

(D) Since the step is used as a seed for graphoepitaxial growing, and the single crystal silicon layer can be formed on the step by a cold film forming technique such as a catalyst CVD process (chemical vapor deposition using catalyst: at a substrate temperature of 200 to 800° C., particularly, 300 to 400° C.), the single crystal silicon film 7 can be formed uniformly on the substrate at a low temperature. Accordingly, there can be used those substrates such as glass substrate and heat resistant organic substrates having low distortion point, available at reduced cost and having good physical properties, and the size of the substrate can be enlarged.

(E) Since annealing at medium temperature for a long time as in a case of a solid phase growing process or excimer laser annealing is no more necessary, the productivity is high, and expensive production facilities are not required, making it possible to reduce the cost.

(F) In the graphoepitaxial growing, since it is possible to easily obtain a single crystal silicon layer having a wide range of conduction types such as N-type or P-type and having high mobility by controlling the condition such as gas compositional ratio in the catalyst CVD, heating temperature for the substrate and cooling rate, $V_{th}$ can be controlled easily and high speed operation is possible by lowering the resistance.

(G) Further, when a group III or group V impurity element (for example, boron, phosphorus, antimony, arsenic, bismuth or aluminum) is doped in an appropriate amount separately from a doping gas upon preparing the single crystal silicon film by the catalyst CVD or the like, it is possible to optionally control the impurity species and/or concentration thereof, namely, the P-type/N-type conduction type and/or carrier concentration of the single crystal silicon layer.

What is claimed is:

1. An electro-optical apparatus comprising:
on a first substrate, a display section in which pixel electrodes are disposed and a peripheral driving circuit section disposed at the periphery of the display section, in which a predetermined optical material is interposed between the first substrate and a second substrate,
said display section comprises a gate portion further comprising a gate electrode and a gate insulation film formed on one surface of the first substrate,
a step is formed on one surface of the first substrate,
a single crystal silicon layer is graphoepitaxially formed on the first substrate including the step and the gate portion,
said peripheral driving circuit section comprises a dual gate type first thin film transistor having the single crystal silicon layer as a channel region, a source region and a drain region, and having the dual gate portions above and below the channel region.

2. An electro-optical apparatus as claimed in claim 1, wherein the step is formed as a concave portion such that a lateral side in cross section is in orthogonal to the bottom surface or is inclined toward the lower end, and the step constitutes a seed upon said graphoepitaxial growing of the single crystal silicon layer.

3. An electro-optical apparatus as claimed in claim 1, wherein the first thin film transistor is disposed at the inside and/or the outside of the concave portion attributable to the step formed on the first substrate and/or a film formed thereabove.

4. An electro-optical apparatus as claimed in claim 1, wherein group III or group V impurity species and/or the concentration thereof in the single crystal silicon layer is controlled.

5. An electro-optical apparatus as claimed in claim 1, wherein the step is formed along at least one side of a device region of the first thin film transistor formed with the channel region, the source region and the drain region.

6. An electro-optical apparatus as claimed in claim 1, wherein the gate electrode below the single crystal silicon layer is trapezoidal at a lateral end thereof.

7. An electro-optical apparatus as claimed in claim 1, wherein a diffusion barrier layer is disposed between the first substrate and the single crystal silicon layer.

8. An electro-optical apparatus as claimed in claim 1, wherein the peripheral driving circuit section has, in addition to the first thin film transistors, top gate type, bottom gate type or dual gate type thin film transistors each having a polycrystal or amorphous silicon layer as a channel region and having a gate portion above and/or below the channel region, or diode, resistance, capacitance and inductance devices using the single crystal silicon layer, the polycrystal silicon layer or the amorphous silicon layer.

9. An electro-optical apparatus as claimed in claim 1, wherein a switching device for switching the pixel electrode is disposed on the first substrate in the display section.

10. An electro-optical apparatus as claimed in claim 9, wherein the first thin film transistor comprises at least the dual gate type selected from the top gate type, the bottom gate type or the dual gate type having the gate portion above and/or below the channel region, and the switching device is the top gate type, the bottom gate type or the dual gate type second thin film transistor.

11. An electro-optical apparatus as claimed in claim 10, wherein the gate electrode disposed below the channel region is formed of a heat resistant material.

12. An electro-optical apparatus as claimed in claim 10, wherein the thin film transistor in the peripheral driving circuit section and the display section constitute an n-channel type, a p-channel type or a complementary type insulated gate field effect transistor.

13. An electro-optical apparatus as claimed in claim 12, wherein the thin film transistor in the peripheral driving circuit section comprises a set of the complementary type and the n-channel type, a set of the complementary type and the p-channel type or the set of the complementary type, the n-channel type and the p-channel type.

14. An electro-optical apparatus as claimed in claim 10, wherein at least a portion of the thin film transistors in the peripheral driving circuit section and/or the display section has an LDD (lightly Doped Drain) structure and the LDD structure is a single type having the LDD portion between the gate and the source or the drain, or a double type having the LDD sections between the gate and the source and between the gate and the drain, respectively.

15. An electro-optical apparatus comprising:
on a first substrate, a display section in which pixel electrodes are disposed and a peripheral driving circuit section disposed at the periphery of the display section, in which a predetermined optical material is interposed between the first substrate and a second substrate,
said display section comprises a gate portion further comprising a gate electrode and a gate insulation film formed on one surface of the first substrate,
a step is formed on one surface of the substrate,
a single crystal, polycrystal or amorphous silicon layer silicon layer is formed on the first substrate including the step and the gate portion,
said peripheral driving circuit section comprises a dual gate type first thin film transistor having the single crystal silicon layer as a channel region, a source region and a drain region, and having the dual gate portions above and below the channel region, wherein a switching device for switching the pixel electrode is disposed on the first substrate in the display section and wherein the first thin film transistor comprises at least the dual gate type selected from the top gate type, the bottom gate type or the dual gate type having the gate portion above and/or below the channel region, and the switching device is the top gate type, the bottom gate type or the dual gate type second thin film transistor, wherein the second thin film transistor has the single crystal, polycrystal or amorphous silicon layer as the channel region, the source region and the drain region, and has the gate portion above and/or below the channel region.

16. An electro-optical apparatus as claimed in claim 15, wherein the step is formed as a concave portion such that a lateral side in cross section is in orthogonal to the bottom surface or is inclined toward the lower end, and the step constitute a seed upon graphoepitaxial growing of the single crystal silicon layer.

17. An electro-optical apparatus as claimed in claim 15, wherein the source or the drain electrode of the first and/or the second thin film transistor is formed on a region including the step.

18. An electro-optical apparatus as claimed in claim 15, wherein the second thin film transistor is disposed at the inside and/or the outside of the concave portion attributable to the step formed to the first substrate and/or a film formed thereabove.

19. An electro-optical apparatus as claimed in claim 15, wherein group III or group V impurity species and/or the concentration thereof in the single crystal silicon layer is controlled.

20. An electro-optical apparatus as claimed in claim 15, wherein the step is formed along at least one side of a device region of the second thin film transistor formed with the channel region, the source region and the drain region.

21. An electro-optical apparatus as claimed in claim 15, wherein the gate electrode below the single crystal, polycrystal or amorphous silicon layer is trapezoidal at a lateral end thereof.

22. An electro-optical apparatus as claimed in claim 15, wherein a diffusion barrier layer is disposed between the first substrate and the single crystal, polycrystal or amorphous silicon layer.

23. An electro-optical apparatus as claimed in claim 10, wherein thin film transistor in the peripheral driving circuit section and/or the display section is constituted as a single gate or a multi-gate, and has two or more branched gate electrodes in the channel region at an identical potential, or divided different potential or identical potential in a case of the multi-gate.

24. An electro-optical apparatus as claimed in claim 10, wherein when the n- or p-channel type thin film transistor in the peripheral driving circuit section and/or the display section is the dual gate type, the upper or the lower gate electrode is electrically open or applied with an optional negative voltage (in a case of the n-channel type) or a positive voltage (in a case of the p-channel type), and the transistor is operated as the bottom gate type or the top gate type thin film transistor.

25. An electro-optical apparatus as claimed in claim 10, wherein the thin film transistor in the peripheral driving circuit section is the first thin film transistor of the n-channel type, the p-channel type or the complementary type, the thin film transistor in the display section is the n-channel type, the p-channel type or the complementary type when using the single crystal silicon layer as the channel region, the n-channel type, the p-channel type or the complementary type when the polycrystal silicon layer is used as the channel layer, and the n-channel type, the p-channel type or the complementary type when the amorphous silicon layer is used as the channel region.

26. An electro-optical apparatus as claimed in claim 1, wherein the first substrate is a glass substrate or a heat resistant organic substrate.

27. An electro-optical apparatus as claimed in claim 1, wherein the first substrate is optically transparent or not transparent.

28. An electro-optical apparatus as claimed in claim 1, wherein the pixel electrode is disposed for use in a reflection type or transmission type display section.

29. An electro-optical apparatus as claimed in claim 1, wherein the display section has a laminate structure of the pixel electrode and a color filter layer.

30. An electro-optical apparatus as claimed in claim 1, wherein when the pixel electrode is a reflection electrode, a concave/convex portion is formed to a resin film on which the pixel electrode is disposed, or when the pixel electrode is a transparent electrode, the surface is flattened by a transparent flattening film, and the pixel electrode is disposed on the flattened surface.

31. An electro-optical apparatus as claimed in claim 9, wherein the display section is adapted to conduct light emission or light control being driven by the switching device.

32. An electro-optical apparatus as claimed in claim 9, wherein a plurality of pixel electrodes are arranged in a matrix on the display section and the switching device is connected to each of the pixel electrodes.

33. An electro-optical apparatus as claimed in claim 1, which is constituted, for example, as a liquid crystal display device, an electro-luminescence display device, an electric field emission type display device, a light emission polymer display device or a light emission diode display device.

34. A display driver for use in an electro-optical apparatus comprising:
   on a substrate, a display section in which pixel electrodes are disposed and a peripheral driving circuit section disposed to the periphery of the display section, wherein
   a gate portion comprising a gate electrode and a gate insulation film is formed on one surface of the first substrate,
   a step is formed on one surface of the first substrate,
   a single crystal silicon layer is graphoepitaxially formed on the first substrate including the step and the gate portion,
   said peripheral driving circuit section comprises a dual gate type first thin film transistor having the single crystal silicon layer as a channel region, a source region and a drain region, and having the dual gate portions above and below the channel region.

35. A driving substrate for use in an electro-optical apparatus as claimed in claim 34, wherein the step is formed as a concave portion such that a lateral side in cross section is in orthogonal to the bottom surface or is inclined toward the lower end, and the step constitutes a seed upon graphoepitaxial growing of the single crystal silicon layer.

36. A driving substrate for use in an electro-optical apparatus as claimed in claim 34, wherein the first thin film transistor is disposed at the inside and/or the outside of the concave portion attributable to the step formed on the first substrate and/or a film formed thereabove.

37. A driving substrate for use in an electro-optical apparatus as claimed in claim 34, wherein group III or group V impurity species and/or the concentration thereof in the single crystal silicon layer is controlled.

38. A driving substrate for use in an electro-optical apparatus as claimed in claim 34, wherein the step is formed along at least one side of a device region of the first thin film transistor formed with the channel region, the source region and the drain region.

39. A driving substrate for use in an electro-optical apparatus as claimed in claim 34, wherein the gate electrode below the single crystal silicon layer is trapezoidal at a lateral end thereof.

40. A driving substrate for use in an electro-optical apparatus as claimed in claim 34, wherein a diffusion barrier layer is disposed between the substrate and the single crystal silicon layer.

41. A driving substrate for use in an electro-optical apparatus as claimed in claim 34, wherein the peripheral driving circuit section has, in addition to the first thin film transistors, top gate type, bottom gate type or dual gate type thin film transistors each having a polycrystal or amorphous silicon layer as a channel region and having a gate portion above and/or below the channel region, or diode, resistance, capacitance and inductance devices using the single crystal silicon layer, the polycrystal silicon layer or the amorphous silicon layer.

42. A driving substrate for use in an electro-optical apparatus as claimed in claim 34, wherein a switching device for switching the pixel electrode is disposed on the first substrate in the display section.

43. A driving substrate for use in an electro-optical apparatus as claimed in claim 42, wherein the first thin film transistor comprises at least the dual gate type selected from the top gate type, the bottom gate type or the dual gate type having the gate portion above and/or below the channel region, and the switching device is the top gate type, the bottom gate type or the dual gate type second thin film transistor.

44. A driving substrate for use in an electro-optical apparatus as claimed in claim 43, wherein the gate electrode disposed below the channel region is formed of a heat resistant material.

45. A driving substrate for use in an electro-optical apparatus as claimed in claim 43, wherein the thin film transistor in the peripheral driving circuit section and the display section constitutes an n-channel type, a p-channel type or a complementary type insulated gate field effect transistor.

46. A driving substrate for use in an electro-optical apparatus as claimed in claim 45, wherein the thin film transistor in the peripheral driving circuit section comprises a set of the complementary type and the n-channel type, a set of the complementary type and the p-channel type or the set of the complementary type, the n-channel type and the p-channel type.

47. A driving substrate for use in an electro-optical apparatus as claimed in claim 43, wherein at least a portion of the thin film transistors in the peripheral driving circuit section and/or the display section has an LDD (lightly Doped Drain) structure and the LDD structure is a single type having the LDD portion between the gate and the source or the drain, or a double type having the LDD sections between the gate and the source and between the gate and the drain, respectively.

48. A driving substrate for use in an electro-optical apparatus having, on a substrate, a display section in which pixel electrodes are disposed and a peripheral driving circuit section disposed to the periphery of the display section, wherein a gate portion comprising a gate electrode and a gate insulation film is formed on one surface of the substrate, a step is formed on one surface of the substrate, a single crystal, polycrystal or amorphous silicon layer is formed on the substrate including the step and the gate portion, and a dual gate type first thin film transistor having the single crystal silicon layer as a channel region, a source region and a drain region and having the gate portion above and below the channel region respectively constitutes at least a portion of the peripheral driving circuit section, wherein a switching device for switching the pixel electrode is disposed on the first substrate in the display section, and wherein the first thin film transistor comprises at least the dual gate type selected from the top gate type, the bottom gate type or the dual gate type having the gate portion above and/or below the channel region, and the switching device is the top gate type, the bottom gate type or the dual gate type second thin film transistor, and wherein the second thin film transistor has the single crystal, polycrystal or amorphous silicon layer as the channel region, the source region and the drain region, and has the gate portion above and/or below the channel region.

49. A driving substrate for use in an electro-optical apparatus as claimed in claim 48, wherein the step is formed as a concave portion such that a lateral side in cross section is in orthogonal to the bottom surface or is inclined toward the lower end, and the step constitutes a seed upon graphoepitaxial growing of the single crystal silicon layer.

50. A driving substrate for use in an electro-optical apparatus as claimed in claim 48, wherein the source or the drain electrode of the first and/or the second thin film transistor is formed on a region including the step.

51. A driving substrate for use in an electro-optical apparatus as claimed in claim 48, wherein the second thin film transistor is disposed at the inside and/or the outside of the concave portion attributable to the step formed to the substrate and/or a film formed thereabove.

52. A driving substrate for use in an electro-optical apparatus as claimed in claim 48, wherein group III or group V impurity species and/or the concentration thereof in the single crystal silicon layer is controlled.

53. A driving substrate for use in an electro-optical apparatus as claimed in claim 48, wherein the step is formed along at least one side of a device region of the second thin film transistor formed with the channel region, the source region and the drain region.

54. A driving substrate for use in an electro-optical apparatus as claimed in claim 48, wherein the gate electrode below the single crystal, polycrystal or amorphous silicon layer is trapezoidal at a lateral end thereof.

55. A driving substrate for use in an electro-optical apparatus as claimed in claim 48, wherein a diffusion barrier layer is disposed between the substrate and the single crystal, polycrystal or amorphous silicon layer.

56. A driving substrate for use in an electro-optical apparatus as claimed in claim 43, wherein thin film transistor in the peripheral driving circuit section and/or the display section is constituted as a single gate or a multi-gate and, in a case of the multi-gate, has two or more branched gate electrodes at an identical potential, or divided gate electrode at different potentials or an identical potential in the channel region.

57. A driving substrate for use in an electro-optical apparatus as claimed in claim 43, wherein when the n- or p-channel type thin film transistor in the peripheral driving circuit section and/or the display section is the dual gate type, the upper or the lower gate electrode is electrically opened or applied with an optional negative voltage (in a case of the n-channel type) or a positive voltage (in a case of the p-channel type), and the transistor is operated as the bottom gate type or the top gate type thin film transistor.

58. A driving substrate for use in an electro-optical apparatus having, on a substrate, a display section in which pixel electrodes are disposed and a peripheral driving circuit section disposed to the periphery of the display section, wherein a gate portion comprising a gate electrode and a gate insulation film is formed on one surface of the substrate, a step is formed on one surface of the substrate, a single crystal, polycrystal or amorphous silicon layer is formed on the substrate including the step and the gate portion, and a dual gate type first thin film transistor having the single crystal silicon layer as a channel region, a source region and a drain region and having the gate portion above and below the channel region respectively constitutes at least a portion of the peripheral driving circuit section, wherein a switching device for switching the pixel electrode is disposed on the first substrate in the display section, and wherein the first thin film transistor comprises at least the dual gate type selected from the top gate type, the bottom gate type or the dual gate type having the gate portion above and/or below the channel region, and the switching device is the top gate type, the bottom gate type or the dual gate type second thin film transistor, and wherein the thin film transistor in the peripheral driving circuit section is the first thin film transistor, of the n-channel type, p-channel type or the complementary type, the thin film transistor in the display section is the n-channel type, the p-channel type or the complementary type when using the single crystal silicon layer as the channel region, the n-channel type, the p-channel type or the complementary type when the polycrystal silicon layer is used as the channel layer, and the n-channel type, the p-channel type or the complementary type when the amorphous silicon layer is used as the channel region.

59. A driving substrate for use in an electro-optical apparatus as claimed in claim 34, wherein the substrate is a glass substrate or a heat resistant organic substrate.

60. A driving substrate for use in an electro-optical apparatus as claimed in claim 34, wherein the substrate is optically transparent or not transparent.

61. A driving substrate for use in an electro-optical apparatus as claimed in claim 34, wherein the pixel electrode is disposed for use in a reflection type or transmission type display section.

62. A driving substrate for use in an electro-optical apparatus as claimed in claim 34, wherein the display section has a laminate structure of the pixel electrode and a color filter layer.

63. A driving substrate for use in an electro-optical apparatus as claimed in claim 43, wherein when the pixel electrode is a reflection electrode, a concave/convex portion is formed to a resin film on which the pixel electrode is disposed, or when the pixel electrode is a transparent electrode, the surface is flattened by a transparent flattening film, and the pixel electrode is disposed on the flattened surface.

64. A driving substrate for use in an electro-optical apparatus as claimed in claim 42, wherein the display section is adapted to conduct light emission or light control being driven by the switching device.

65. A driving substrate for use in an electro-optical apparatus as claimed in claim 42, wherein a plurality of pixel electrodes are arranged in a matrix on the display section and the switching device is connected to each of the pixel electrodes.

66. A driving substrate for use in an electro-optical apparatus as claimed in claim 34, which is constituted, for example, as a liquid crystal display device, an electro-luminescence display device, an electric field emission type display device, a light emission polymer display device or a light emission diode display device.

* * * * *